(12) United States Patent
Hyun et al.

(10) Patent No.: US 9,595,318 B2
(45) Date of Patent: *Mar. 14, 2017

(54) REDUCED LEVEL CELL MODE FOR NON-VOLATILE MEMORY

(71) Applicant: Longitude Enterprise Flash S.a.r.l., Luxembourg (LU)

(72) Inventors: Jea Hyun, Los Altos, CA (US); Ryan Haynes, Sandy, UT (US); Charla Mosier, Midvale, UT (US); Rick Lucky, Superior, CO (US); Robert Wood, Niwot, CO (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/984,491

(22) Filed: Dec. 30, 2015

(65) Prior Publication Data

US 2016/0118111 A1     Apr. 28, 2016

Related U.S. Application Data

(63) Continuation of application No. 14/016,203, filed on Sep. 2, 2013, now Pat. No. 9,245,653, which is a
(Continued)

(51) Int. Cl.
*G11C 29/00*     (2006.01)
*G11C 11/56*     (2006.01)
(Continued)

(52) U.S. Cl.
CPC ...... *G11C 11/5635* (2013.01); *G06F 11/1072* (2013.01); *G11C 11/5621* (2013.01);
(Continued)

(58) Field of Classification Search
CPC ............ G11C 11/5621; G11C 11/5628; G11C 11/5642; G11C 11/5635; G06F 11/1072;
(Continued)

(56) References Cited

U.S. PATENT DOCUMENTS 7,237,074 B2   6/2007   Guterman et al.
7,692,970 B2   4/2010   Park et al.
(Continued)

OTHER PUBLICATIONS

Korean Patent Application No. 10-2012-0080003 Preliminary Rejection dated Nov. 28, 2016.

*Primary Examiner* — David Ton
(74) *Attorney, Agent, or Firm* — Kunzler Law Group, PC

(57) ABSTRACT

Apparatuses, systems, methods, and computer program products are disclosed for reduced level cell solid-state storage. A method includes determining that an erase block of a non-volatile storage device is to operate in a reduced level cell (RLC) mode. The non-volatile storage device may be configured to store at least three bits of data per storage cell. A method includes instructing the non-volatile storage device to program first and second pages of the erase block with data. A method includes instructing the non-volatile storage device to program a third page of the erase block with a predefined data pattern. Programming of a predefined data pattern may be configured to adjust which abodes of the erase block are available to represent stored user data values.

20 Claims, 16 Drawing Sheets

Related U.S. Application Data continuation-in-part of application No. 13/609,527, filed on Sep. 11, 2012, now Pat. No. 8,527,841, which is a continuation-in-part of application No. 13/175,637, filed on Jul. 1, 2011, now Pat. No. 8,266,503, which is a continuation-in-part of application No. 12/724,401, filed on Mar. 15, 2010, now Pat. No. 8,261,158.

(51) Int. Cl.
*G11C 29/52* (2006.01)
*G11C 16/16* (2006.01)
*G11C 16/04* (2006.01)
*G11C 16/10* (2006.01)
*G11C 16/26* (2006.01)
*G06F 11/10* (2006.01)

(52) U.S. Cl.
CPC ...... *G11C 11/5628* (2013.01); *G11C 11/5642* (2013.01); *G11C 16/0483* (2013.01); *G11C 16/10* (2013.01); *G11C 16/16* (2013.01); *G11C 16/26* (2013.01); *G11C 29/52* (2013.01); *G06F 2212/7207* (2013.01); *G06F 2212/7208* (2013.01); *G06F 2212/7209* (2013.01); *G11C 29/00* (2013.01); *G11C 2211/5641* (2013.01)

(58) Field of Classification Search
CPC ..... G06F 2212/7207; G06F 2212/7208; G06F 2212/7209
USPC ........................................................ 714/773
See application file for complete search history.

(56) References Cited

U.S. PATENT DOCUMENTS

| | | | |
|---|---|---|---|
| 2006/0039196 A1 | 2/2006 | Gorobets et al. | |
| 2007/0189073 A1* | 8/2007 | Aritome ............. | G11C 11/5628 365/185.18 |
| 2007/0195603 A1 | 8/2007 | Aritome et al. | |
| 2008/0316816 A1* | 12/2008 | Lin ...................... | G11C 11/5628 365/185.03 |
| 2009/0282186 A1 | 11/2009 | Mokhlesi et al. | |
| 2010/0161888 A1* | 6/2010 | Eggleston ............. | G11C 16/10 711/103 |
| 2011/0044101 A1 | 2/2011 | Chou et al. | |
| 2012/0063231 A1* | 3/2012 | Wood ................... | G11C 16/10 365/185.18 |
| 2013/0031430 A1* | 1/2013 | Sharon ................ | G11C 11/5642 714/719 |
| 2013/0031431 A1* | 1/2013 | Sharon ................ | G06F 11/1072 714/719 |

\* cited by examiner

Driver
702

Mapping Logic Module
704

Hardware Controller
706

Non-Volatile Memory Media
122

FIG. 7

REDUCED LEVEL CELL MODE FOR NON-VOLATILE MEMORY

CROSS-REFERENCES TO RELATED APPLICATIONS

This is a continuation application of and claims priority to U.S. patent application Ser. No. 14/016,203 entitled "REDUCED LEVEL CELL MODE FOR NON-VOLATILE MEMORY" and filed on Sep. 2, 2013 for Robert Wood, et al., now U.S. Pat. No. 9,245,653 which issued on Jan. 26, 2016, which claims priority to U.S. patent application Ser. No. 13/609,527 entitled "APPARATUS, SYSTEM, AND METHOD FOR USING MULTI-LEVEL CELL, SOLID-STATE STORAGE AS REDUCED-LEVEL CELL SOLID-STATE STORAGE" and filed on Sep. 11, 2012 for Robert Wood, et al., now U.S. Pat. No. 8,527,841 which issued on Sep. 3, 2013, which claims priority to U.S. patent application Ser. No. 13/175,637 entitled "APPARATUS, SYSTEM, AND METHOD FOR USING MULTI-LEVEL CELL STORAGE IN A SINGLE-LEVEL CELL MODE" and filed on Jul. 1, 2011 for Robert Wood, et al., now U.S. Pat. No. 8,266,503 which issued on Sep. 11, 2012, which claims priority to U.S. patent application Ser. No. 12/724,401 entitled "APPARATUS, SYSTEM, AND METHOD FOR USING MULTI-LEVEL CELL SOLID-STATE STORAGE AS SINGLE-LEVEL CELL SOLID-STATE STORAGE" and filed on Mar. 15, 2010 for Jonathan Thatcher, et al., now U.S. Pat. No. 8,261,158 which issued on Sep. 4, 2012, each of which are incorporated herein by reference in their entirety.

TECHNICAL FIELD

The present disclosure, in various embodiments, relates to endurance of non-volatile memory cells and more particularly relates to operating non-volatile memory in a reduced level cell (RLC) mode to increase endurance.

BACKGROUND

Certain flash memory and other solid-state storage devices implement multi-level cell (MLC) memory elements, triple level cell (TLC) memory elements, or the like to store multiple bits of data in the same memory cell. In general, MLC and TLC memory elements are programmable to multiple states, which are each characterized by separate voltage thresholds. As an example, a two-bit MLC memory element can be programmed to one of four different states or a three-bit TLC memory element can be programmed to one of eight different states, with each state corresponding to a unique voltage range.

Storing multiple bits of data in the same memory element increases the capacity of the flash memory. However, this approach may also decrease the longevity of a device in various ways, such as reducing the number of times each memory element can be accurately written, the number of times each memory element can be accurately read per write, and the ability to maintain the accuracy of the data, for example, when the flash memory is not powered, is operating at high temperatures, or under other conditions. While the availability of increased capacity may drive the use of MLC memory elements, TLC memory elements, or beyond in flash memory, the possibility of decreased accuracy or product life can be a deterrent. By way of comparison, single-level cell (SLC) memory elements may have better accuracy and/or longer life, but are typically more expensive per bit.

SUMMARY

Methods are presented for a reduced level cell (RLC) mode. In one embodiment, a method includes determining that an erase block of a non-volatile storage device is to operate in a RLC mode. A non-volatile storage device, in certain embodiments, may be configured to store at least three bits of data per storage cell. A method, in a further embodiment, includes instructing a non-volatile storage device to program a first page of an erase block with data. A method, in one embodiment, includes instructing a non-volatile storage device to program a second page of an erase block with data. In another embodiment, a method includes instructing a non-volatile storage device to program a third page of an erase block with a predefined data pattern. Programming of a predefined data pattern, in certain embodiments, may be configured to adjust which abodes of an erase block are available to represent stored user data values. First, second, and third pages, in one embodiment, are associated with the same set of storage cells of an erase block.

Other methods are presented for a RLC mode. A method, in one embodiment, includes receiving a write command to write data to an electronic memory device having multi-level cell (MLC) memory elements. A MLC memory element, in certain embodiments, is programmable to programming states in a MLC mode. Programming states in a MLC mode, in one embodiment, are associated with at least a two bit encoding. A method, in a further embodiment, includes programming at least one MLC memory element to one of a plurality of programming states in a RLC mode. Programming states in a RLC mode, in one embodiment, exclude at least one programming state in a MLC mode. In a further embodiment, programming states in a RLC mode may comprise first and second states used to represent a most significant bit (MSB) of at least a two bit encoding in a MLC mode.

Apparatuses are presented for a RLC mode. In one embodiment, a trigger module is configured to determine whether an error rate for a set of non-volatile memory cells satisfies an error threshold. A program module, in certain embodiments, is configured to write workload data to one or more lower and middle pages of a set of memory cells. Each memory cell, in one embodiment, is configured to represent at least three bits of data by way of one of a set of program states. In a further embodiment, an endurance module is configured to write an endurance data pattern to an upper page of a set of memory cells instead of workload data in response to an error rate satisfying an error threshold, thereby defining a subset of program states of a set of memory cells for encoding workload data.

A further apparatus is presented for a RLC mode. A trigger module, in one embodiment, is configured to monitor an error rate for a region of non-volatile recording cells. Each recording cell, in certain embodiments, is configured to encode at least three bits of data using a set of abodes. In a further embodiment, a program module is configured to cause user data to be programmed to recording cells for two bits of at least three bits of data. An endurance module, in one embodiment, is configured to adjust one or more thresholds for abodes of recording cells in response to an error rate satisfying an error threshold to provide one or more separation distances between a subset of abodes available for encoding two bits of at least three bits of data.

Other apparatuses are presented for a RLC mode. In one embodiment, an apparatus includes means for initiating a RLC mode for a region of TLC non-volatile storage cells. An apparatus, in a further embodiment, includes means for programming a MSB page of a region of storage cells with a predefined data pattern configured to determine which TLC abodes of the region of storage cells are available for valid data in a RLC mode. In certain embodiments, an apparatus includes means for providing at least a predefined separation distance between TLC abodes available for valid data in a RLC mode.

Computer program products are presented comprising a computer readable storage medium storing computer usable program code executable to perform operations for a RLC mode. In one embodiment, an operation includes detecting that an endurance threshold for an erase block of a non-volatile recording medium has been met. An operation, in another embodiment, includes reducing a number of programming states of an erase block available for user data in response to an endurance threshold being met. In a further embodiment, an operation includes programming an upper page of an erase block with non-user data configured to mask one or more programming states unavailable for user data.

BRIEF DESCRIPTION OF THE DRAWINGS

In order that the advantages of the disclosure will be readily understood, a more particular description of the disclosure briefly described above will be rendered by reference to specific embodiments that are illustrated in the appended drawings. Understanding that these drawings depict only typical embodiments of the disclosure and are not therefore to be considered to be limiting of its scope, the disclosure will be described and explained with additional specificity and detail through the use of the accompanying drawings, in which:

FIG. 7 is a schematic block diagram illustrating one embodiment of a system for storing data in a multi-level memory cell;

DETAILED DESCRIPTION

Figure 1:
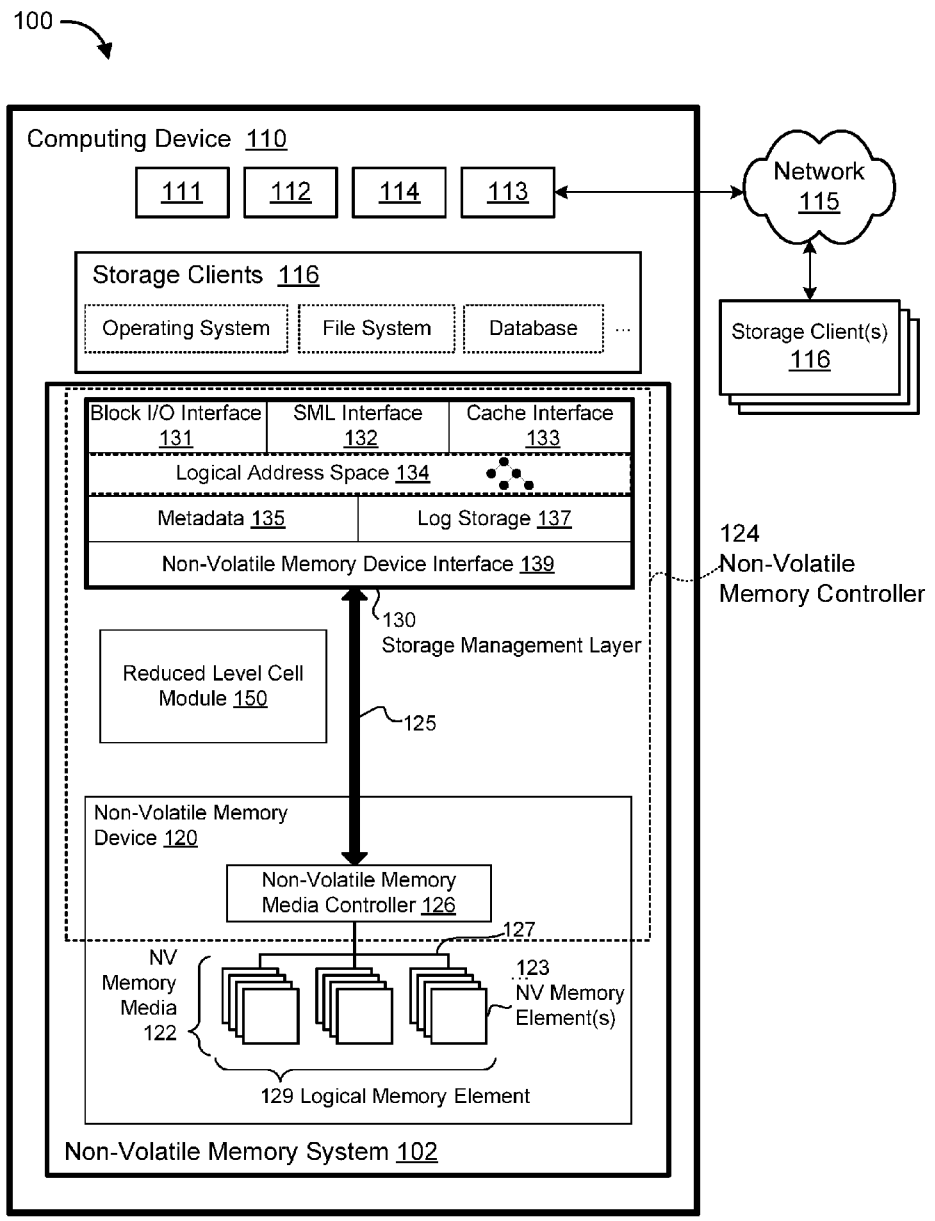
FIG. 1 is a schematic block diagram illustrating one embodiment of a system for a reduced level cell mode.

Aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable storage media having computer readable program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more computer readable storage media.

Any combination of one or more computer readable storage media may be utilized. A computer readable storage medium may be, for example, but not limited to, an electronic, magnetic, optical, electromagnetic, infrared, or semiconductor system, apparatus, or device, or any suitable combination of the foregoing.

More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), phase change memory (PRAM or PCM), a portable compact disc read-only memory (CD-ROM), a digital versatile disc (DVD), a blu-ray disc, an optical storage device, a magnetic tape, a Bernoulli drive, a magnetic disk, a magnetic storage device, a punch card, integrated circuits, other digital processing apparatus memory devices, or any suitable combination of the foregoing, but would not include propagating signals. In the context of this document, a computer readable storage medium may be any tangible medium that can contain, or store a program for use by or in connection with an instruction execution system, apparatus, or device.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, structures, or characteristics of the disclosure may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the disclosure. However, the disclosure may be practiced without one or more of the specific details, or with other methods, components, materials, and so forth. In other instances, well-known structures, materials, or operations are not shown or described in detail to avoid obscuring aspects of the disclosure.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

These computer program instructions may also be stored in a computer readable storage medium that can direct a computer, other programmable data processing apparatus, or other devices to function in a particular manner, such that the instructions stored in the computer readable storage medium produce an article of manufacture including instructions which implement the function/act specified in the schematic flowchart diagrams and/or schematic block diagrams block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present disclosure. In this regard, each block in the schematic flowchart diagrams and/or schematic block diagrams may represent a module, segment, or portion of code, which comprises one or more executable instructions for implementing the specified logical function(s).

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and computer instructions.

The description of elements in each figure may refer to elements of proceeding figures. Like numbers refer to like elements in all figures, including alternate embodiments of like elements.

According to various embodiments, a non-volatile memory controller manages one or more non-volatile memory devices. The non-volatile memory device(s) may comprise memory or storage devices, such as solid-state storage device(s), that are arranged and/or partitioned into a plurality of addressable media storage locations. As used herein, a media storage location refers to any physical unit of memory (e.g., any quantity of physical storage media on a non-volatile memory device). Memory units may include, but are not limited to: pages, memory divisions, erase blocks, sectors, blocks, collections or sets of physical storage locations (e.g., logical pages, logical erase blocks, described below), or the like.

The non-volatile memory controller may comprise a storage management layer (SML), which may present a logical address space to one or more storage clients. One example of an SML is the Virtual Storage Layer® of Fusion-io, Inc. of Salt Lake City, Utah. Alternatively, each non-volatile memory device may comprise a non-volatile memory media controller, which may present a logical address space to the storage clients. As used herein, a logical address space refers to a logical representation of memory resources. The logical address space may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

The SML may maintain metadata, such as a forward index, to map logical addresses of the logical address space to media storage locations on the non-volatile memory device(s). The SML may provide for arbitrary, any-to-any mappings from logical addresses to physical storage resources. As used herein, an "any-to any" mapping may map any logical address to any physical storage resource. Accordingly, there may be no pre-defined and/or pre-set mappings between logical addresses and particular, media storage locations and/or media addresses. As used herein, a media address refers to an address of a memory resource that uniquely identifies one memory resource from another to a controller that manages a plurality of memory resources. By way of example, a media address includes, but is not limited to: the address of a media storage location, a physical memory unit, a collection of physical memory units (e.g., a logical memory unit), a portion of a memory unit (e.g., a logical memory unit address and offset, range, and/or extent), or the like. Accordingly, the SML may map logical addresses to physical data resources of any size and/or granularity, which may or may not correspond to the underlying data partitioning scheme of the non-volatile memory device(s). For example, in some embodiments, the non-volatile memory controller is configured to store data within logical memory units that are formed by logically combining a plurality of physical memory units, which may allow the non-volatile memory controller to support many different virtual memory unit sizes and/or granularities.

As used herein, a logical memory element refers to a set of two or more non-volatile memory elements that are or are capable of being managed in parallel (e.g., via an I/O and/or control bus). A logical memory element may comprise a plurality of logical memory units, such as logical pages, logical memory divisions (e.g., logical erase blocks), and so on. As used herein, a logical memory unit refers to a logical construct combining two or more physical memory units, each physical memory unit on a respective non-volatile memory element in the respective logical memory element (each non-volatile memory element being accessible in parallel). As used herein, a logical memory division refers to a set of two or more physical memory divisions, each physical memory division on a respective non-volatile memory element in the respective logical memory element.

The logical address space presented by the storage management layer may have a logical capacity, which may correspond to the number of available logical addresses in the logical address space and the size (or granularity) of the data referenced by the logical addresses. For example, the logical capacity of a logical address space comprising $2^{32}$ unique logical addresses, each referencing 2048 bytes (2 KiB) of data may be $2^{43}$ bytes. (As used herein, a kibibyte (KiB) refers to 1024 bytes). In some embodiments, the logical address space may be thinly provisioned. As used herein, a "thinly provisioned" logical address space refers to a logical address space having a logical capacity that exceeds the physical capacity of the underlying non-volatile memory device(s). For example, the storage management layer may present a 64-bit logical address space to the storage clients (e.g., a logical address space referenced by 64-bit logical addresses), which exceeds the physical capacity of the underlying non-volatile memory devices. The large logical address space may allow storage clients to allocate and/or reference contiguous ranges of logical addresses, while reducing the chance of naming conflicts. The storage management layer may leverage the any-to-any mappings between logical addresses and physical storage resources to manage the logical address space independently of the underlying physical storage devices. For example, the storage management layer may add and/or remove physical storage resources seamlessly, as needed, and without changing the logical addresses used by the storage clients.

The non-volatile memory controller may be configured to store data in a contextual format. As used herein, a contextual format refers to a self-describing data format in which persistent contextual metadata is stored with the data on the physical storage media. The persistent contextual metadata provides context for the data it is stored with. In certain embodiments, the persistent contextual metadata uniquely identifies the data that the persistent contextual metadata is stored with. For example, the persistent contextual metadata may uniquely identify a sector of data owned by a storage client from other sectors of data owned by the storage client. In a further embodiment, the persistent contextual metadata identifies an operation that is performed on the data. In a further embodiment, the persistent contextual metadata identifies a sequence of operations performed on the data. In a further embodiment, the persistent contextual metadata identifies security controls, a data type, or other attributes of the data. In a certain embodiment, the persistent contextual metadata identifies at least one of a plurality of aspects, including data type, a unique data identifier, an operation, and a sequence of operations performed on the data. The persistent contextual metadata may include, but is not limited to: a logical address of the data, an identifier of the data (e.g., a file name, object id, label, unique identifier, or the like), reference(s) to other data (e.g., an indicator that the data is associated with other data), a relative position or offset of the data with respect to other data (e.g., file offset, etc.), data size and/or range, and the like. The contextual data format may comprise a packet format comprising a data segment and one or more headers. Alternatively, a contextual data format may associate data with context information in other ways (e.g., in a dedicated index on the non-volatile memory media, a memory division index, or the like).

In some embodiments, the contextual data format may allow data context to be determined (and/or reconstructed) based upon the contents of the non-volatile memory media, and independently of other metadata, such as the arbitrary, any-to-any mappings discussed above. Since the media location of data is independent of the logical address of the data, it may be inefficient (or impossible) to determine the context of data based solely upon the media location or media address of the data. Storing data in a contextual format on the non-volatile memory media may allow data context to be determined without reference to other metadata. For example, the contextual data format may allow the metadata to be reconstructed based only upon the contents of the non-volatile memory media (e.g., reconstruct the any-to-any mappings between logical addresses and media locations).

In some embodiments, the non-volatile memory controller may be configured to store data on one or more asymmetric, write-once media, such as solid-state storage media. As used herein, a "write once" storage medium refers to a storage medium that is reinitialized (e.g., erased) each time new data is written or programmed thereon. As used herein, an "asymmetric" storage medium refers to a storage medium having different latencies for different storage operations. Many types of solid-state storage media are asymmetric; for example, a read operation may be much faster than a write/program operation, and a write/program operation may be much faster than an erase operation (e.g., reading the media may be hundreds of times faster than erasing, and tens of times faster than programming the media). The memory media may be partitioned into memory divisions that can be erased as a group (e.g., erase blocks) in order to, inter alia, account for the asymmetric properties of the media. As such, modifying a single data segment in-place may require erasing the entire erase block comprising the data, and rewriting the modified data to the erase block, along with the original, unchanged data. This may result in inefficient "write amplification," which may excessively wear the media. Therefore, in some embodiments, the non-volatile memory controller may be configured to write data out-of-place. As used herein, writing data "out-of-place" refers to writing data to different media storage location(s) rather than overwriting the data "in-place" (e.g., overwriting the original physical location of the data). Modifying data out-of-place may avoid write amplification, since existing, valid data on the erase block with the data to be modified need not be erased and recopied. Moreover, writing data out-of-place may remove erasure from the latency path of many storage operations (the erasure latency is no longer part of the critical path of a write operation).

The non-volatile memory controller may comprise one or more processes that operate outside of the regular path for servicing of storage operations (the "path" for performing a storage operation and/or servicing a storage request). As used herein, the "path for servicing a storage request" or "path for servicing a storage operation" (also referred to as the "critical path") refers to a series of processing operations needed to service the storage operation or request, such as a read, write, modify, or the like. The path for servicing a storage request may comprise receiving the request from a storage client, identifying the logical addresses of the request, performing one or more storage operations on non-volatile memory media, and returning a result, such as acknowledgement or data. Processes that occur outside of the path for servicing storage requests may include, but are not limited to: a groomer, de-duplication, and so on. These processes may be implemented autonomously and in the background, so that they do not interfere with or impact the performance of other storage operations and/or requests. Accordingly, these processes may operate independent of servicing storage requests.

In some embodiments, the non-volatile memory controller comprises a groomer, which is configured to reclaim memory divisions (e.g., erase blocks) for reuse. The write out-of-place paradigm implemented by the non-volatile memory controller may result in obsolete or invalid data remaining on the non-volatile memory media. For example, overwriting data X with data Y may result in storing Y on a new memory division (rather than overwriting X in place), and updating the any-to-any mappings of the metadata to identify Y as the valid, up-to-date version of the data. The obsolete version of the data X may be marked as invalid, but may not be immediately removed (e.g., erased), since, as discussed above, erasing X may involve erasing an entire memory division, which is a time-consuming operation and may result in write amplification. Similarly, data that is no longer is use (e.g., deleted or trimmed data) may not be immediately removed. The non-volatile memory media may accumulate a significant amount of invalid data. A groomer process may operate outside of the critical path for servicing storage operations. The groomer process may reclaim memory divisions so that they can be reused for other storage operations. As used herein, reclaiming a memory division refers to erasing the memory division so that new data may be stored/programmed thereon. Reclaiming a memory division may comprise relocating valid data on the memory division to a new location. The groomer may identify memory divisions for reclamation based upon one or more factors, which may include, but are not limited to: the amount of invalid data in the memory division, the amount of valid data in the memory division, wear on the memory division (e.g., number of erase cycles), time since the memory division was programmed or refreshed, and so on.

The non-volatile memory controller may be further configured to store data in a log format. As described above, a log format refers to a data format that defines an ordered sequence of storage operations performed on a non-volatile memory media. In some embodiments, the log format comprises storing data in a pre-determined sequence of media addresses of the non-volatile memory media (e.g., within sequential pages and/or erase blocks of the media). The log format may further comprise associating data (e.g., each packet or data segment) with respective sequence indicators. The sequence indicators may be applied to data individually (e.g., applied to each data packet) and/or to data groupings (e.g., packets stored sequentially on a memory division, such as an erase block). In some embodiments, sequence indicators may be applied to memory divisions when the memory divisions are reclaimed (e.g., erased), as described above, and/or when the memory divisions are first used to store data.

In some embodiments the log format may comprise storing data in an "append only" paradigm. The non-volatile memory controller may maintain a current append point at a media address of the non-volatile memory device. The append point may be a current memory division and/or offset within a memory division. Data may then be sequentially appended from the append point. The sequential ordering of the data, therefore, may be determined based upon the sequence indicator of the memory division of the data in combination with the sequence of the data within the memory division. Upon reaching the end of a memory division, the non-volatile memory controller may identify the "next" available memory division (the next memory division that is initialized and ready to store data). The groomer may reclaim memory divisions comprising invalid, stale, and/or deleted data, to ensure that data may continue to be appended to the media log.

The log format described herein may allow valid data to be distinguished from invalid data based upon the contents of the non-volatile memory media, and independently of other metadata. As discussed above, invalid data may not be removed from the non-volatile memory media until the memory division comprising the data is reclaimed. Therefore, multiple "versions" of data having the same context may exist on the non-volatile memory media (e.g., multiple versions of data having the same logical addresses). The sequence indicators associated with the data may be used to distinguish invalid versions of data from the current, up-to-date version of the data; the data that is the most recent in the log is the current version, and previous versions may be identified as invalid.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description.

FIG. 1 is a block diagram of one embodiment of a system 100 comprising a reduced level cell module 150. In general, the reduced level cell module 150 is configured to provide a reduced level cell (RLC) mode for non-volatile memory media 122 of a non-volatile memory device 120. In the reduced level cell mode, an erase block or other region of non-volatile memory cells of the non-volatile memory media 122 may continue to operate after reaching a certain age, a certain error rate, or the like with a reduced capacity, instead of being retired from use completely. In certain embodiments, the reduced level cell module 150 may provide a reduced level cell mode virtually, from a non-volatile memory controller 124, 126 such that the non-volatile memory media 122 continues to operate with all of its original storage levels (e.g., multi-level cell (MLC) mode, triple level cell (TLC) mode, or the like) at the device level, but with certain abodes or program states restricted or masked at the controller level. In this manner, the reduced level cell module 150 may provide a reduced level cell mode in a vendor or manufacturer agnostic manner that is compatible with non-volatile memory media 122 from multiple different vendors or manufacturers, even if they have different arrangements of abodes or program states or other differences in architecture.

The reduced level cell module 150 may be part of and/or in communication with a storage management layer (SML) 130. The SML 130 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 (and/or non-volatile memory controller 124) to a communication network, such as an Internet Protocol network, a Storage Area Network, or the like.

The computing device 110 may further comprise a non-transitory, computer readable storage media 114. The computer readable storage media 114 may comprise executable instructions configured to cause the computing device 110 (e.g., processor 111) to perform steps of one or more of the methods disclosed herein. Alternatively, or in addition, the storage management layer 130 and/or one or more modules thereof may be embodied as one or more computer readable instructions stored on the non-transitory storage media 114.

The storage management layer 130 may be configured to provide storage services to one or more storage clients 116. The storage clients 116 may include local storage clients 116 operating on the computing device 110 and/or remote, storage clients 116 accessible via the network (and network interface 113). The storage clients 116 may include, but are not limited to: operating systems, file systems, database applications, server applications, kernel-level processes, user-level processes, applications, and the like.

The storage management layer 130 comprises and/or is communicatively coupled to one or more non-volatile memory devices 120. The non-volatile memory devices 120 may include different types of non-volatile memory devices including, but not limited to: solid-state storage devices, hard drives, SAN storage resources, or the like. The non-volatile memory devices 120 may comprise one or more respective non-volatile memory media controllers 126 and non-volatile memory media 122. The SML 130 may provide access to the one or more non-volatile memory devices 120 via a traditional block I/O interface 131. Additionally, the SML 130 may provide access to enhanced functionality (large, virtual address space) through the SML interface 132. The metadata 135 may be used to manage and/or track storage operations performed through any of the Block I/O interface 131, SML interface 132, cache interface 133, or other, related interfaces.

The cache interface 133 may expose cache-specific features accessible via the storage management layer 130. Also, in some embodiments, the SML interface 132 presented to the storage clients 116 provides access to data transformations implemented by the one or more non-volatile memory devices 120 and/or the one or more non-volatile memory media controllers 126.

The SML 130 may provide storage services through one or more interfaces, which may include, but are not limited to: a block I/O interface, an extended storage management layer interface, a cache interface, and the like. The SML 130 may present a logical address space 134 to the storage clients 116 through one or more interfaces. As discussed above, the logical address space 134 may comprise a plurality of logical addresses, each corresponding to respective media locations on the one or more non-volatile memory devices 120. The SML 130 may maintain metadata 135 comprising any-to-any mappings between logical addresses and media locations, as described above.

The SML 130 may further comprise a log storage module 137 that is configured to store data in a contextual, log format. The contextual, log data format may comprise associating data with persistent contextual metadata, such as the logical address of the data, or the like. The contextual, log format may further comprise associating data with respective sequence identifiers on the non-volatile memory media 122, which define an ordered sequence of storage operations performed on the one or more non-volatile memory devices 120, as described above.

The SML 130 may further comprise a non-volatile memory device interface 139 configured to transfer data, commands, and/or queries to the one or more non-volatile memory devices 120 over a bus 125, which may include, but is not limited to: a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like. The communication interface 113 may comprise one or more network interfaces configured to communicatively couple the computing device 110 (and/or non-volatile memory controller 124) to a network 115 and/or to one or more remote, network-accessible storage clients 116.

The computing device 110 may comprise a non-volatile memory controller 124 that is configured to provide storage services to the storage clients 116. The storage clients 116 may include local storage clients 116 operating on the computing device 110 and/or remote, storage clients 116 accessible via the network 115 (and network interface 113). The non-volatile memory controller 124 comprises one or more non-volatile memory devices 120. Although FIG. 1B depicts a single non-volatile memory device 120, the disclosure is not limited in this regard and could be adapted to incorporate any number of non-volatile memory devices 120.

The non-volatile memory device 120 may comprise non-volatile memory media 122, which may include but is not limited to: NAND flash memory, NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), resistive RAM (RRAM), programmable metallization cell (PMC), conductive-bridging RAM (CBRAM), magneto-resistive RAM (MRAM), dynamic RAM (DRAM), phase change memory (PRAM or PCM), magnetic storage media (e.g., hard disk, tape), optical storage media, or the like. While the non-volatile memory media 122 is referred to herein as "memory media," in various embodiments, the non-volatile memory media 122 may more generally comprise a non-volatile recording media capable of recording data, which may be referred to as a non-volatile memory media, a non-volatile storage media, or the like. Further, the non-volatile memory device 120, in various embodiments, may comprise a non-volatile recording device, a non-volatile memory device, a non-volatile storage device, or the like.

The non-volatile memory media 122 may comprise a plurality of cells for storing data. As used herein, a cell refers to the smallest physical unit of storage or memory of the non-volatile memory media 122. In some embodiments, each cell has a physical and/or electrical property which may be altered to encode or otherwise store data. While cells of the non-volatile memory media 122 are generally referred to herein as "memory cells" or "storage cells," the cells may more generally comprise recording cells capable of recording data. Further, while the reduced level cell module 150 is primarily described herein with regard to the non-volatile memory media 122, in certain embodiments, the reduced level cell module 150 may operate in a substantially similar manner to provide a reduced level cell mode for a volatile memory media.

The non-volatile memory media 122 may comprise one or more non-volatile memory elements 123, which may include, but are not limited to: chips, packages, planes, die, and the like. A non-volatile memory media controller 126 may be configured to manage storage operations on the non-volatile memory media 122, and may comprise one or more processors, programmable processors (e.g., field-programmable gate arrays), or the like. In some embodiments, the non-volatile memory media controller 126 is configured to store data on (and read data from) the non-volatile memory media 122 in the contextual, log format described above, and to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. As discussed above, the logical memory element may be partitioned into respective logical memory units (e.g., logical pages) and/or logical memory divisions (e.g., logical erase blocks). The logical memory units may be formed by logically combining physical memory units of each of the non-volatile memory elements. For example, if the non-volatile memory media 122 comprises twenty-five (25) non-volatile memory elements, each logical memory unit may comprise twenty-five (25) pages (a page of each element of non-volatile memory media 122).

The non-volatile memory controller 124 may comprise a SML 130 and the non-volatile memory media controller 126. The SML 130 may provide storage services to the storage clients 116 via one or more interfaces 131, 132, and/or 133. In some embodiments, the SML 130 provides a block-device I/O interface 131 through which storage clients 116 perform block-level I/O operations. Alternatively, or in addition, the SML 130 may provide a storage management layer (SML) interface 132, which may provide other storage services to the storage clients 116. In some embodiments, the SML interface 132 may comprise extensions to the block device interface 131 (e.g., storage clients 116 may access the SML interface 132 through extensions to the block device interface 131). Alternatively, or in addition, the SML interface 132 may be provided as a separate API, service, and/or library. The SML 130 may be further configured to provide a cache interface 133 for caching data using the non-volatile memory system 102.

As described above, the SML 130 may present a logical address space 134 to the storage clients 116 (through the interfaces 131, 132, and/or 133). The SML 130 may maintain metadata 135 comprising any-to-any mappings between logical addresses in the logical address space 134 and media locations on the non-volatile memory device 120. The metadata 135 may comprise a logical-to-physical mapping structure with entries that map logical addresses in the logical address space 134 and media locations on the non-volatile memory device 120. The logical-to-physical mapping structure of the metadata 135, in one embodiment, is sparsely populated, with entries for logical addresses for which the non-volatile memory device 120 stores data and with no entries for logical addresses for which the non-volatile memory device 120 does not currently store data. The metadata 135, in certain embodiments, tracks data at a block level, with the SML 130 managing data as blocks.

The non-volatile memory system 102 may further comprise a log storage module 137, which, as described above, may be configured to store data on the non-volatile memory device 120 in a contextual, log format. The contextual, log data format may comprise associating data with a logical address on the non-volatile memory media 122. The contextual, log format may further comprise associating data with respective sequence identifiers on the non-volatile memory media 122, which define an ordered sequence of storage operations performed on the non-volatile memory media 122, as described above. The non-volatile memory controller 124 may further comprise a non-volatile memory device interface 139 that is configured to transfer data, commands, and/or queries to the non-volatile memory media controller 126 over a bus 125, as described above.

The non-volatile memory system 102, in the depicted embodiment, includes a reduced level cell module 150. The reduced level cell module 150, in one embodiment, is configured to determine when an erase block or other region of the non-volatile memory media 122 is to operate in a reduced level cell mode, based on an error rate for the region, an age of the region, or another endurance threshold being satisfied. To provide a reduced level cell mode, in certain embodiments, the reduced level cell module 150 may program or write user data or other workload data to one or more lower pages of memory cells of an erase block or other region (e.g., a lower page for MLC media, a lower page and a middle page for TLC media, or the like), substantially similar to a standard MLC or TLC mode. However, the reduced level cell module 150, instead of programming user data or other workload data to the upper page of the memory cells in the reduced level cell mode, may restrict or mask certain abodes or program states, by adjusting boundaries or thresholds for the abodes (e.g., program verify thresholds, read voltage thresholds, or the like), by programming the upper page with a predefined endurance pattern to separate available abodes, mask unavailable abodes, or the like.

The reduced level cell module 150 may allow an erase block or other region of non-volatile memory media 122 to continue to operate and reliably store data after reaching a certain age, a certain error rate, or the like, operating with a reduced capacity instead of being retired from use completely. In certain embodiments, the reduced level cell module 150 may provide a reduced level cell mode virtually, from a non-volatile memory controller 124, 126 such that the non-volatile memory media 122 continues to operate at the device level with all of its original storage levels (e.g., MLC mode, TLC mode, or the like), but with certain abodes or program states restricted or masked at the controller level. In this manner, the reduced level cell module 150 may provide a reduced level cell mode in a vendor or manufacturer agnostic manner that is compatible with different architectures of non-volatile memory media 122 from multiple different vendors or manufacturers, even if they have different arrangements of abodes or program states.

In one embodiment, the reduced level cell module 150 may comprise executable software code, such as a device driver for the non-volatile memory device 120, the SML 130, or the like, stored on the computer readable storage media 114 for execution on the processor 111. In another embodiment the reduced level cell module 150 may comprise logic hardware of the one or more non-volatile memory devices 120, such as a non-volatile memory media controller 126, a non-volatile memory controller 124, a device controller, a field-programmable gate array (FPGA) or other programmable logic, firmware for an FPGA or other programmable logic, microcode for execution on a microcontroller, an application-specific integrated circuit (ASIC), or the like. In a further embodiment, the reduced level cell module 150 may include a combination of both executable software code and logic hardware.

In one embodiment, the reduced level cell module 150 is configured to receive storage requests from the SML 130 via a bus 125 or the like. The reduced level cell module 150 may be further configured to transfer data to/from the SML 130 and/or storage clients 116 via the bus 125. Accordingly, the reduced level cell module 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the reduced level cell module 150 may receive storage requests as an API call from a storage client 116, as an IO-CTL command, or the like. The reduced level cell module 150 is described in greater detail below with regard to FIGS. 2A and 2B.

Figure 2A:
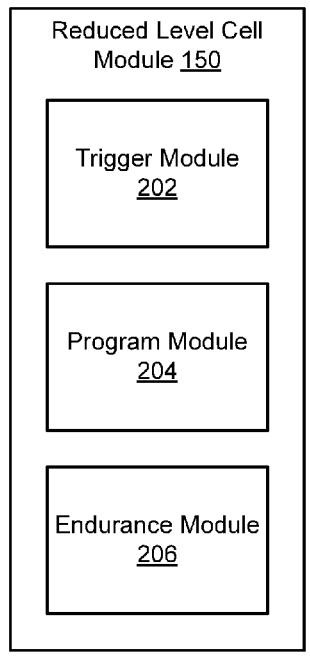
FIG. 2A is a schematic block diagram illustrating one embodiment of a reduced level cell module.

FIG. 2A depicts one embodiment of a reduced level cell module 150. The reduced level cell module 150 may be substantially similar to the reduced level cell module 150 described above with regard to FIG. 1. In the depicted embodiment, the reduced level cell module 150 includes a trigger module 202, a program module 204, and an endurance module 206.

Non-volatile memory media 122, such as MLC or TLC NAND flash media, may have an upper error rate limit or other endurance threshold, beyond which memory cells of the media 122 may not consistently maintain distinct data values, voltage levels, or the like (e.g., eight distinct voltage levels for TLC memory cells, four distinct voltage levels for MLC memory cells). Rather than completely retiring the memory cells once the cells have reached such a limit (e.g., worn out), in certain embodiments, the reduced level cell module 150 uses the memory cells in a reduced level cell mode to allow continued use of the memory cells with a reduction in capacity. For example, the reduced level cell module 150 may operate TLC memory cells in a virtual MLC reduced level cell mode with four distinct voltage levels (e.g., abodes, program states) instead of eight, at least virtually, reducing a capacity of each memory cell from three bits to two bits instead of retiring the memory cells and losing all of the storage capacity completely, with a one-third reduction in storage capacity instead of a complete reduction.

As used herein, a reduced level cell mode for one or more memory cells comprises use of the one or more memory cells to store or encode less information, less usable or used information, less workload data, less user data, less valid data, or the like (e.g., fewer bits) than the one or more memory cells are capable. For example, a reduced level cell mode may comprise operating TLC memory cells in a MLC reduced level cell mode, operating MLC memory cells in a SLC reduced level cell mode, or the like. As described in greater detail below, a reduced level cell mode may be virtual and implemented in a layer above the non-volatile memory media 122, above the non-volatile memory device 120, or the like.

For example, the reduced level cell mode may be virtual and may be transparent to the non-volatile memory media 122 and/or the non-volatile memory media controller 126, which may continue to operate and store data in a native TLC mode, MLC mode, or the like, with the reduced level cell module 150 restricting or masking certain abodes, program states, and/or pages of the memory cells to provide the reduced level cell mode. In such embodiments, the reduced level cell module 150 may provide a reduced level cell mode for non-volatile memory media 122 of different architectures, regardless of the underlying characteristics of the media 122, such as an arrangement of abodes or program states, a manufacturer or vendor, or the like, because the reduced level cell module 150 may provide the reduced level mode based on a common, predefined data encoding used by multiple types, makes, and/or models of non-volatile memory media 122, such as a Gray code encoding described below or the like. The reduced level cell module 150, in one embodiment, may increase an endurance or usable lifetime of the non-volatile memory media 122 beyond a normal wear expectancy using a reduced level cell mode.

As described above, a "cell" refers to the smallest physical unit of storage or memory of non-volatile memory media 122. In some embodiments, each cell has a physical and/or electrical property which may be altered to encode or otherwise store data. For example, in Flash memory, a cell may include a floating gate transistor, and the physical property used to encode data may be the charge stored on the floating gate, the threshold voltage Vt that is sufficient to make the transistor conduct when applied to the control gate, or the like. As another example, in phase change memory, a cell may be a region of chalcogenide glass, and the physical property used to encode data may be the degree of crystallization of the region, the electrical resistance of the cell, or the like. As described above with regard to the non-volatile memory media 122, many types of cells may encode data of a non-volatile memory device 120 for use with the reduced level cell module 150.

In one embodiment, the range of possible values for the data-encoding physical property of a cell is divided into discrete program states or abodes, so that each program state or abode encodes one or more possible data values. In some embodiments, the program states or abodes are configured to encode values for a plurality of bits. For example, if a cell stores two bits using four states (e.g., in MLC mode), each state may encode a different value for the two bits of the cell, such as "11," "01," "00," or "10." If a cell stores three bits using eight states (e.g., in TLC mode), each state may encode a different value for the three bits of the cell, such as "111," "011," "001," "101," "100," "000," "010," or "110." In a further embodiment, the states or abodes of a cell may be separated by guard bands or separation distances. As used herein, a program "state" or "abode" refers to a sub-range of possible values for the data-encoding physical property of a cell, so that each state corresponds to a single set of one or more data values. An abode, program state, programming state, or storage state, may comprise a range of read levels, such as a read voltage level for flash media, a read resistivity level for PCM media, or the like, associated with a particular set of one or more data values. Read thresholds, such as a read voltage threshold, a read resistivity threshold, or the like, may separate abodes or program states. States/abodes and guard bands are described in further detail below with regard to FIG. 11A.

In some embodiments, an encoding maps states or abodes of a cell to data values. In general, an encoding is a mapping that allows each state or abode of a cell to represent a corresponding data value or set of data values. For example, in a cell with two states (e.g., SLC), the encoding may map the lower state to a binary "1" and the upper state to a binary "0," so that the cell stores one bit of information. As another example, in a cell with four states (e.g., MLC), a Gray code encoding or the like may map the four states L0, L1, L2, and L3 to the data values "11," "01," "00," and "10," respectively, so that the cell stores two bits of information. Similarly, in a cell with eight states (e.g., TLC), a Gray code encoding or the like may map the eight states L0, L1, L2, L3, L4, L5, L6, and L7 to the data values "111," "011," "001," "101," "100," "000," "010," and "110" so that the cell stores, includes, and/or encodes three bits of information. The non-volatile memory media 122 may store data using other encodings. Encodings are described in further detail below with regard to FIG. 11B.

As described below, a multi-level or MLC memory cell stores at least two bits, a most significant bit (MSB) and a least significant bit (LSB). One type of MLC memory media is triple level cell (TLC) memory media that stores or encodes three bits, a MSB, a central significant bit (CSB), and a LSB. Other embodiments of MLC memory media may store or encode more than three bits per cell, such as a quad level cell with sixteen abodes or program states per cell that encode four bits, or the like. In certain embodiments, a MSB, CSB, and/or LSB, though part of the same physical memory cell, may be assigned to different pages of the non-volatile memory media 122 (e.g., an upper, middle, and/or lower page).

In certain embodiments, a plurality of the multi-level storage cells are organized on the non-volatile memory media 122 (e.g., NAND flash memory media) as a physical page. In certain non-volatile memory media 122, a physical page is the smallest unit that can be written to the non-volatile memory media 122. In such embodiments, a memory cell may be associated with a page tuple comprising a page for each bit of the cell (e.g., two pages or a page pair for MLC, three pages for TLC). A page tuple is a set of pages (e.g., upper, middle, and/or lower) that are associated with a single, common set of physical memory cells. For example, a memory cell may be associated with a page pair that includes an upper page and a lower page, a page tuple that includes an upper page, a middle page, and a lower page, or the like. An upper page may be associated with the MSBs, a middle page may be associated with the CSBs, and the lower page may be associated with the LSBs, or the reverse. Physical pages, in certain embodiments, may be grouped or organized into logical pages, with each logical page comprising multiple physical pages.

Thus, the MSB, CSB, and LSB of a memory cell may have different addresses in the non-volatile memory device 120. In certain embodiments, the upper page includes the MSBs of a plurality of memory cells, the middle page includes the CSBs of the plurality of memory cells, and the lower page includes the LSBs of the same, common set or plurality of memory cells. Writes directed to the upper page may therefore cause changes only in the MSBs of the associated memory cells, writes directed to the middle page may cause changes only in the CSBs of the associated memory cells, and writes directed to the lower page may cause changes only in the LSBs of the associated memory cells, based on a data encoding for abodes or program states of the memory cells.

In one embodiment, the trigger module 202 is configured to determine or designate when a region of the non-volatile memory media 122 (e.g., a set of non-volatile memory cells) is to operate in or be put in a reduced level cell mode. A region or set of memory cells for which the trigger module 202 may initiate or trigger a reduced level cell mode, in various embodiments, may include a physical or logical erase block, a set of pages or word lines associated with the same memory cells (e.g., a page tuple; a lower and upper page for MLC cells; lower, middle, and upper pages for TLC cells), a die, a die plane, a chip, a package, or another region or set of memory cells.

The trigger module 202, in certain embodiments, is configured to monitor or check one or more endurance characteristics for a region or set of storage cells and to determine whether or not to trigger a reduced level cell mode for the region or set of storage cells based on the one or more endurance characteristics. As used herein, an endurance characteristic may include and/or relate to a make, a model, a manufacturer, a product version, or the like for the non-volatile memory device 120 and/or for the non-volatile memory media 122; an attribute or statistic for a set of memory cells; an environmental condition or a use case of the non-volatile memory device 120 and/or of the non-volatile memory media 122; and/or another statistic, heuristic, or other descriptor for an attribute or state of memory cells of the non-volatile memory media 122.

An endurance characteristic for a set of memory cells may affect or inform the determination of the trigger module 202 of whether to initiate or trigger a reduced level cell mode for a set of memory cells. In one embodiment, an endurance characteristic may include an error rate or other error statistic for a set of memory cells, such as an uncorrectable bit error rate (UBER), a raw bit error rate (RBER), or the like. In another embodiment, an endurance characteristic may include an age for a set of memory cells, such as a program/erase cycle count, an amount of time since being initialized or first powered on, a total amount of time being powered on, or the like for the non-volatile memory device 120 or for a specific set of memory cells. In a further embodiment, an endurance characteristic may include a read count for a set of memory cells.

An endurance characteristic, in one embodiment, may include a retention time since a previous write for a set of memory cells. In an additional embodiment, an endurance characteristic may include a temperature for a set of memory cells. An endurance characteristic, in certain embodiments, may include a use case for a set of memory cells. In one embodiment, an endurance characteristic may include a storage request latency for the non-volatile memory device 120 (such as an average, maximum, or other storage request execution latency). Other measured, monitored, tracked, and/or discovered statistics, counts, states, parameters, rates, or the like may also be used as endurance characteristics. The trigger module 202, in various embodiments, may receive input regarding one or more endurance characteristics, directly or indirectly, from one or more sensors, from other modules or elements such as an ECC decoder, a non-volatile memory controller 124, 126, the SML 130, or the like.

In one embodiment, the trigger module 202 monitors one or more endurance characteristics and initiates or triggers a reduced level cell mode for a region or set of non-volatile memory cells in response to an endurance characteristic satisfying an endurance threshold (e.g., being less than the endurance threshold, being greater than the endurance threshold, approaching the endurance threshold, or having another predefined relationship relative to the endurance threshold) or otherwise determining that an endurance threshold has been met. For example, the trigger module 202 may monitor an error rate for an erase block or other set of memory cells and may initiate or trigger a reduced level cell mode for the erase block in response to the error rate satisfying an error threshold, or the like. An endurance threshold such as an error threshold may be predefined, hard-coded, or the like (e.g., determined by a manufacturer, vendor, design engineer, or the like), the trigger module 202 may dynamically determine an endurance threshold based on one or more endurance characteristics (e.g., the trigger module 202 may increase or lower an endurance threshold over time with age of the non-volatile memory device 120), or the like.

In certain embodiments, the trigger module 202 may evaluate one or more endurance characteristics for a set of memory cells relative to an endurance threshold in response to a predefined event for the memory cells. For example, the trigger module 202 may evaluate an endurance characteristic and determine whether a set of memory cells is to operate in a reduced level cell mode in response to a read request or operation for the cells, a write request or operation for the cells, the cells (e.g., an erase block) being selected for a storage capacity recovery operation such as grooming or garbage collection, or another predefined event.

The trigger module 202, in one embodiment, may trigger or initiate a reduced level cell mode for an erase block or other region or set of memory cells (e.g., designate the memory cells for RLC mode) in cooperation with the endurance module 206 described below. For example, the trigger module 202 may communicate an identifier for a designated set of memory cells (e.g., a logical or physical erase block ID or address) to the endurance module 206, may send a message or command to the endurance module 206, may update a shared reduced level cell tracking data structure, or the like so that the endurance module 206 and/or the program module 204 may use the memory cells in a reduced level cell mode.

The trigger module 202, over time, may trigger or initiate multiple levels or stages of reduced level cell modes for a set of memory cells. For example, for a set of TLC memory cells, the trigger module 202 may first initiate a MLC reduced level cell mode where the cells store two bits instead of three in response to an error characteristic satisfying a first threshold and may later, in response to an endurance characteristic satisfying a second threshold, initiate a SLC reduced level cell mode where the cell store a single bit instead of three.

In certain embodiments, the trigger module 202 may continue to monitor one or more endurance characteristics for a region or set of memory cells after the memory cells are in a reduced level cell mode, and may trigger or initiate retirement of the memory cells in response to an endurance characteristic satisfying a retirement threshold, as described below with regard to the retirement module 210. For example, the trigger module 202 may trigger or cause the retirement module 210 to retire an erase block or other region or set of memory cells from use for storing data in response to an error rate for the memory cells satisfying a retirement error rate threshold while in a reduced level cell mode, or the like.

In one embodiment, the program module 204 is configured to write data to memory cells of the non-volatile memory media 122 (e.g., to cause the non-volatile memory device 120 to program cells, to instruct the non-volatile storage device 120 to program cells, or the like). The program module 204 may write data or otherwise cause data to be programmed using the SML interface 132, the non-volatile memory device interface 139, the bus 125, the bus 127, or the like depending on the location and/or implementation of the reduced level cell module 150. As used herein, writing data to memory cells of the non-volatile memory media 122 includes instructing or otherwise causing the non-volatile memory device 120 to program the memory cells with the data.

Prior to writing to or programming a set of memory cells, the program module 204 may cooperate with the trigger module 202 and/or the endurance module 206 to determine whether or not the memory cells are in a reduced level cell mode. For example, the program module 204 may query the trigger module 202 and/or the endurance module 206, check a shared reduced level cell tracking data structure, or the like. If a region or set of memory cells (e.g., an erase block) is not in a reduced level cell mode, the program module 204 may cause each page or bit associated with the memory cells to be programmed (e.g., a lower and upper page for MLC media 122; a lower, middle, and upper page for TLC media). If a region or set of memory cells (e.g., an erase block) is operating in a reduced level cell mode, the program module 204 may cause only a subset of pages or bits associated with the memory cells to be programmed with valid user data or other workload data.

As described below, in certain embodiments, the endurance module 206 may cause one or more remaining bits or pages (e.g., restricted, invalid, and/or unavailable bits or pages) of the memory cells to be programmed with a predefined endurance pattern. In other embodiments, for certain types, makes, or models of non-volatile memory media 122, one or more remaining bits or pages (e.g., restricted, invalid, and/or unavailable bits or pages) may remain un-programmed, with neither the program module 204 nor the endurance module 206 programming or causing any data to be programmed to the remaining bits or pages. Depending on the reduced level cell mode for a set of memory cells and/or the type of memory cells (e.g., MLC, TLC, 3D, or the like), the program module 204 may program various numbers of bits and/or pages for a set of memory cells and leave various numbers of bits and/or pages un-programmed for the endurance module 206. For example, for a set of TLC memory cells in a MLC reduced level cell mode, the program module 204 may program two bits or pages, leaving a single bit or page un-programmed. For a set of TLC memory cells in a SLC reduced level cell mode, the program module 204 may program a single bit or page and leave two bits or pages un-programmed.

The program module 204 and/or the endurance module 206, in certain embodiments, write data and/or cause data to be programmed to a set of memory cells in accordance with a sequential page programming order for the non-volatile memory media 122. For example, a sequential page programming order may indicate that a first/lower page be programmed prior to a second/middle page being programmed, that a second/middle page be programmed prior to a third/upper page being programmed, or another predefined order of page programming for a set of cells. The non-volatile memory media 122 may require a multi-stage programming process, such as a two stage programming process (e.g., lower page then upper page or vice versa), a three stage programming process (e.g., lower page, then middle page, then upper page), or the like. In a further embodiment, certain non-volatile memory media 122 may require that each page or bit of a set of memory cells be known, be present, be ready to be programmed, and/or be programmed at the same time (e.g., that a middle and/or upper page of data be programmed or be ready for programming prior to a lower page being programmed). The program module 204, in one embodiment, may cooperate with the endurance module 206 and/or the buffer module 212 to satisfy a sequential page programming order, even in a reduced level cell mode.

In embodiments with a mandated page programming order, the program module 204 may write or program data to one or more lower pages in a reduced level cell mode, leaving one or more upper pages either un-programmed or programmed by the endurance module 206. As used herein, lower pages may include a lower page (e.g., LSB) associated with a least significant bit and one or more middle pages (e.g., central significant bits "CSBs") between the lower page and an upper page (e.g., MSB) for a set of memory cells. For example, lower pages may refer to one or more pages closest to a lower page, upper pages may refer to one or more pages closest to an upper page, or the like. The position, magnitude, address, order, or the like of a lower page, middle page, and/or upper page may be reversed, may be switched, or the like, depending on an encoding of the associated memory cells, on a convention used, on endianness, or the like, and are used herein merely for convenience and should not be interpreted as limiting.

The program module 204, in one embodiment, writes user data or other workload data to one or more lower order pages of a set of memory cells in either a reduced level cell mode or a default or native mode (e.g., MLC, TLC). If the set of memory cells is not in a reduced level cell mode, the program module 204 may also write user data or other workload data to one or more upper order pages of the set of memory cells, utilizing all or substantially all of the capacity of the storage cells for user data or other workload data.

For example, for TLC memory cells, the program module 204 may instruct the non-volatile storage device 102 to program a first page (e.g., lower page) of an erase block or other set of memory cells with user/workload data and may instruct the non-volatile storage device 102 to program a second page (e.g., middle/central page) of the erase block with user/workload data. If the erase block or other set of memory cells is not in a reduced level cell mode (e.g., an error rate or other endurance characteristic has failed to satisfy a threshold), the program module 204 may also instruct the non-volatile storage device 102 to program a third page (e.g., upper page) of the erase block with user/workload data. However, if the erase block or other set of memory cells is operating in a reduced level cell mode (e.g., an error rate or other endurance characteristic has satisfied a threshold), the program module 204 may cause the third page (e.g., upper page) to remain un-programmed, may allow the endurance module 206 to write/program a predefined endurance pattern to the third page (e.g., upper page), or the like.

The program module 204, in one embodiment, writes or programs valid data (e.g., user data or other workload data) to a set of memory cells. As described below, the endurance module 206 may write or program a predefined endurance pattern that does not directly include user data or other workload data to a set of memory cells. In one embodiment, workload data or user data may include data associated with a write request from a storage client 116, over the block I/O interface 131, the SML interface 132, and/or the cache interface 133. Workload data or user data, in certain embodiments, is associated with or indexed by logical addresses of the logical address space 134. Workload data or user data, in a further embodiment, does not include metadata or overhead data such as the metadata 135, a predefined endurance data pattern, packet headers, logical-to-physical mappings, error correction data, or the like. In certain embodiments, workload data or user data may be stored with, interleaved, or intermingled with metadata or other non-user, non-workload data.

The program module 204, in certain embodiment, writes valid user/workload data, which may include accompanying metadata, exclusively, referred to herein as data bits, while the endurance module 206 may write a predefined endurance data pattern, which may be referred to herein as audit bits. In other embodiments, the program module 204 may cooperate with the endurance module 206 to write or program both data bits and audit bits. The audit bits or predefined endurance data pattern, as described in greater detail below, may comprise exclusively non-user, non-workload data, such as the results of an XNOR logical equality operation on the data bits, all binary ones, all binary zeroes, error correction or parity data for the data bits, or another predefined or known data pattern.

In one embodiment, a standard or default operation of the non-volatile memory controller(s) 124, 126 for the non-volatile memory media 122 may automatically and/or dynamically set the audit bit (e.g., the upper page, MSBs) to a known expected value. For example, an erase operation of an erase block for NAND flash comprising the memory cell may by design set the audit bit to a known expected value, such as a logical binary one value. In other embodiments, in order to provide a greater separation distance, a wider guard band, a greater read window budget, or the like than may be provided by skipping programming of an upper page, the program module 204 and/or the endurance module 206 may affirmatively program the predefined endurance data pattern to the upper page or MSBs, even if the pattern consists of exclusively binary ones, allowing the endurance module 206 to explicitly define or determine which abodes or storage states of the memory cells are available to store or encode the data bits as described below.

In one embodiment, the program module 204 programs at least one audit bit with audit data and programs one or more data bits with user/workload data or associated metadata, where the audit data comprises a logic value and the data programmed into a data bit comprises a logic value. In one embodiment, the program module 204 and/or the endurance module 206 may program an audit bit in a memory cell separately from programming one or more data bits of the memory cell (e.g., a multi-step programming operation). In another embodiment, the program module 204 and/or the endurance module 206 may program an audit bit and one or more data bits of a memory cell in a single programming operation.

In some embodiments, each non-volatile memory cell has $2^X$ possible programming states or abodes, where X is equal to the number of bits per non-volatile memory cell. For example, a MLC non-volatile memory cell may store two bits of information and, accordingly, have four possible programming states or abodes. As another example, a TLC non-volatile memory cell may store three bits of information and, accordingly, have eight possible programming states or abodes.

A TLC or MLC non-volatile memory cell operating in a SLC reduced level cell mode may store at least a most significant bit (MSB), at least a least significant bit (LSB), or the like. As described above, even though the MSB and the LSB are part of the same physical triple level memory cell 402, the MSB and the LSB may be assigned to different physical and/or logical pages of the media. In certain embodiments, a plurality of the non-volatile memory cells is logically organized as one or more pages on the non-volatile memory device 120. A page may be used as the designation of the smallest unit that can be written to the non-volatile memory device 120. Moreover, the non-volatile memory cell may be associated with a page pair or tuple. A page pair is a pair of pages (e.g., designated as upper and lower pages) that are associated with a single, common set of physical non-volatile memory cells. Page pairs also may be referred to as page tuples. In one example, a two-bit non-volatile memory cell is associated with a page pair, in which the MSB is associated with an upper page and the LSB is associated with a lower page. The specific convention used to correlate the MSB/LSB with the upper/lower pages in a particular embodiment does not necessarily limit other conventions that may be used in other embodiments. Thus, the MSB and LSB in the same non-volatile memory cell may have different logical and/or physical addresses in the non-volatile memory device 120.

In one embodiment, writes directed to the upper page of the non-volatile memory cell only change the MSB. This can be achieved by changing the programming state of the non-volatile memory cell from the erase state to the A state (See FIGS. 9C, 11A, 11B, and 12), in which case the values of the CSB and/or LSB are not changed.

Additionally, the write operations may be implemented in one or more stages, and each stage may include one or more incremental voltage level changes (e.g., incremental step pulse programming). For example, changing the state of a non-volatile memory cell from the erase state/L0 to state A/L1 may occur in a single programming phase over multiple incremental voltage level changes, each voltage level change increasing the voltage level of the non-volatile memory cell a fraction of the difference between the erase state/L0 and the A/L1 state. In another example, changing the state of a non-volatile memory cell from the erase state/L0 to the LM state may be performed in a single programming phase over a single voltage level change (with a relatively high programming voltage) or over multiple incremental voltage level changes (each using a relatively low programming voltage).

As one example of a write operation, a storage client 116 (such as a file system software application, operating system application, database management systems software application, a client computer, a client device, or the like) may implement functionality to store data on the non-volatile memory device 120. When the storage client 116 sends the write request with the data to be written, in one embodiment, the program module 204 writes the data exclusively to available pages not masked or restricted by the endurance module 206 (e.g., lower and/or middle pages of memory cells in a reduced level cell mode). Although there may be various ways to write data exclusively to one page or another, in one embodiment, a write operation may be performed by following a page programming order defined by a manufacturer, as described above, but skipping restricted or unavailable pages, writing audit data (e.g., a predefined endurance data pattern) to restricted or unavailable pages, or the like. In this manner, for memory cells in a reduced level cell mode, the data bits can be written exclusively to the pages that are available and unrestricted, while the pages corresponding to restricted, unavailable pages are not used or are programmed with audit data.

Similar to write operations, read operations may be performed in one or more stages, depending on the available functionality of the non-volatile memory device 120 and/or associated memory media 122. In some embodiments, one or more read operations may be performed at read voltage thresholds between different abodes or program states to determine in which abode or program state the read voltage falls. For example, for a MLC memory cell, a first read operation may be performed on a non-volatile memory cell to determine whether the read voltage is between the ERASE/L0 state and the A/L1 state, a second read operation may be performed to distinguish between the A/L1 state and the B/L2 state, and a third read operation may be performed to distinguish between the B/L2 state and the C/L3 state. Once a programming state is identified, both the MSB and LSB may be known, because each programming state corresponds to two (or more) bits. However, when using a MLC or TLC non-volatile memory cell in a SLC reduced level cell mode, it may be sufficient to derive only a single bit (e.g., the LSB, the CSB, the MSB), depending on which is used to designate the SLC value of the non-volatile memory cell.

In certain embodiments, the data bits are read in response to requests for data that has been stored on the non-volatile memory device 120. If an associated region of the non-volatile memory device 120 (e.g., an erase block) is operating in a SLC reduced level mode, a MLC reduced level mode, or the like then the read request may be directed to a lower page, a middle page, or the like as an associated upper page may not be programmed or may be programmed with audit data or another predefined endurance data pattern.

Although writing user data or other workload data exclusively to available, unrestricted pages of memory cells in a restricted level cell mode (e.g., lower and middle pages for an MLC restricted level cell mode, lower pages for an SLC restricted level cell mode) reduces the capacity of the non-volatile memory device 120, in some embodiments the reliability and/or longevity of the non-volatile memory device 120 is increased. For example, memory cells that would otherwise have been retired may continue to be used to store data in a reduced level cell mode. More specifically, writing user/workload data exclusively to one or more lower pages of memory cells in a restricted level cell mode may place less stress on the individual non-volatile memory cells and, thereby, reduce instances of failure in the non-volatile memory device 120. In addition, the manufacturer and consumer may take advantage of the lower cost of the MLC or TLC memory media while getting performance comparable to, or better than, conventional SLC memory media. Furthermore, some embodiments may use mapping logic to handle mapping the pages, and a manufacturer may easily switch between TLC, MLC, and SLC media for the non-volatile memory device 120, or different production runs, without having to make major redesigns each time. Further, because, in certain embodiments, the reduced level cell mode is implemented based on a data encoding, such as a Gray code, that is common to non-volatile memory media 122 of different types, makes, and/or models (e.g., from different manufacturers or vendors), the reduced level cell module 150 and/or associated logic (e.g., a device driver, the SML 130, the controller 124, 126) may be used with little or no modification with the different non-volatile memory media 122, providing a single, substantially universal solution.

Storing data in a subset of the total abodes or program states of certain memory cells may impact the overall functionality of the non-volatile memory device 120. In certain embodiments, the delay experienced in storing data may be decreased and the non-volatile memory cells may exhibit less tendency to have values inadvertently drift or shift due to program or read disturbs or the like. In addition, storing the data in the LSB and/or CSB may cause less wear on the non-volatile memory cells for a particular programming operation, at least for certain types, makes, and/or models of media 122. For example, referring to FIG. 9C, using the LSB to store data may involve only the erase state/L0 and the A/L1 state as valid, available states. Since the A/L1 state uses a lower programming voltage (compared with the B/L2 and C/L3 states), the non-volatile memory cell may experience less wear and/or damage as it is used.

In some embodiments, it may be possible to dynamically switch between TLC, MLC, and/or SLC modes. Additionally, it may be possible to dynamically switch between different SLC modes using the MSB, the CSB, and/or the LSB to store the user/workload data. For example, when the ability of the non-volatile memory device 120 to reliably store data in the upper pages (e.g., MSB pages) is compromised, the endurance module 206 may dynamically reconfigure write and read requests to exclusively store user/workload data in one or more lower pages (e.g., LSB and/or CSB pages), then as the media 122 continues to deteriorate may dynamically reconfigure write and read requests to exclusively store user/workload data in a lower page (e.g., LSB pages), or the like. As described above, depending on the type, make, and/or model, in certain embodiments, this may be done by only programming the available or unrestricted pages, while in other embodiments, audit data such as a predefined endurance pattern may be programmed to unavailable, restricted pages. Unavailable, restricted pages may simply be skipped or ignored in the addressing of the pages.

In one embodiment, the endurance module 206 is configured to increase the endurance and/or longevity of memory cells in a reduced level cell mode, reduce a likelihood of errors for memory cells in a reduced level cell mode, or the like by adjusting the abodes or program states used or available for use to store or encode user/workload data. The endurance module 206, in one embodiment, may be configured to write, or otherwise cause to be programmed (e.g., instruct the non-volatile memory device 120 to program), a predefined endurance data pattern to an unavailable or restricted page (e.g., an upper page) of a set or region of memory cells, such as an erase block, operating in a reduced level cell mode (e.g., in response to an endurance characteristic such as an error rate satisfying a threshold), instead of user/workload data being written to the unavailable or restricted page. An endurance pattern or other predefined data pattern of the endurance module 206, as used herein, comprises one or more data bit values that, by being programmed, are configured or selected to adjust, define, configure, dictate, or otherwise determine which subset of program states or abodes of a set of memory cells are used, available, or valid for storing or encoding user/workload data and/or, conversely, which program states or abodes are masked, unused, unavailable, or invalid for storing user/workload data.

For example, if the trigger module 202 has placed a set of TLC memory cells in a reduced level cell mode, where the lower and middle pages store valid user/workload data, the endurance module 206 may use an operation, such as an XNOR logical equality operation, on the user/workload data for the lower and middle pages, to determine a data pattern (e.g., predefined by the associated operation) that may be programmed to place a restricted or unavailable abode between the valid, available abodes. For example, as can be seen for the data encoding of FIG. 12, if an XNOR operation is performed on the lower page/LSBs and the middle page/CSBs, for each possible value of a LSB and CSB, programming the MSB with the resulting data pattern results in abodes L0, L2, L4, and L6 being available for encoding the valid user/workload data of the lower and middle pages. Therefore, for the Gray code depicted in FIG. 12, programming the upper page with an XNOR data pattern restricts or limits the abodes that are available for storing or encoding user/workload data to L0, L2, L4, and L6, making abodes L1, L3, L5, and L7 unavailable, masked, restricted, unused, and/or invalid.

An XNOR operation may comprise a logical equality operator that results in a binary one or true output if both inputs have the same logical value (e.g., both binary ones, both binary zeroes) and a binary zero or false output if the inputs have different logical values (e.g., a binary one and a binary zero). An XNOR operation may also be referred to as an NXOR operation, since it is the negation or inverse of an XOR operation. In other embodiments, for other data encodings, or the like, the endurance module 206 may use one or more different operations on data for available, unrestricted pages or bits (e.g., lower and middle pages) to determine or dictate which abodes or program states are available to store or encode the data. As described below, in certain embodiments the buffer module 212 may buffer or store data prior to programming the data to a set of memory cells operating in a restricted level cell mode so that the endurance module 206 may perform one or more operations on the data to determine a predefined endurance data pattern.

In certain embodiments, performing a data operation to determine an optimal or near optimal predefined endurance pattern (e.g., predefined in that the operation is known) may substantially evenly distribute available abodes or storage states when programmed to a predefined page of a set of memory cells (e.g., an upper page), with unused or unavailable abodes or storage states between each available one. However, in certain embodiments, in order to avoid buffering data, keeping a history of data, reading previously programmed data, or the like, the endurance module 206 may use a constant endurance data pattern, instead of a variable pattern defined by an operation, balancing simplicity with efficiency. For example, with the data encoding of FIG. 12, the endurance module 206 may use an endurance data pattern consisting exclusively of binary ones, for simplicity, thereby defining abodes L0, L3, L4, and L7 as available for encoding or storing data and masking or restricting abodes L1, L2, L5, and L6.

Figure 12:
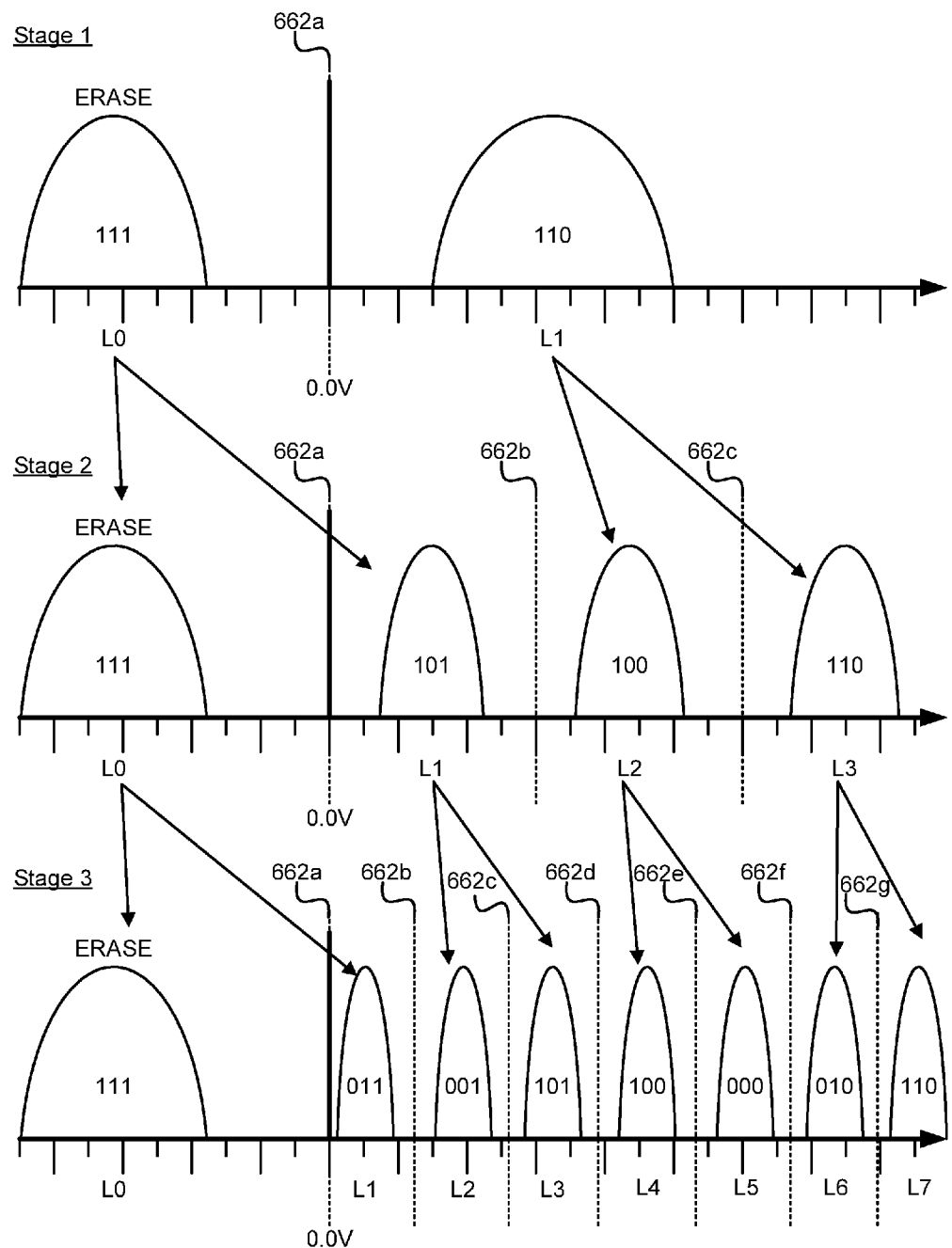
FIG. 12 is a series of graphs illustrating states of an encoding model for triple level cell memory.

An endurance data pattern of all ones, in the Gray code data encoding embodiment of FIG. 12, when programmed, provides a separation distance between abodes L0 and L3 and between L4 and L7, however L3 and L4 remain adjacent. In certain embodiments, programming an endurance data pattern of exclusively ones reduces an error rate, a likelihood of an error, or the like when compared to memory cells that are not in a reduced level cell mode, because of the separation of abodes L0 and L3 and L4 and L7, even though L3 and L4 are adjacent. Other predefined or otherwise known endurance data patterns may also be used, and may be based on a data encoding for the memory cells of the non-volatile memory media 122, to provide a greater separation distance between abodes in a reduced level cell mode.

In certain embodiments, the predefined endurance data pattern may comprise error correction information for the data of the lower page, the middle page, or the like. XNOR data, for example, as described above, may be used as error correction information or redundant parity data, allowing a memory controller 124, 126, the SML 130, or the like to determine which bits are in error upon being read back from the non-volatile memory media 122. In other embodiments, the predefined endurance data pattern or audit data may include a Hamming code, Reed-Solomon code, Bose-Chaudhuri-Hocquenghem (BCH) code, Low-density parity check (LDPC) code, convolutional code, soft-decision algorithm code, belief-propagation code, or other error correcting code (ECC) information for the valid user/workload data stored in the one or more other pages of the memory cells. The error correction information of the endurance data pattern, in one embodiment, may be used as an extra, backup layer of error protection, useful as the non-volatile memory media 122 ages, in addition to an existing layer of error correction information already protecting the user/workload data, allowing a greater number of errors to be corrected, or the like.

In one embodiment, instead of writing or causing a predefined endurance data pattern to be programmed to a set of memory media in a reduced level cell mode, the endurance module 206 may cooperate with the program module 204 to simply skip programming of an unused page, such as an upper, MSB page or the like. For example, with regard to the data encoding of FIG. 12, the endurance module 206 and/or the program module 204 may stop after stage 2, leaving the memory cells in a MSB reduced level cell mode. While this may be effective, in certain embodiments, for certain types, makes, or models of memory media 122 from certain manufacturers, other embodiments of non-volatile memory media 122 may require that all three pages of a set of non-volatile memory cells be programmed.

For example, certain non-volatile memory media 122 may be programmed in a single stage, with eight abodes or the like, being programmed directly to the stage depicted in FIG. 12, or the like. In another embodiment, non-volatile memory media 122 may be programmed in multiple stages, but may include all eight abodes or program states for each stage, simply narrowing or dialing in the abodes with each stage or the like. However, in certain embodiments, regardless of the arrangement of abodes or program states in different stages for different types of memory media 122, the different types or architectures of memory media 122 may have a similar data encoding, such as the Gray code encoding of FIG. 12, allowing the endurance module 206 to provide a reduced level cell mode in substantially the same manner for the different types of memory media 122, using the same predetermined endurance data pattern or the like based on the shared encoding.

The endurance module 206, in one embodiment, as described above, may provide at least a predefined separation distance between the abodes or program states available for valid user/workload data in a reduced level cell mode by determining a predefined endurance data pattern, programming the endurance data pattern to a third/upper page, or the like. In a further embodiment, the endurance module 206 may provide at least a predefined separation distance (e.g., guard band, read window budget) between the abodes or program states available for valid user/workload data in a reduced level cell mode by adjusting or otherwise defining one or more thresholds or boundaries for the abodes, such as a read voltage threshold, a program verify threshold, or the like. As described below, a program verify threshold may be used after a step pulse of a program operation to verify that a memory cell has been programmed to at least the program verify threshold voltage level. For example, the program voltage pulses may continue until at least the program verify threshold has been reached. The read voltage threshold may be set at a lower voltage level than the program verify threshold to provide a guard band or read window budget at the boundary of an abode, to allow for drift or disturbance of the stored voltage.

In one embodiment, the endurance module 206 may adjust boundaries or other thresholds of abodes to merge multiple abodes (e.g., merge TLC abodes into MLC abodes, merge MLC abodes into SLC abodes) for the reduced level cell mode. The endurance module 206 may literally merge or combine abodes or program states, such that the merged abodes comprise a single program state or, in a further embodiment, may merge abodes or program states virtually, interpreting read voltages falling in either merged abode or program state as if it came from a larger merged abode (e.g., for the encoding of FIG. 12, L0 and L1, L2 and L3, L4 and L5, and L6 and L7 may be merged). In certain embodiments, the endurance module 206 may simply move and/or expand abodes L1, L2, and L3 to overlap, cover-up, mask, or replace the unused or unavailable L4, L5, L6, and L7 abodes. In one embodiment, the endurance module 206 may merge or otherwise adjust abodes or program states to provide a reduced level cell mode without using a predefined endurance data pattern (e.g., the endurance module 206 may skip programming the third/upper page).

In a further embodiment, the endurance module 206 may adjust abode thresholds or boundaries to move valid, available, used abodes away from each other. For example, in embodiments where the endurance module 206 programs an endurance data pattern of binary ones to a third page, an upper page, or the like as described above, the endurance module 206 may adjust program verify threshold for the L3 and L4 abodes to separate or move them away from each other (e.g., lower a program verify threshold for L3 and increase a program verify threshold for L4), providing the same or similar benefits of programming an XNOR endurance data pattern without the overhead of buffering data or maintaining a data history. In such embodiments, the endurance module 206 may adjust thresholds and boundaries of abodes and program a predefined endurance data pattern to a third/upper page to provide a reduced level cell mode.

The endurance module 206 may use abode management and/or programming of a predefined endurance data pattern to define or determine which abodes are available for use to store valid user/workload data in a reduced level cell mode and to maximize the separation distances between those abodes. In this manner, the endurance module 206 may mask or restrict at least half of the native TLC mode abodes of a set of memory cells, so that up to half of the abodes of the TLC mode remain available to store valid user/workload data in the reduced level cell mode. If the endurance module 206 reduces the number of available abodes by half (e.g., from eight abodes to four), the capacity of the memory cells will only be reduced by one third. If, at a later time after first providing an MLC reduced level cell mode, the endurance module 206 reduces the number of available abodes by three quarters (e.g., from eight abodes to two) to provide an SLC reduced level cell mode, the capacity of the memory cells will be reduced by two thirds, and the usable lifetime of the memory cells may be extended well beyond their usability in their native TLC mode.

In one embodiment, the endurance module 206 may write the endurance data pattern or cause it to be programmed to a third/upper page of a set of memory cells as a background process, after the first/lower and second/middle pages have already been either buffered or programmed. In this manner, determining and programming the endurance data pattern may cause little or no interruption or disturbance to foreground write traffic, but may be performed periodically, during low-load, low-traffic times, or the like. As described below with regard to the buffer module 212, in certain embodiments, the first/lower page of data and/or the second/middle page of data, in certain embodiments, may be buffered, to satisfy sequential write order requirements, so that they can be programmed together with the endurance data pattern, to interleave programming of pages for different sets of memory cells, to provide persistence of the buffered data in case of a restart event or failure, or the like.

In one embodiment, the endurance module 206 may read at least one audit bit of a memory cell to determine a logic value of the at least one audit bit. The endurance module 206 reads the at least one audit bit in response to an audit triggering event. The audit triggering event comprises one or more of a read count satisfying a read count threshold, a program/erase count satisfying a program/erase count threshold, an error rate satisfying an error rate threshold, a number of detected data errors satisfying an error threshold, a number of detected errors in an ECC block exceeding a number of errors that are correctable using ECC information for the block (e.g., an uncorrectable error), a number of operations satisfying an operation threshold, a time of operation satisfying an age threshold, or the like.

In one embodiment, the endurance module 206 may compare the logic value of an audit bit read by the endurance module 206 with an expected logic value that was programmed into the audit bit by the program module 204 (e.g., an XNOR of the lower and middle pages, or the like). In another embodiment, the endurance module 206 sends an alert in response to determining that the read logic value differs from the programmed logic value. In a further embodiment, the endurance module 206 may correct an error in the user/workload data of the lower and/or middle page based on one or more audit bits read from the upper page.

In this manner, the reduced level cell module 150, in the described embodiments, may increase an endurance of TLC NAND flash or another memory media 122 beyond a normal wear expectancy by discontinuing use of one of the three pages for a set of memory cells when an error rate satisfies an error threshold (e.g., is above an acceptable level) and may continue to use the set of memory cells with only two pages in selected blocks. The non-volatile memory media 122 may appear to be used in its native TLC mode, but with only two valid bits of user/workload data stored per memory cell in the reduced level cell mode (e.g., four valid, used states, four other states used to bias the valid states away from each other).

Figure 2B:
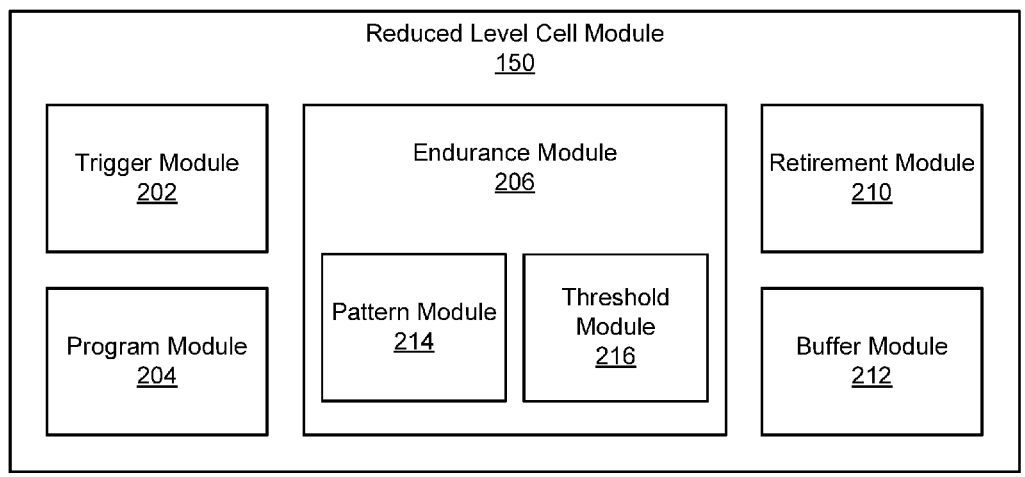
FIG. 2B is a schematic block diagram illustrating another embodiment of a reduced level cell module.

FIG. 2B depicts one embodiment of a reduced level cell module 150. The reduced level cell module 150 may be substantially similar to the reduced level cell module 150 described above with regard to FIG. 1 and/or FIG. 2A. In the depicted embodiment, the reduced level cell module 150 includes the trigger module 202, the program module 204, and the endurance module 206 and further includes a retirement module 210 and a buffer module 212. The endurance module 206, in the depicted embodiment, includes a pattern module 214 and a threshold module 216.

In one embodiment, the retirement module 210 is configured to retire a set of memory cells, such as an erase block, from storing valid user/workload data in response to an error rate satisfying a retirement error threshold or another endurance characteristic satisfying an endurance threshold as described above with regard to the trigger module 202. The retirement module 210, in certain embodiments, retires a set or region of memory cells, such as an erase block, only after it has first operated in one or more reduced level cell modes. For example, the trigger module 202 may initiate a MLC reduced level cell mode for a set of TLC memory cells in response to an endurance characteristic (e.g., an error rate) for the memory cells satisfying an endurance threshold, may initiate a SLC reduced level cell mode for the memory cells in response to an endurance characteristic again satisfying an endurance threshold, and may trigger the retirement module 210 to retire the set of memory cells in response to an endurance characteristic satisfying an endurance threshold in the SLC reduced level cell mode. In other embodiments, the retirement module 210 may retire a set of memory cells directly from a MLC reduced level cell mode, without the memory cells first operating in a SLC reduced level cell mode, or the like.

In one embodiment, the buffer module 212 is configured to buffer or store data to be programmed to a region or set of memory cells of the non-volatile memory media 122. In certain embodiments, the buffer module 212 may store buffered data in volatile memory, such as the volatile memory 112 of the host computing device 110, volatile memory of the non-volatile memory device 120, or the like. The non-volatile memory device 120, in certain embodiments, include a secondary power supply, such as one or more capacitors, batteries, or the like to provide a hold up time during which buffered data may be programmed to the non-volatile memory media 122 in response to an unexpected restart event or failure. A restart event, as used herein, comprises an intentional or unintentional loss of power to at least a portion of the host computing device 110 and/or the non-volatile memory device 120. A restart event may comprise a system reboot, reset, or shutdown event; a power fault, power loss, or power failure event; or another interruption or reduction of power.

In certain embodiments, the buffer module 212 may store buffered data within the non-volatile memory media 122 of the non-volatile memory device 120 itself, such as in one or more different erase blocks configured or partitioned as SLC memory cells, so that the data is persistently stored but so that a sequential programming order does not apply. For example, enough volatile memory may not exist within the non-volatile memory device 120, a hold up time for the non-volatile memory device 120 may not be long enough to program all of the buffered data, or the like and buffering the data in the non-volatile memory media 122 may protect the data from a restart event, so that the data may still be programmed after the restart event from the one or more different erase blocks. For example, to provide greater data throughput, write bandwidth, or the like, the non-volatile memory controller 124, 126 and/or the program module 204 may use an interleaved programming order. For TLC memory cells with three pages or bits per cell, the program module 204 may instruct the non-volatile memory device 120 to program in an interleaved order, such as a lower page of a first set of memory cells, a lower page of a second set of memory cells, a lower page of a third set of memory cells, a middle page of the first set of memory cells, a middle page of the second set of memory cells, a middle page of the third set of memory cells, an upper page of the first set of memory cells, an upper page of the second set of memory cells, and an upper page of the third set of memory cells, or the like. In such an embodiment, the buffer module 212 may buffer several pages at a time.

As described above, in certain embodiments, the endurance module 206 my determine a predefined endurance data pattern for an upper page based on the data for the lower and middle pages. In other embodiments, the non-volatile memory media 122 may require that all three pages of data for a set of memory cells be known before programming any of the pages, or that all three pages be programmed at the same time. If all three pages are not programmed, even the programmed pages may be lost if a restart event occurs. For at least these reasons, in certain embodiments, the buffer module 212 may buffer or store all three pages of data for a set of storage cells. In a further embodiment, to provide interleaving as described above, the buffer module 212 may buffer nine pages, three for each of three different sets of storage cells (e.g., pages or word lines within an erase block, within one or more different erase blocks, or the like).

In embodiments where the endurance module 206 determines an endurance data pattern by performing an operation on user/workload data for one or more lower pages (e.g., a lower page and a middle page), such as an XNOR operation, the buffer module 212 may buffer the user/workload data and the endurance module 206 may perform the operation on the buffered data. The buffer module 212, in certain embodiments, may also buffer the results of the operation (e.g., the resulting endurance data pattern) so that the three associated pages of data may be written simultaneously or may be written according to a prescribed sequential programming order, based on the type, make, and/or model of the non-volatile memory media 122.

In embodiments where the predefined endurance pattern is constant, static, or known, the buffer module 212 may maintain a page of data in a different erase block of the non-volatile memory media 122, such as a page or erase block configured as SLC memory cells, with the predefined endurance pattern. In this manner, the buffer module 212 may stream, transfer, or copy the predefined endurance pattern from the single location to each third/upper page that is written to memory cells operating in a reduced level cell mode, without re-writing or moving the predefined endurance pattern repeatedly. For a predefined endurance pattern of exclusively binary ones, this may be especially convenient, as the buffer module 212 may simply stream a page of binary ones from an unused, erased page or erase block, without separately writing or programming the predefined endurance pattern to buffer it, since NAND flash memory cells may store binary ones in an erased state. In other embodiments, the endurance module 206 may generate a predefined endurance pattern and provide it for programming without the buffer module 212 buffering the data pattern.

In one embodiment, the endurance module 206 is configured to use the pattern module 214 to determine and/or retrieve a predefined endurance data pattern. For example, the pattern module 214 may determine a predefined endurance data pattern based on user/workload data for one or more lower order pages (e.g., a lower page and a middle page) by performing an operation such as an XNOR logical equality operation or the like on the data, may use a constant or fixed predefined endurance data pattern such as binary ones, may determine error correction information for the data, or the like, as described above.

The endurance module 206, in certain embodiments, may use the threshold module 216 to adjust, determine, set, or otherwise manipulate thresholds and/or boundaries for abodes or program states of memory cells in a reduced level cell mode, to separate available abodes, to mask, hide, or restrict unavailable abodes, or the like. As described above with regard to the endurance module 206, in certain embodiments, the endurance module 206 may provide a reduced level cell mode using the pattern module 214 without the threshold module 216. In other embodiments, the endurance module 206 may use the threshold module 216 to provide a reduced level cell mode without the pattern module 214. In a further embodiment, the endurance module 206 may use both the pattern module 214 to determine and program endurance data patterns and the threshold module 216 to adjust thresholds and boundaries of abodes to provide a reduced level cell mode.

As described above, a guard band or read window budget may comprise a range of a data-encoding physical property of a cell, such as a read voltage or the like, which separates states or abodes of the cell (e.g., a separation distance). In certain embodiments, a guard band may be defined as the difference between a level at which a data-encoding physical property of a cell is programmed or verified, and a level at which it is read. As one example, in the four-state Gray-encoded cell described above with states L0, L1, L2, and L3 mapped onto data values "11," "01," "00," and "10," the LSB is the second bit, which experiences a transition between the L1 and L2 states, transitioning from "01" to "00." Accordingly, widening the guard band or separation distance between the L1 and L2 states will further increase the reliability of the LSB. Alternatively, narrowing the guard band or separation distance between the L1 and L2 states may reduce the reliability of the LSB and allow the reliability of the MSB to be increased by widening guard bands between other states.

A read voltage threshold, as described above, is a voltage level that separates discrete values stored in the memory cells of the non-volatile memory media 122. Different non-volatile memory technologies may use different thresholds other than voltages to distinguish between discrete states. Phase change RAM or PRAM, for example, stores data in chalcogenide glass that has different electrical resistivity in different states. For PRAM, the threshold module 216 may determine, set, and/or adjust resistivity thresholds that distinguish between discrete storage states. The endurance module 206 may use the threshold module 216 to adjust, update, change, or otherwise manipulate guard bands, read window budgets, read voltage thresholds, program verify thresholds, resistivity thresholds, or other thresholds, boundaries, and/or positions associated with or affecting separation distances between abodes or program states.

For SLC memory cells that store a single binary value, the read voltage threshold is the boundary between a binary one state and a binary zero state. For example, in one embodiment, a memory cell with a read voltage level above the read voltage threshold stores a binary one while a storage cell with a read voltage level below the read voltage threshold stores a binary zero. Other types of memory cells, such as TLC or MLC memory cells, may have multiple read voltage thresholds, to distinguish between more than two discrete states.

For example, in one embodiment, MLC memory cells that store two bits may have three read voltage thresholds, separating binary values of 11, 01, 00, and 10. The three example read voltage thresholds may be x volts, y volts, and z volts. If the voltage read from a storage cell falls between Vmin and x volts, a binary 11 state is indicated. In certain embodiments, Vmin may be a negative voltage. If the voltage read from a storage cell falls between x volts and y volts, a binary 01 state is indicated. If the voltage read from a storage cell falls between y volts and z volts, a binary 00 state is indicated. If the voltage read from a storage cell falls between z volts and Vmax volts, a binary 10 state is indicated.

The voltages for Vmin, Vmax, x, y, and z may vary based on the manufacturer of the memory cells. Read voltages, for example, may range between −3.5 and 5.8 volts, or between another predefined range of voltages. Similarly, the order of binary state changes 11, 01, 00, and 10 relative to read voltage thresholds may vary based on the encoding type used, such as a Gray code encoding type, a binary code encoding type, or the like. One example encoding type is described below with regard to FIGS. 11B and 12. As described above, although a single MLC memory cell may store multiple bits, bits from a single memory cell may not have adjacent addresses, and may be included in different physical pages, logical pages, or the like. Accordingly, in various embodiments, the threshold module 216 may manage configuration parameters, such as read voltage thresholds or other storage thresholds, at various granularities, such as per abode/program state, per page (logical or physical), per erase block (logical or physical), per set of pages, per ECC chunk/codeword, per word line, per chip, per die, per die plane, or the like.

In certain embodiments, instead of referring to a boundary between discrete values, a read voltage threshold comprises a range of voltages (a maximum and a minimum) that indicate a value. A voltage threshold that is a range can be adjusted by changing the boundary at either end, or at both ends, of the range. The read voltage thresholds or other configuration parameters for the non-volatile memory media 122, in one embodiment, are initially set at a default level that may be defined by a manufacturer. Often such configuration parameter default levels are set to accommodate a large range of general purpose uses of the non-volatile memory media 122. Advantageously, embodiments of the configuration module 352 allow the non-volatile memory media 122 to be used most optimally based on more specific use characteristics. The threshold module 216, in certain embodiments, overrides the default level for one or more configuration parameters, setting the one or more configuration parameters to a different level based on endurance characteristics of the non-volatile memory media 122, to mask or restrict unavailable abodes, or the like. The configuration module 352 may set the configuration parameters to a level that decreases the amount of errors that the non-volatile memory media 122 encounters when compared to the default level, to a level that increases the amount of errors that may be detected and corrected when compared to the default level, to a level that increases the number of input/output operations per second ("IOPS") of the non-volatile memory media 122 when compared to the default level, to a level that increases the usable life of the non-volatile memory media 122 when compared to the default level, to levels that provide a reduced level cell mode for a set of memory cells, and/or that otherwise improves the utility of the non-volatile memory media 122 when compared to the default level.

The read voltage levels of storage cells, and other configuration parameters, can also shift over time, due to leakage and other disturbances of the non-volatile memory media 122. The rate of leakage can also increase with the wear and age of the non-volatile memory media 122. If the read voltage level of a storage cell shifts past the read voltage threshold, a data error occurs, as the value of the data read from the storage cell is different than the value of the data written to the storage cell. The threshold module 216, in one embodiment, adjusts a read voltage threshold or other configuration parameter for one or more memory cells from the non-volatile memory media 122 to compensate for shifts in the read voltage levels of the memory cells by separating available abodes by as much as possible in a reduced level cell mode. By proactively and/or dynamically adjusting read voltage thresholds in a reduced level cell mode, the threshold module 216 may increase the retention rate for and/or the reliability of data stored in the non-volatile memory media 122 and extend the useable lifetime of the non-volatile memory media 122 itself, as described above with regard to the endurance module 206.

Figure 3:
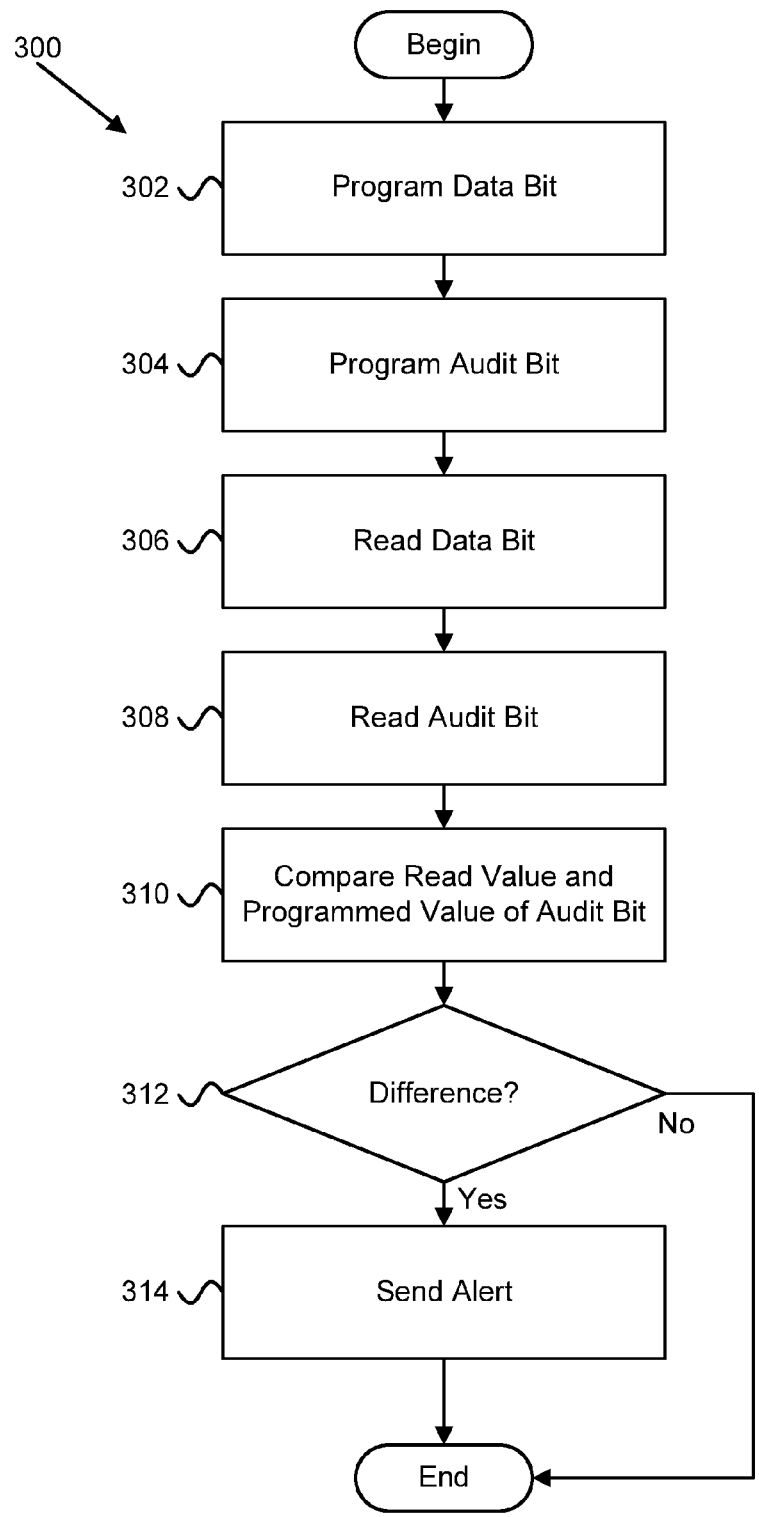
FIG. 3 is a schematic flow chart diagram illustrating one embodiment of a method for a reduced level cell mode.

FIG. 3 is a schematic flow chart diagram illustrating one embodiment of a method 300 for a reduced level cell mode in accordance with the present disclosure. The method 300 begins and the program module 204 programs 302 two or more bits of a memory cell of the non-volatile memory device 120. The program module 204 programs 302 one or more data bits with data and programs 304 at least one audit bit with audit data, such as an endurance data pattern. The audit data comprises a logic value and the data programmed into a data bit comprises a logic value.

The non-volatile memory controller 124 reads 306 at least one data bit within the memory cell. The endurance module 206 reads 308 at least one audit bit of the memory cell to determine a logic value of the at least one audit bit. In one embodiment, the endurance module 206 reads 308 the at least one audit bit in response to an audit triggering event. The endurance module 206 compares 310 the logic value of an audit bit read by the endurance module 206 with a logic value programmed into the audit bit by the program module 204. The endurance module 206 may store an expected value for the audit bit (for example, the logic value that the endurance module 206 should write or a logic value that is set in the audit bit by operation of the media for the memory cells) and use the expected value to determine whether the logic value of the audit bit differs from the logic value of the audit bit as written, or may determine an expected value based on a known operation, such as an XNOR logical equality operation. If the endurance module 206 determines 312 that the logic value of an audit bit read by the endurance module 206 differs from a logic value programmed into the audit bit by the program module 204, the endurance module 206 sends 314 an alert and/or corrects the error, and the method 300 ends. If the endurance module 206 determines 312 that the logic value of an audit bit read by the endurance module 206 does not differ from a logic value programmed into the audit bit by the program module 204, the method 300 ends.

While the specification and claims refers to a first read operation and a second read operation, this is intended only to show that the read operations are separate. It is not intended to show that the first read operation necessarily occurs before the second read operation, or that any requisite temporal relationship exists between the read operations. To the contrary, in certain instances, the second read operation may occur before the first read operation. In certain instances, the first read operation may occur before the second read operation, simultaneous with the second read operation, or the like.

Figure 4:
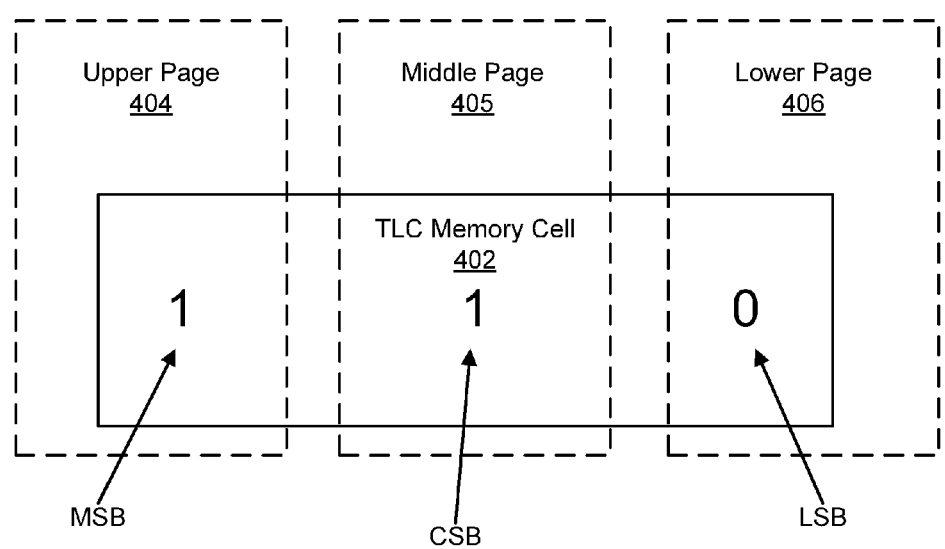
FIG. 4 is a schematic block diagram illustrating one embodiment of a triple level memory cell.

FIG. 4 depicts one representation of a triple level memory cell 402 in a memory device 120. The triple level memory cell 402 is a cell that has $2^n$ possible states, where n is equal to the number of bits per cell. For example, a triple level memory cell 402 such as the one shown in FIG. 4 may store three bits of information, and accordingly have eight possible states or abodes, as discussed in greater detail below. In other embodiments, a memory cell 402 may store two bits of information, and accordingly have eight possible states or abodes; may store four bits of information, and accordingly have thirty-two possible states or abodes; or the like.

The triple level memory cell 402 stores at least a most significant bit (MSB), a central significant bit (CSB), and a least significant bit (LSB). In certain embodiments, as shown in FIG. 4, the MSB, CSB, and the LSB, though part of the same physical triple level memory cell 402, may be assigned to different pages of the media 122. In certain embodiments, a plurality of the triple level memory cells 402 are organized on the non-volatile memory media 122 (such as NAND flash for example) as a page or page tuple. In certain non-volatile memory media 122 comprising a plurality of the triple level memory cells 402 a page is the smallest unit that can be written to the media 122. In such embodiments, the triple level memory cell 402 may be associated with a page tuple, as described above that includes the upper page 404, the middle page 405, and the lower page 406. The upper page 404 is associated with the MSB, the middle page 405 is associated with the CSB, and the lower page 406 is associated with the LSB. In this manner, the upper page 404, the middle page 405, and the lower page 406 may be associated with or stored by the same, common set of memory cells 402 of the non-volatile memory media 122.

Thus, the MSB, the CSB, and the LSB in the same triple level memory cell 402 may have different addresses in the memory device 120. In certain embodiments, the upper page 404 includes the MSBs of a plurality of triple level memory cells 402, the middle page 405 includes the CSBs of a plurality of triple level memory cells 402, and the lower page 406 includes the LSBs of the same triple level memory cells 402. Writes directed to the upper page 404 may therefore cause changes only in the MSBs of the associated triple level memory cells 402, while writes directed to the lower page 406 cause changes only in the LSBs of the associated triple level memory cells 402, and so on for writes to the middle page 405. For triple level memory cells 402 such as NAND flash, writes directed to an upper page 404, a middle page 405, or a lower page 406 may cause changes to only certain of the associated triple level memory cells 402, since an erase operation puts the triple level memory cells 402 in a first logic value state, and the write operation or program operation only changes certain triple level memory cells 402 of a page to the opposite logic value state. Similarly, reads of data stored in the upper page 404 cause reads of the MSBs of multiple triple level memory cells 402, reads of data stored in the middle page 405 cause read of the CSBs of multiple triple level memory cells 402, and reads of data stored in the lower page 406 cause reads of the LSBs of multiple triple level memory cells 402.

In certain embodiments, the triple level memory cell 402 may store two data bits and an audit bit (e.g., a bit from a predefined endurance data pattern). The audit bit may be used as an indicator of the validity of the data bits with which the audit bit shares a triple level memory cell 402, even though the bits are assigned different pages. A data bit is valid if it has retained the value written to it during a previous successful write operation. In one embodiment, the MSB serves as the audit bit and the CSB and LSB serve as the data bits. In certain embodiments, there may be additional bits stored in the triple level memory cells. For example, certain multi-level memory cells may support three or more bits. In such embodiments, the bits that are not the MSB nor the LSB may be apportioned to act as data bits or audit bits depending on the needs of the storage system.

In certain embodiments, the data bits are read in response to requests for data that has been stored on the storage device 120. Such a request may be referenced as a first read operation. In certain embodiments, the first read operation is directed to the lower page 406 such that only the LSB is returned from the triple level memory cell 402. For example, a storage client 116 (e.g., a file system software application, operating system application, database management systems software application, a client computer, a client device, or the like) may store data on a storage device 120. In this example, when the storage client 116 sends a write request, the data is written exclusively to the lower page 406 and/or the middle page 405. As a result, the LSBs and/or the CSBs in the various triple level memory cells 402 are changed, but the MSBs are not changed by the write. Similarly, in this example, when the storage client 116 reads data, the read is directed or addressed to the lower page 406 and/or the middle page 405 and only the LSBs and/or CSBs are read.

Writing user/workload data exclusively to the lower page 406 and/or the middle page 405 may reduce the capacity of the solid state storage media 122, but increase the reliability of the storage device 120. For example, as described below, writing exclusively to the lower page 406 and/or the middle page 405 may place less stress on the individual triple level memory cells 402 and thereby reduce instances of failure in the storage device 120. In addition, the manufacturer and consumer may take advantage of the lower cost of TLC or MLC media while getting performance comparable to SLC media.

The audit bits may be read in response to requests for audit data that are requested by a second read operation that is separate from the first read operation (e.g., a read of the upper page 404). As noted above, in certain embodiments, the standard reads generated by a storage client 116 are for user/workload data, as opposed to audit data of a predefined endurance data pattern. In certain embodiments, the audit data (and the associated pages) are hidden from the storage client 116 such that these pages are transparent to the storage client 116. However, certain processes may generate reads of the audit data in read requests that are separate from the first read operation. Alternatively or in addition, certain processes, operations, or conditions of the storage device 120 (described in more detail below) may trigger reads of the audit data in read requests that are separate from the first read operation.

In certain embodiments, the audit bits of the predefined endurance data pattern are read from the upper page 404 and may be compared to an expected value for the audit bits. The expected value for an audit bit represents the value that the audit bit should have if the data in the triple level memory cell 402 storing the audit bit has not changed from a value set in the audit bit prior to programming/writing the data bit. In certain solid-state storage the audit bit may change by a voltage state for the triple level memory cell drifting above or below a voltage state that the triple level memory cell 402 was programmed or set to. For example, the expected value of an audit bit may be a binary 1 value. Thus, the audit bit for the triple level memory cell 402 is read and compared with the expected value. If the audit bit fails to match the expected value for the audit bit, the storage device 120 may determine that the validity of the data bit in the same triple level memory cell 402 (the LSB in FIG. 4) is suspect. A data bit that matches the value that was written to the bit is valid, while a data bit that does not match the value that was written to the bit is invalid. That the validity of the data bit is suspect means that the data bit may still be valid, but that the triple level memory cell 402 has changed states and therefore the associated data bit may have also flipped and therefore may be invalid. If there is a bit in error in the lower page 406 and/or the middle page 405, then an audit bit associated with that bit in the lower page 406 may not match its expected value, providing a strong indicator that a data bit associated with the audit bit may be in error. As noted above, a data bit is valid if it has retained the value written to it during a successful write or program operation. A data bit is invalid if it has unexpectedly changed value due to a change in the triple level memory cells 402's voltage state due to unexpected charge leakage, unexpected charge retention, or other phenomena known to unintentionally alter the voltage state of a triple level memory cell 402.

As explained above, in certain embodiments, the audit bit is read as part of a second read operation that is separate from the first read operation. The second read operations may be triggered as part of an audit of the validity of the bits in the triple level memory cell 402 (and/or other cells) in the storage device 120. The second read operation may be initiated in response to an audit-triggering event. An audit-triggering event is some event that causes the storage device 120 to read audit bits in triple level memory cells 402. An audit-triggering event may be a read count reaching a read limit. For example, after a certain predetermined number of read operations are executed on the triple level memory cell 402, the storage device 120 may check the audit bit of the triple level memory cell 402 to check the integrity of the data bit. An audit-triggering event may similarly include a program count reaching a program count limit, an error rate reaching an error rate limit, a number of detected data errors reaching an error limit, and a number of operations reaching an operation limit. In certain embodiments, a timer may be used such that when the timer reaches a time limit, data in the triple level memory cells 402 are subjected to an audit. In certain embodiments, the storage device 120 may perform audits when there are free cycles on the storage device 120. For example, when the buses, gate arrays, processors, or the like on the storage device 120 are operating at capacity, the storage device 120 may use the extra capacity to perform audits. When the storage device 120 is operating at its limit (and therefore there are no free cycles) audit operations may be delayed until the more critical operations complete.

In certain embodiments, the audit bit is never read unless there is an audit-triggering event. Such an embodiment may speed operation of the device 120 and reduce the overhead associated with audit operations. In certain embodiments, writing data exclusively to the lower page 406 and/or the middle page 405 and not reading the audit bit unless there is an audit-triggering event results in lower cost TLC or MLC flash media performing at a level substantially the same as more expensive SLC flash media.

In certain embodiments, the storage device 120 may be further configured to read the audit bit along with the one or more data bits as part of a single read operation (e.g., single step or multi-step read operation) in addition to reading the audit bit and the one or more data bits as part of separate read operations. For example, the solid-state storage media vendors may add a new command that allows for two or more bits in a triple level memory cell 402 to be read or written two in a single solid-state storage media read or write instruction, even when the bits of the triple level memory cell 402 are organized into different pages. Such an instruction may be configured to read both the audit bit and the one or more data bits from the triple level memory cell 402 as part of the same read operation. Reading an audit bit as well as data bits may be advantageous when a high degree of assurance that the data in the triple level memory cell 402 is valid is desirable. Such an embodiment would allow the validity of the data to be checked as it is read using the audit bits. In such an embodiment, the audit bit and the one or more data bits may be stored in the same page as opposed to being stored in different pages. In other embodiments, a read operation directed to a page containing a data bit may trigger a corresponding read of the page containing the associated audit bit.

Figure 5:
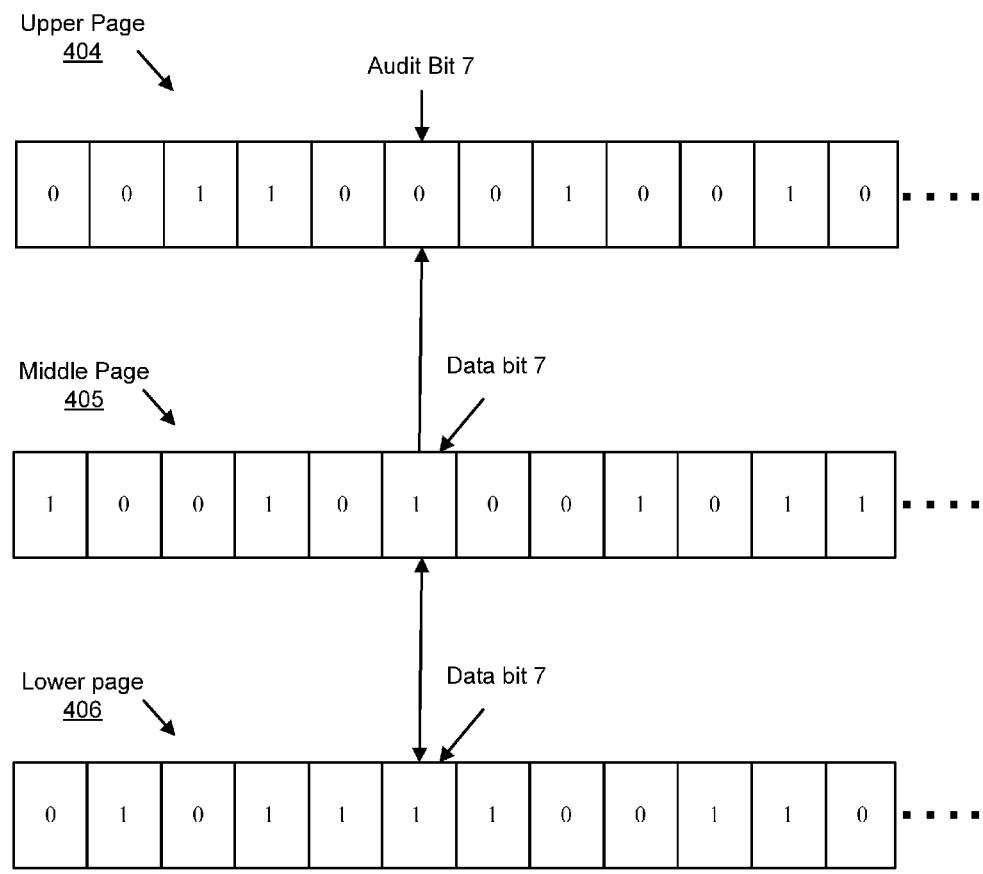
FIG. 5 is a schematic block diagram illustrating one embodiment of an upper page comprising audit data and a middle page and lower page comprising data.

FIG. 5 shows one example of how embodiments of the present disclosure may use an audit process in a memory device 120. FIG. 5 shows 12 bits of an upper page 404, 12 corresponding bits of a middle page 405, and 12 corresponding bits of a lower page 406. The upper page 404, middle page 404, and lower page 406, in many embodiments, are much larger than 12 bits, and embodiments of the disclosure are not limited to 12 bits, however 12 bits are illustrated for simplicity. The upper page 404, middle page 405, and lower page 406 together comprise a page tuple. Each triple level memory cell 402 of the media 122 may represent at least one bit in an upper page 404, at least one corresponding bit in a middle page 405, and at least one corresponding bit in a lower page 406.

In certain embodiments, a storage device 120 uses an error correction code (ECC) to provide increased data reliability of particular "chunks" of data on the storage device solid-state media 122. In such embodiments, the storage device 120 may use the ECC to check the validity of data stored in the lower page 406 and/or the middle page 405. As explained above, the upper pages 404, at least in a reduced level cell mode, may store the audit data of a predefined endurance data pattern. The audit bits may be set to the expected value without an explicit write command to the upper pages 404 as explained in greater detail below, or may be explicitly programmed to the upper pages 404. In certain embodiments, the ECC validation algorithms can only detect a certain number of errors, and correct only a certain number of errors in the data in the lower page 406 and/or the middle page 405. Generally, ECC validation algorithms can detect more bit errors than they can correct. For example, an ECC chunk may be able to correct up to 11 bit errors in a chunk. If more than 11 bit errors are detected, a supplemental error correction process may be initiated.

In one embodiment, audit data of the upper page 404 is used to supplement the error correction process. In one embodiment, if the errors in the ECC chunk (e.g., of the lower page 406, the middle page 405, or the like) exceed the number of errors that can be corrected by the ECC algorithm, an audit-triggering event is initiated.

In response, the storage device 120 may trigger reads of the audit bits in the upper page 404 to determine if any audit bits fail to match the expected value. For example, in FIG. 5, the expected value for the audit bits may be an XNOR of the corresponding bits of the lower page 406 and the middle page 405, and the endurance module 206 and/or the storage device 120 may determine that bit 7 of the upper page 404 fails to match the expected XNOR value of "1," while the rest of the audit bits have the expected XNOR values. As noted above, in certain embodiments, the audit bit 7 is stored in the same physical triple level memory cell 402 as data bit 7 even though they belong to different pages. Consequently, changes in the value of the data bit due to voltage leakage, voltage increase due to read or write disturbs from neighboring memory cells, and the like that affect the data bits 7 of the triple level memory cell 402 may also affect the audit bit 7. The storage device 120 may make an assumption that the error in the lower page 406 or the middle page 405 is at the bit 7 position, since the audit bit in the upper page 404 associated with the bit 7 position is also in error. While such an assumption is not guaranteed to be correct, the identification of bit 7 as a suspect data bit provides initial information that can be used in supplemental error correction processes to minimize supplemental error correction overhead. Furthermore, information identifying a single bit as having a very high likelihood of being in error may also be combined with information about physically neighboring triple level memory cells 402 that may also indicate suspect data bit values.

A variety of supplemental error correction processes may be used, including parity substitution, changing the suspect data bit to its opposite binary value, and the like. For example, one approach involves reading data from an array of memory devices along with parity information for the data. An ECC module determines if errors exist and are correctable using the ECC. An isolation module replaces data read from a bad memory device with data generated from the parity data to replace the bad data. In certain embodiments, the storage device 120 may respond to identifying a suspect data bit by flipping the data bit in the triple level memory cell 402 if the associated audit bit does not match the expected value, and thereafter rechecking the ECC chunk. To continue the example in FIG. 5, the storage device may flip the value of bit 7 in the lower page 406 from a 1 to a 0, and then check the lower page 406 again using the ECC algorithm to determine whether the number of bit errors in the lower page 406 has been reduced to a correctable number, and/or perform the same process for bit 7 of the middle page 405.

Figure 6:
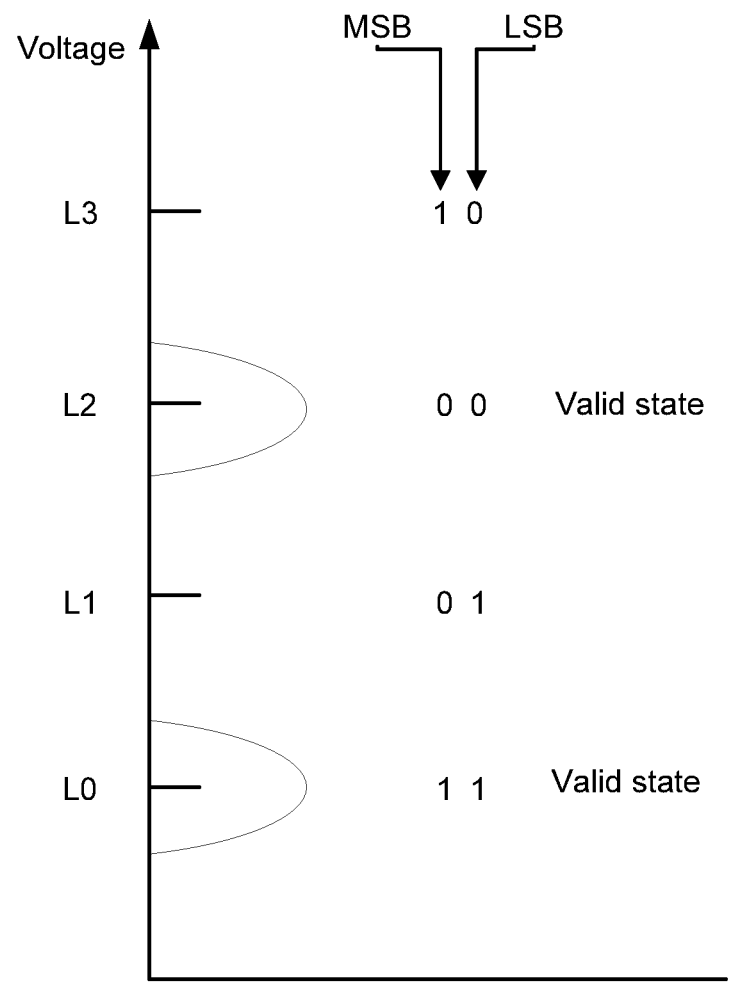
FIG. 6 is a schematic block diagram illustrating one embodiment of voltage levels in a multi-level memory cell and an associated programming model.

FIG. 6 shows one embodiment of a programming model for a multi-level memory cell. While FIG. 6 depicts an encoding or programming model for an MLC memory cell capable of storing two bits encoded by four states or abodes, the description is equally applicable to a TLC memory cell capable of storing three bits encoded by eight states or abodes, both of which may operate in a reduced level cell mode. Certain aspects of the foregoing discussion may be applicable only to those multi-level memory cells having the represented programming model. Other aspects are generally applicable. Any limitations inherent in the represented programming model do not necessarily apply to all other programming models, and the present disclosure should not be construed as inherently containing any such limitations.

FIG. 6 shows that the value "11" is associated with the lowest voltage state (labeled L0), the value "00" is associated with the highest voltage state (labeled L3), and "10" and "01" are associated with intermediate states L2 and L1 respectively. The storage device 120 interprets the four discrete levels of voltage stored in the multi-level memory cell as representing two binary bits, a most significant bit and a least significant bit. As explained above, other programming models may be used. Also, certain storage devices 120 may have more than four possible states, allowing more than two binary values to be stored in a single triple level memory cell 402 or the like. The voltage levels L0, L1, L2, and L3 may or may not be contiguous; for example, in certain embodiments, the voltage levels are separated by band gaps (e.g., separation distances) known as guard band or read window budget. For example, L0 and L1 may be separated by 0.3V. In certain embodiments, unused, invalid, or unavailable abodes or program states may be used to increase the separation distances or guard band in a reduced level cell mode as shown in FIG. 6.

In one embodiment, the LSB corresponds to the lower page 406 and the MSB corresponds to the upper page 404. In certain embodiments, if a memory cell is in a reduced level cell mode, user/workload data sent to the storage device 120 to be stored thereon is only stored in the LSB, and the MSB is used as an audit bit of a predefined endurance data pattern to ensure the integrity of the data stored in the LSB, provide a greater separation distance between abodes available to store or encode data of the LSB, or the like. In certain embodiments, the expected value for the audit bit is a binary "1." In such an embodiment, the valid states available to store or encode user/workload data for the multi-level memory cell are at L0 (when the data bit should store a 1) and L2 (when the data bit should store a 0). In certain embodiments, the expected value for the audit bit is selected to be the binary value that the audit bit will be given after the multi-level memory cell has been erased and is ready for programming. For example, all bits in the multi-level memory cell may be set to binary 1 after they are erased. In such embodiments, the audit bit may be therefore expected to be a 1, and writes to the data bit are executed such that the audit bit value does not change from 1. To again reference FIG. 6, L0 and L2 correspond to such states. In other embodiments, for certain TLC memory cells or the like, the audit bits of the predefined endurance data pattern may be explicitly programmed, even if the data pattern consists of a pattern of all binary ones.

For example, in FIG. 6, the multi-level memory cell may be placed in L0 (e.g., an erased state) after an erase operation. L0 is thus the valid state when the data bit contains a 1. If the data bit is changed to a 0, the program operation changes the state from L0 to L2, which changes the value of the data (assuming the LSB is the data bit) but does not change the value of the audit bit (assuming the MSB is the audit bit). In certain embodiments, discussed below, the multi-level memory cell may adhere to a two-phase programming model, which requires that the LSB be written to before the MSB can be written. In such a two-phase programming model, choosing to write data only to the LSB as in embodiments of the present disclosure means that the individual multi-level memory cells could not move into state L1. Even if both the LSB and MSB pages are written to in the sequence consistent with the two-phase programming model the states would progress from L0 to L2 to L3 and then back to L0 when the erase block for these pages is erased.

In certain embodiments, as shown in FIG. 6, certain states or abodes are not used to store data; rather, they are unused or unavailable and thereby provide additional guard band or separation distance to enhance data retention for the other, available states. For example, in FIG. 6, L0 is a valid, available state and L2 is a valid, available state for encoding or storing valid, user/workload data. As discussed above, in certain embodiments, the valid states for the device 120 may be L0 and L1. Many solid-state storage devices cannot thereafter intentionally go from L2 to L1 directly. In order to go from L2 to L1, the multi-level memory cell (and other multi-level memory cells in the same erase block) would be erased and returned to L0, at which point the multi-level memory cell could transition from L0 to L1. By transitioning from L0 to L2, state L1 can be considered unavailable and used as additional guard band, increasing the separation distance between valid abodes (e.g., the distance between L0 and L2 is greater than the distance between L0 and L1). This may be in addition to guard band already built into the storage device 120; for example, there may be a 0.3V separation between L1 and L0 which acts as a guard band between those two states.

In certain embodiments, the valid, available states are selected such that all valid, available states are less than the highest supported state in the multi-level memory cell. Such a configuration may be useful in extending the life of the storage device 120 by reducing the stress placed on the individual multi-level memory cells that occurs when the cells are pushed to the maximum supported voltage level. Such an embodiment may further reduce the risk of overshooting the maximum supported voltage level and damaging the multi-level memory cell.

The guard bands or separation distances represent a difference in voltage levels that protect the data bit from drift caused by leakage or disturbances described above. A larger guard band may facilitate better data retention by allowing more drift without altering the binary state of the data bit stored in the cell. In the example shown in FIG. 6, if the multi-level memory cell has been programmed to the L0 level, and the voltage in the multi-level memory cell unintentionally drifts up into the L1 level, the data bit (represented in the LSB) will not register as an error, or as invalid (since it remains at a 1). Thus, reads of the lower page 406 will not return an error at the bit associated with this particular multi-level memory cell.

However, the audit bit for L1 has changed from a 1 to a 0 and does not meet the expected value of 1. Thus, audits that check the validity of the audit bit will detect the error in the audit bit. In certain embodiments, the storage device 120 may tally the number of times that an audit bit fails to match its expected value. After a certain number of times, the storage device 120 may deem the particular multi-level memory cell to be unreliable for continued use. The number of times the audit bit fails to match the expected value may be an element of a reliability algorithm to determine the reliability of the multi-level memory cell that takes into account numerous other factors. In certain embodiments, reliability is determined on a larger scale, such as on an erase block scale. Thus, the failure of a particular multi-level memory cell to have an audit bit that matches its expected value may contribute to metrics determining the reliability of the erase block to which the multi-level memory cell belongs. The failure may further contribute to metrics determining the reliability of the storage device 120 as a whole.

If the multi-level memory cell is deemed unreliable, multi-level memory cell may be marked as such. Alternatively, the storage device 120 may take the multi-level memory cell out of service by adjusting an address mapping to make the multi-level memory cell un-addressable. In response to determining that the multi-level memory cell is unreliable, the storage device 120 may retire the multi-level memory cell, configure the multi-level memory cell to store only a single bit, or take other action that may be appropriate. Such action may occur on a larger scale than a single multi-level memory cell; for example, retirement and reconfiguration or remapping may occur at the erase block level, or the like.

If the state of the multi-level memory cell is set to L2, and the voltage drifts down to the L1 level, the LSB will have changed values. Thus, in certain embodiments, the storage device may detect the error in the LSB during a read of the data of the lower page 406 (for example due to an ECC validation check). If the voltage drifts up from L2 to L3, the drift may be detected during an audit, but the data in the LSB (which remains a 0) remains unchanged and valid.

As noted above, if a drift occurs which causes a change in the data bit, the error is detected using ECC algorithm as part of a read process for the data. However, the storage device 120 may not be able to detect which particular bits are in error. For example, when the number of errors exceeds 11 bits in a code word, the ECC may not be powerful enough to identify the bit error locations. Since the upper page 404 holds the expected value in each bit, the upper page 404 can serve as a mask or indicator of potentially invalid bits of the lower page 406. For example, by scanning for 0 values in the upper page 404, the storage device 120 may determine which bits are likely in error. Even if the audit bits do not indicate with complete certainty which data bits are in error, by indicating which data bits are likely in error, the storage device 120 can go through an iterative process of flipping suspect data bits and checking to see if the flips correct the problem.

In certain embodiments using the ECC approach described above, the isolation module may use the audit bits to determine which data bits are of suspect validity. In certain embodiments, this information may be provided to the isolation module. In response, the isolation module may start the correction and replacement process at the suspect data bits as opposed to iteratively moving through the entire die. Such an approach may significantly improve the speed with which the isolation module corrects the data.

In certain embodiments, the storage device 120 may reconfigure a multi-level memory cell to store only a single bit when the multi-level memory cell loses its ability to accurately store and differentiate between all of the levels that the multi-level memory cell was originally designed to support (e.g., initiate a reduced level cell mode). For example, the storage device 120 may be configured to use the multi-level memory cells to store only a single bit (as described below) once the number of times the audit bit does not match the expected value exceeds a threshold amount. In one embodiment, the storage device 120 may configure the device to store a 1 at level L0, and a 0 at L3. In such a configuration, the storage device 120 may interpret data stored at either L3 or L2 as a 0, and data stored at either L0 or L1 to be a 1. In this manner, the life of the storage device 120 may be extended. In addition, this may improve data retention due to an increase in the guard band (e.g., separation distance) between the two valid, available states. In certain embodiments of such a configuration, only one of the two bits is given any value. For example, in FIG. 6, only the LSB may be read or written. The MSB (and the associated pages) may be retired and unused.

In certain embodiments, the LSB and MSB are programmed separately by the storage device 120. Such an approach may be taken due to vendor requirements for page pairing (i.e., a LSB bit of MLC cell is paired with an MSB bit of a different MLC cell) and page addressing (i.e., LSB page must be programmed before the MSB page). In certain instances, the LSB must be written before the MSB is written. In such embodiments, the delay associated with writing an audit bit to the MSB is at least five times greater than the delay associated with writing data to the LSB. In such instances, embodiments of the present disclosure may write data exclusively to the LSB. Such embodiments may write no data to the audit bit in the MSB. Instead, such embodiments may rely on the fact that the media hardware controller 126 sets the expected value automatically as part of the preparation of the media 122 for data storage (e.g., certain solid-state storage devices such as NAND flash must be erased before they can be programmed).

In certain embodiments, the storage device 120 may employ a two-phase programming model. In such a model, a logical value is first written to the LSB by way of a first write command to the lower page 406. The write command causes the multi-level memory cell to move from its initial state (for example, 11) to the state which changes the value of the LSB without changing the value of the MSB. For example, writing a "0" to the lower page 406 causes the multi-level memory cell to change from the L0 state (where both the LSB and the MSB are 1) to the L2 state (where the LSB is changed to a 0, but the MSB remains a 1). A subsequent write of a "0" to the upper page 404 is needed to move the multi-level memory cell from the L2 state to the L3 state. Thus, in such an embodiment, two writes (one to the lower page 406 and one to the upper page 404) are needed to move the memory cell from L0 to L3. In addition, certain solid-state media vendors may impose a requirement that the lower page 406 must be written to before the upper page 404.

In such an embodiment, the storage device 120 may increase the guard band or separation distance between two states in the level memory cell by executing a first program phase to put the memory cell into an intermediate state, followed by a second program phase to put the cell into a final state. For example, as noted above, to increase the guard band or separation distance, the storage device 120 may be configured to act as a single-level memory cell with a 1 stored at L0 and a 0 stored at L3. In such an embodiment, either the MSB or LSB may be used as the data bit depending on the programming model. However, the cell will store only a single bit of valid user/workload information. For example, in FIG. 6, the LSB may be the best candidate for the data bit since the voltage can drift from L3 to L2 without a change in the LSB value, and the voltage can drift up from L0 to L1 without a change in the LSB value. In such embodiments, the MSB, while theoretically still addressable and retrievable, may be deemed too unreliable to be used for any purpose and simply left unused, to store a predefined endurance data pattern or the like.

The storage device 120 may receive a write that requires that a 0 be written to the MSB of the multi-level memory cell, requiring that the multi-level memory cell change from a L0 to L3. The storage device 120 may receive the write request, which may be directed to the upper page 404, and cause two write requests to execute: a first write request directed to the lower page 406 which moves the multi-level memory cell from L0 to L2 (L2 acts as the intermediate state in this example); and a second write request directed to the upper page 404 which changes the multi-level memory cell from the L2 intermediate state to L3, the final state. These operations may be hidden from a storage client 116 requesting the write operation, and thus the process and associated complexity is handled transparently in one such embodiment.

In certain embodiments, the states for the lower pages 406 are selected such that a write to the lower page 406 sets both the data bit and the expected value of the audit bit (in the upper page 404) without requiring a separate write to the upper page 404. For example, in FIG. 6, the two valid states are selected such that the value of the audit bit is always 1, unless there is undesired drift between states. As a result, the audit bit may be set to match the expected audit bit value without requiring a separate write to the upper page 404 containing the audit bit.

In certain embodiments, it may be desirable to store data in the MSB and audit data in the LSB. In certain embodiments, the delay experienced in storing data in the MSB may be greater, but the multi-level memory cell may exhibit less tendency to have values in the MSB inadvertently shift. In addition, storing the data in the MSB may cause less wear on the multi-level memory cell for a programming operation. For example, in FIG. 6, using the MSB to store data may involve only L0 and L1 as valid states. Since L1 is a lower voltage, the multi-level memory cell may experience less wear and/or damage as it is used. When the ability of the storage device to reliably store data in the lower pages 406 is compromised, the storage device 120 may dynamically reconfigure write and read requests to store data in the MSB (and associated upper pages 404) and rely on the inherent expected value (e.g., binary one) in the audit data of the LSB (and associated lower pages 406) to accommodate identification and correction of any future data bit errors.

FIG. 7 shows one embodiment of a system for storing information in a storage device 120 that includes one or more triple level memory cells 402. In one embodiment, the system includes a driver 702, mapping logic module 704, hardware controller 706, and non-volatile memory media 122. In certain embodiments, these components are part of the storage device 120.

In one embodiment, the driver 702 receives write requests and read requests from one or more clients 116 directed at the non-volatile memory media 122. The requests typically include an address component, such as a page address, a logical block address, a filename and an offset, or the like. In certain embodiments, neither the upper pages 404, nor the middle pages 405, nor the lower pages 406 are exposed to the storage client 116. Instead, the driver 702 presents a set of logically contiguous block addresses, cluster identifiers, file identifiers, or object identifiers (referred to herein as logical block addresses) to the storage client 116. The capacity presented to the storage client 116, in a reduced level cell mode, may be two-thirds of the actual physical storage capacity of the storage device 120 in a MLC reduced level cell mode for TLC memory media 122, may be one-half of the actual physical storage capacity of the storage device 120 in a SLC reduced level cell mode for MLC memory media 122, may be one-third of the actual physical storage capacity of the storage device 120 in a SLC reduced level cell mode for TLC memory media 122, or the like, assuming the entire storage device 120 has been placed in a reduced level cell mode. The driver 702 may convert the logical block address to one or more physical media page addresses. The driver 702 receives client requests, and passes the request and one or more physical media page addresses to the mapping logic 704.

The mapping logic module 704 may be software, hardware, or a combination thereof. In one embodiment, the physical media page addresses are contiguous and the mapping logic maps the physical media page addresses to an appropriate lower page 406, middle page 405, or upper page 404 based on the current operation mode of the storage device 120 and the wear condition of the triple level memory cells 402 of the storage device 120. In another embodiment, the driver 702 maps the logical block address directly to the appropriate address for the physical lower page 406.

The mapping logic module 704 may be software, hardware, or a combination thereof. In one embodiment, the mapping logic module 704 maps the physical page address to a page tuple of the storage device 120. As explained above, the page tuple may include a lower page 406 that is associated with the LSBs of the triple level memory cells 402 in the non-volatile memory media 122, a middle page 405 that is associated with the CSBs of the triple level memory cell 402, and an upper page 404 that is associated with the MSBs of the triple level memory cells 402. The mapping logic module 704 further sets the physical address for storing data associated with the write command received from the storage client 116 to the lower pages 406 and/or the middle pages 405 of the page tuples affected by the write command in the reduced level cell mode. The upper pages 404 for each lower page 406 and/or middle page 405 may remain unchanged. Consequently, because the solid-state media 122 must be erased prior to being programmed or written to the upper pages 404 for each corresponding lower page 406 and/or middle page 405 in use may in turn be used for audit data (e.g., holding the expected value).

For example, in one embodiment, the driver 702 may receive a request that data be written to LBAs one through three on the storage device 120. The driver 702 converts the LBA identifiers to contiguous pages one through three. The mapping logic module 704 may receive that converted request and determine that page one is a lower page 406 that can store data, that page two is a middle page 405 that can store data, and that page three is an upper page 404 that stores audit data and is not used for writing data. In response, due to page pairing, the mapping logic module 704 may remap the write request such that the data is written to lower page one, middle page two, and lower page four. Upper pages three and six may hold audit data for lower page one, middle page two, and lower page four. For example, pages one, two, and three may be a page tuple, pages four, five, and six a page tuple, or the like.

In this embodiment, the write requests are mapped appropriately to ensure that data is written only to the lower pages 406 and middle pages 405, and the mapping is hidden from the storage client 116 and, in certain embodiments, from the driver 702 as well. Appropriate updates are made to indexes to ensure that reads and other requests for the user/workload data from clients 116 are routed to the correct physical addresses and/or offsets where that data is stored.

The hardware controller 706 receives the remapped write and/or read requests from the mapping logic module 704 and executes them such that the data is stored on the non-volatile memory media 122 as directed by the instructions given by the mapping logic module 704. The hardware controller 706 may be hardware, firmware, software, or a combination thereof. In certain embodiments, the hardware controller 706 may comprise a field programmable gate array (FPGA), a processor, or an application specific integrated circuit (ASIC).

Figure 8:
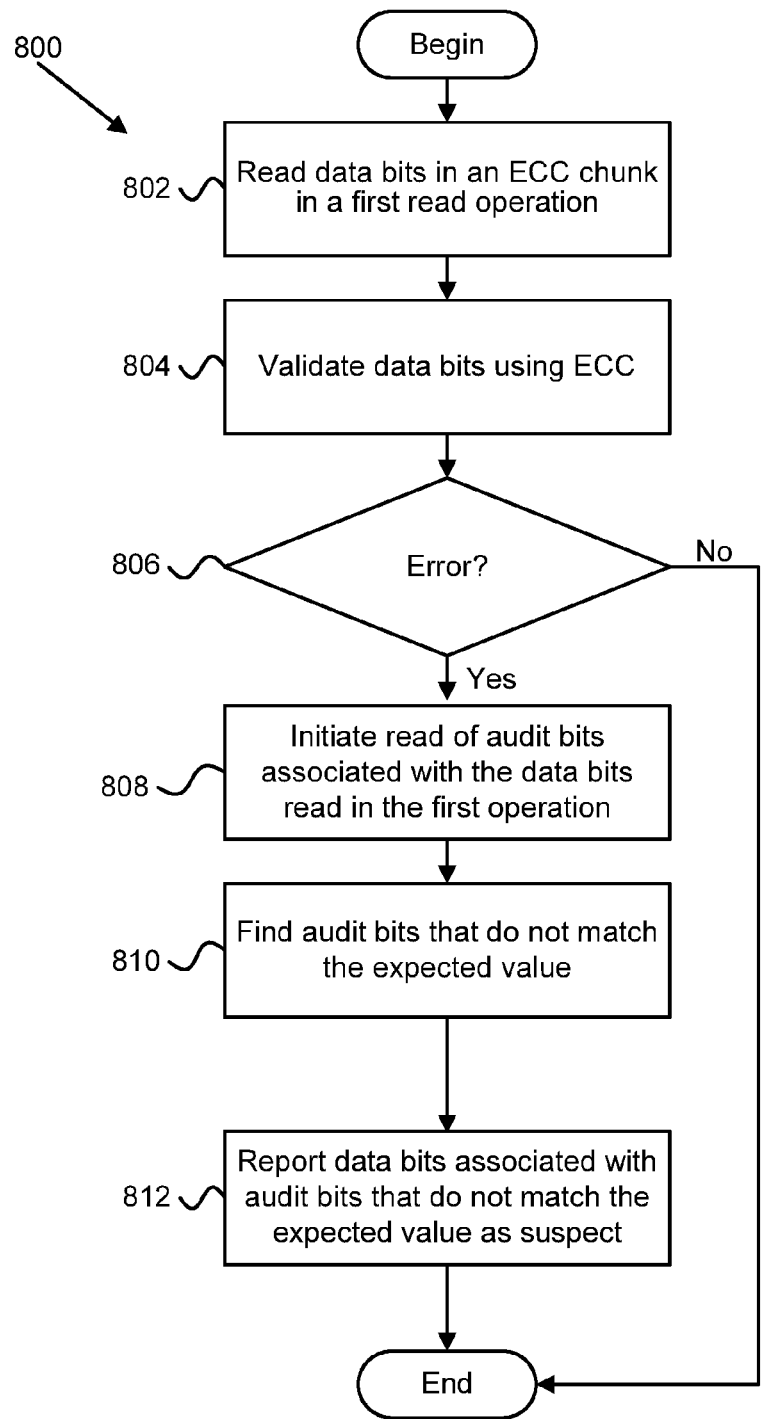
FIG. 8 is a schematic flow chart diagram illustrating one embodiment of a method for using audit data to perform error checking.

FIG. 8 shows one embodiment of a method for using audit bits in upper pages 404 to facilitate correcting errors in the data bits in lower pages 406. The method steps do not need to occur in the order shown. The method 800 begins with reading 802 data bits in an ECC chunk in a first read operation. As described above, the ECC chunk may be stored in the lower pages of page pairs in the storage device 120. The method may also include validating 804 the data bits using the ECC. If there is no error detected 806, or if the number of errors can be corrected using the ECC, the method 300 ends and the data is returned to the requesting entity.

If there is an error that cannot be corrected using the ECC, the method includes initiating 808 a second read of audit bits that are associated with the data bits that were read in the first read operation. In one embodiment, these audit bits are those that are stored in the upper pages 404 of the page pair. Because the audit bits of the upper pages 404 share the same physical triple level memory cell as the lower pages, changes to the data bits in the lower pages are also reflected in the audit bits of the upper pages 404. The method then finds 310 those audit bits that do not match the expected values for the audit bits, and reporting 812 the data bits that are associated with audit bits that do not match the expected value as having suspect validity.

In response, the method 800 may further include flipping the data bits that have suspect validity and rechecking the data bits using the ECC chunk. The method 800 may also include indicating that the reliability of one or more of the triple level memory cells 402 that make up the ECC chunk is suspect.

While many embodiments are described herein, at least some of the described embodiments implement a single-level cell (SLC) mode within a multi-level cell (MLC) memory device. The SLC mode restricts the number of programming states to which each non-volatile memory cell may be programmed. In a specific embodiment, the SLC mode restricts each non-volatile memory cell to be programmed in either an erase state or a state which is closest to a natural threshold voltage of the non-volatile memory cell.

Figure 9A:
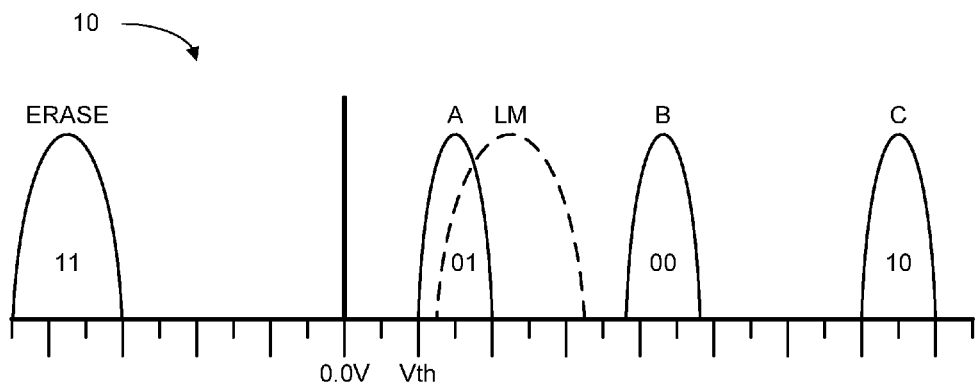
FIG. 9A is a graphical diagram of voltage distributions which constitute different programming states of a programming model.

FIG. 9A illustrates a graphical diagram 10 of various programming states of a programming or encoding model that may be used in conjunction with a MLC mode. Each programming state includes a range of voltages, which correspond to the horizontal axis. The vertical axis corresponds to zero volts. Voltages to the left are negative voltages, and voltages to the right are positive voltages. Other conventions may be used to designate the voltages.

The natural threshold voltage, Vth, of the memory element is also identified. The natural threshold voltage of the memory element refers to a specific or approximate voltage level of the floating gate within the memory element. The natural threshold voltage is the voltage read from a newly manufactured memory element prior to executing an initial erase operation or write operation on the memory element. In this newly manufactured state there are no electrons on the floating gate of the memory element besides those that naturally exist in the floating gate material. In some embodiments, the natural threshold voltage is about 0.5V and can range between about 0.1V and about 0.6V, although other embodiments may have a different natural threshold voltage. The natural threshold voltage generally correlates with a value approximately at which an inversion layer is formed in the substrate of the memory element. For example, if the natural threshold voltage is about 0.5V, then the inversion layer may be formed having a gate bias of at 0.6V or higher voltages.

The programming states include four designated programming states ERASE (e.g., L0), A (e.g., L1), B (e.g., L2), and C (e.g., L3), (shown with solid lines) and one intermediate state, LM, (shown with dashed lines). The solid lines represent a statistical distribution of voltages for a set of cells of a given state once a programming operation is completed. Solid lines for ERASE, A, B, and C states represent the possible states cells can take on when multiple bits of a MLC cell are programmed. In the illustrated example, the statistical distribution of voltages corresponding to the ERASE state spans from about −2.25V to about −1.5V. The statistical distribution of voltages corresponding to each of the other programming states span a range of about 0.5V-state A spans from about 0.5V to about 1.0V; state B spans from about 1.85V to about 2.35V; and state C spans from about 3.5V to about 4.0V. In other embodiments, the spans may be different and may start or end at different voltages.

The intermediate state also may be referred to as the low to middle (LM) state because it is between the state A and the state B. In the illustrated embodiment, the intermediate LM state spans from about 0.7V to about 1.6V, although other embodiments may use other statistical distribution of voltages for the intermediate LM state.

The term "designated programming states" is used herein to refer to the group of all states which are available for programming based on a manufacturer's design and implementation. For example, FIG. 9A includes at least four designated programming states or abodes (ERASE, A, B, and C), each of which is operational to maintain a programming state corresponding to a value for a bit (or values for multiple bits) of data. For TLC memory cells, eight designated programming states or abodes may be available. In some embodiments, an LM state serves as a fifth designated programming state, for maintaining a programming state corresponding to one or more bit values.

In the illustrated embodiment, the designated programming states ERASE and A-C represent bit combinations 11, 01, 00, and 10 (from the lowest voltage range to the highest voltage range). In this convention, the left bit is the most significant bit (MSB), and the right bit is the least significant bit (LSB). The intermediate state is designated as 10 in the intermediate LM state to indicate that the LSB is set to zero, but the MSB is not yet set to a specific bit value.

In operation, the designated programming state that represents the bit combination 11 is also designated as the erase state. When the non-volatile memory cells are erased, by default each non-volatile memory cell is returned to the erase state, which represents the bit combination 11. In order to program the non-volatile memory cell, the non-volatile memory cell is either left in the default erase state (to represent a logical 0) or programmed to the intermediate LM state (to represent a logical 1).

Once the LSB is programmed, then the MSB may be programmed. If the LSB is 1 and the MSB is supposed to be 1, then the non-volatile memory cell is maintained in the erase state, because the erase state corresponds to the bit combination 11. If the LSB is 1 and the MSB is supposed to be 0, then the non-volatile memory cell is programmed to the state A corresponding to 01. If the LSB is programmed to 0, and the MSB is supposed to be 0, then the non-volatile memory cell is programmed to the state B corresponding to 00. If the LSB is programmed to 0, and the MSB is supposed to be 1, then the non-volatile memory cell is programmed to the state C corresponding to 10. This is just one example of bit combinations that may be assigned to the various programming states, according to a Gray code programming model or encoding. Other embodiments may use other bit combinations assigned to the various programming states.

The non-volatile memory cell is programmed in two or more phases. Programming the LSB is a first phase that places the non-volatile memory cell in the erase state or the LM state. If all the pages of the non-volatile memory cell are programmed using the multi-phase programming model, then certain cells may be programmed to transition from the LM state to either state B or state C, other cells may be programmed to transition from the erase state to state A, depending on the values that are programmed. This may be referred to as two-phase programming, because the programming is performed to the intermediate LM state in a first phase and then programmed to one of the states B or C in a second phase.

The intermediate LM state is used to program pages of the non-volatile memory cell that use the LSB. Using an intermediate LM state allows pages using the LSB to be programmed while pages that use the MSB are not programmed and allows the state of a cell to take one of the states Erase, A, B, or C when two or more pages that include the cell are programmed. In contrast, if pages for the MSB of the non-volatile memory cell are programmed then only states Erase and state A are used, as a result the intermediate LM state is not used.

Figure 9B:
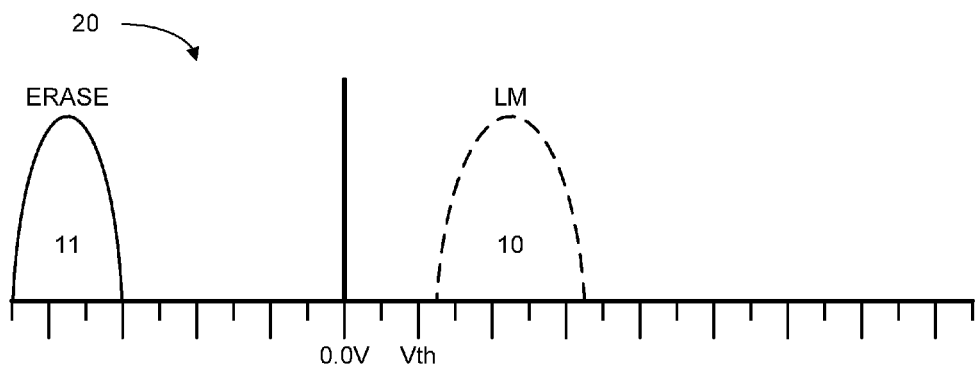
FIG. 9B is a graphical diagram of programming states of one embodiment of a programming model.

FIG. 9B illustrates a graphical diagram 20 of programming states of one embodiment of a programming model which uses the LSB for the SLC mode. In this programming model, the value of the MSB may be irrelevant. The non-volatile memory cell may be programmed to the erase state to represent a bit value of 1, or to the intermediate LM state or either of the states B or C above (i.e., to the right of) the intermediate LM state to represent a bit value of 0. Since the programming model illustrated in FIG. 9B only uses a subset of the designated programming states for representing bit values, these programming states are referred to herein as "restricted programming states." In general, restricted programming states include some, but not all, (i.e., an exclusive subset) of the designated programming states. In contrast, in this embodiment, the A, B, and C states of FIG. 9A are not used for any bit value representations, so the A, B and C states are not designated as restricted programming states.

Referring back to FIG. 9A, in one embodiment, the restricted programming states comprise states ERASE and C. Such an embodiment may be advantageous where the storage media is a non-volatile storage media that does not have a natural threshold voltage such as a phase change memory and the like. In such an embodiment, use of states separated such as ERASE and C allow for more variation in the distribution of cells that are in each of the states.

Figure 9C:
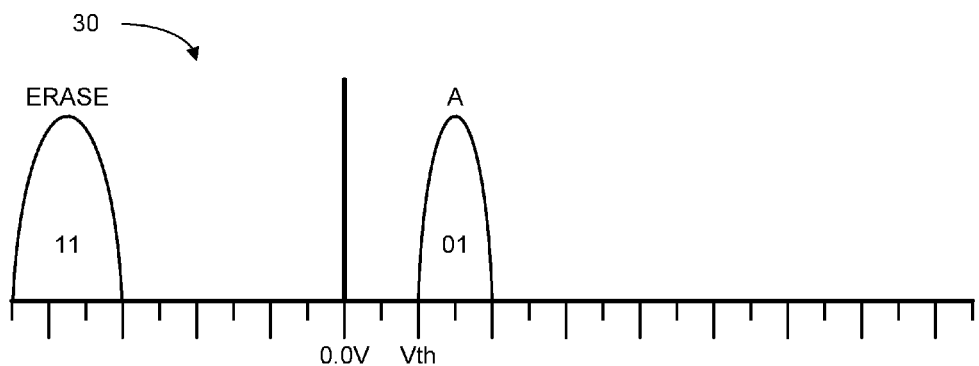
FIG. 9C illustrates a graphical diagram of programming states of one embodiment of a programming model.

FIG. 9C illustrates a graphical diagram 30 of programming states of one embodiment of a programming or encoding model which uses the MSB to store user/workload data for a SLC reduced level cell mode, in contrast to FIG. 6 described above, which used the LSB to store user/workload data in a SLC reduced level cell mode. In this programming model, the value of the LSB remains 1. The non-volatile memory cell may be programmed to the erase state to represent a bit value of 1 (a logical "0"), or to the state A to represent a bit value of 0 (a logical "1"). For reference, the state A represents the state that is closest to the threshold voltage Vth of the non-volatile memory cell. Also, since the programming model illustrated in FIG. 9C only uses a subset (i.e., ERASE and A states) of the designated programming states for representing bit values, these programming states are referred to herein as "restricted programming states."

In some embodiments, by utilizing the state that is closest to the threshold voltage Vth of the non-volatile memory cell for the SLC mode, the accuracy of the MLC device is maintained longer compared with using the MLC device in a MLC mode or using the MLC device in the SLC mode based on programming only pages that use the LSB. In this way, the longevity of the MLC device can be extended, because there is less programming voltage used to program the non-volatile memory cells to the lower voltage programming state.

Additionally, in some embodiments it is relatively unlikely that the non-volatile memory cell might get overprogrammed relative to state A. In fact, even if the non-volatile memory cell is overprogrammed relative to state A, the value of the MSB does not necessarily change between the states A and B, using the convention shown in FIG. 9C.

Also, in certain embodiments, this approach using the MSB state for the SLC mode may take about the same amount of time to program the non-volatile memory cell than using only the LSB state. Reading from non-volatile memory cell that have only the MSB state programmed may take a little longer since the non-volatile memory cell may perform two or more reads to verify that the cell voltage is within the erase state or the A state. Additionally, this approach results in the creation of less electron trapping sites within the gate of the non-volatile memory cells due to the lower programming voltage applied, which contributes to the longevity of the non-volatile memory cells. In some embodiments, using the MSB only in NAND MLC reduces the amount of trapping charges due to program/erase (P/E) cycling by lowering the voltage swing. If there are less trapped charges and/or trap sites, then there is low trap-assisted tunneling and path through a string of traps. Consequently, this also makes it less likely that the non-volatile memory cell might be overprogrammed relative to state A. Moreover, there is very little voltage (Vt) drift of state A because the Vt level of state A is relatively close to the natural Vt level of the non-volatile memory cell. This possibility of overprogramming typically increases with the age of the MLC device.

Typically in a MLC flash memory element, the number of electrons stored within a floating gate indicates a voltage differential that can be measured. The number of discrete levels that can be accurately determined is dependent upon the total number of electrons that can be stored and the maximum variation in number of electrons that can be controlled. Similarly, in a MLC phase-change memory element, the crystalline or amorphous nature of the memory element can be determined, and the number of discrete levels that can be accurately determined depends on the number of intermediate states that can be implemented between the crystalline and amorphous states. While any number of levels may be implemented, regardless of the specific technology used to implement the non-volatile memory cells, many non-volatile memory cells have four levels representing two bits of information. The encoding of these levels to the bit values they represent may use a Gray code or other encoding mechanisms.

The two bits of a MLC, while sharing the same physical memory cell, may not be contiguous in a logical address space. In many cases, the bits are in different pages. However, the lower order addresses for the bits are frequently the same. Also, the bits of a single memory element are typically (but not always) within the same erase blocks. An erase block is a block of storage that is erased in bulk during an erase operation. The possible variations that might be implemented in different embodiments in terms of logical addresses, pages, erase blocks and so forth, may affect the operation of the device, but do not necessarily alter the fundamental concepts described herein for using a MLC device in a SLC mode.

Figure 10A:
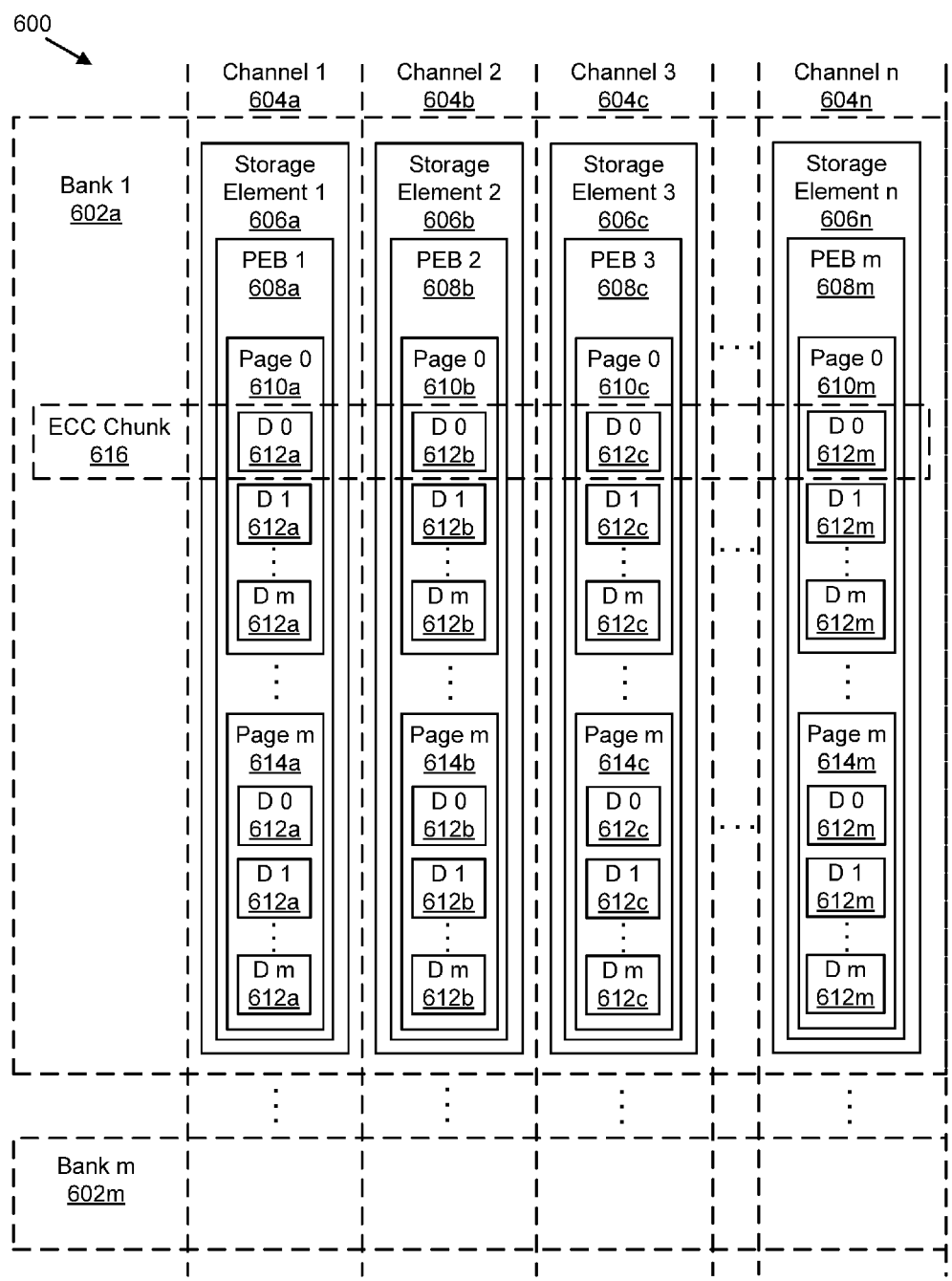
FIG. 10A is a schematic block diagram illustrating one embodiment of an array of storage elements of non-volatile memory media.

FIG. 10A is a schematic block diagram illustrating one embodiment of an array 600 of N number of storage elements 606. In the depicted embodiment, an ECC chunk 616 includes data 612 from several storage elements 606. In a further embodiment, ECC checkbits for the ECC chunk 616 are also stored across several storage elements 606.

The array 600 of storage elements 606, in one embodiment, includes N number of storage elements 606a, 606b, 606c, . . . 606n. Each storage element 606 may comprise a device, a chip, a portion of a chip, a die, a plane in a die, or the like. In the depicted embodiment, the storage elements 606a-n form a bank 602a. The array 600, in one embodiment, includes several banks 602a . . . 602m. The banks 602a-m, in the depicted embodiment, include several channels 604a, 604b, 604c, . . . , 604n. In one embodiment, a packet or data set is written across the several channels 604a-n and data is read separately from each channel 604a-n and reassembled into the packet. In another embodiment, an ECC chunk 616, packet, or data set is written across the several channels 604a-n and data is read in parallel from all the channels 604a-n. One read operation on a bank 602a may read a whole ECC chunk 616, packet, or data set or a portion of an ECC chunk 616, packet, or data set that is reassembled into a whole ECC chunk 616, packet, or data set. In the depicted embodiment, each channel includes at least one storage element 606 in each bank 602.

Furthermore, in one embodiment each storage element 606 includes a physical erase block or "PEB" 608. For example, storage element one 606a includes PEB one 608a. A physical erase block is typically an erase block located on one die, chip, or other storage element 606. Each PEB 608 includes m physical pages 610. For example, PEB one 608a includes page 0 610a . . . page m 614a. Each physical page 610a stores a portion of data ("D 0, D 1, . . . , D m") 612 and ECC checkbits distributed with the data 612. As described above, several pages 610 of the same storage element 606, the same PEB 608, or the like may share the same, common set of memory cells. For example, three pages 610 may be stored or encoded by abodes or program states of the same, common set of TLC memory cells.

In one embodiment, a group of PEBs (PEB 1 608a-PEB m 608m) forms a logical erase block ("LEB"). An LEB may span the array of N storage elements 600. In certain embodiments, an LEB is sized to fit within a bank 602a-m, with one PEB 608a-m from each storage element 606a-n or the like. In other embodiments, a LEB may span different banks 602a-m and may include one or more PEBs 608a-m from multiple banks 602a-m. Furthermore, in an embodiment, a logical page ("LP") spans a plurality of physical pages 610 in a row. In another embodiment a logical page spans N storage elements 606a-n.

In one embodiment, the ECC is a block code that is distributed with the data. Furthermore, the data and the ECC may not align with any particular physical hardware boundary. As a result, error correction with the ECC codes is not dependent on a particular hardware configuration. Therefore, the ECC and corresponding data may form an ECC chunk 616 and the ECC chunk 616 may be divided and stored on one or more of the N storage elements 606a-n. An ECC chunk 616 typically spans at least a portion of a plurality of physical pages 610 of a logical page where the data and ECC generated from the data 612a, 612b, . . . 612m are spread across the N storage elements 606a-n. In one embodiment, a LP includes a plurality of ECC chunks 616. A physical page 610 may contain one or more data bytes of the ECC chunk 616. An ECC chunk 616 may span multiple rows within a physical page 610 and a physical page 610 may include a plurality of ECC chunks 616.

Because, in the depicted embodiment, the ECC checkbits for the ECC chunk 616 are distributed across several storage elements 606a-n and channels 604a-n, when a data error occurs due to a read voltage shift in one or more of the storage elements 606a-n, an ECC module or decoder may not be able to determine which storage elements 606 have an error that is correctable using audit bits of a predefined endurance data pattern. In one embodiment, the endurance module 206 determines which storage elements 606 or channels 604 have data bits that do not match an expected audit bit, to facilitate error correction by an ECC decoder or the like.

In one embodiment, the endurance module 206 and/or an ECC module or decoder determines that a data set has an error or an audit bit that deviates from a known or expected value, and the endurance module 206 determines from which storage element 606 the data set was read. For example, in one embodiment, the array 600 may have 24 channels 604, and 8 bytes may be read in parallel from 24 storage elements 606 of a single bank 602 during a read operation for a total of 192 bytes per read operation. Based on this information, the endurance module 206, in one embodiment, can determine from which storage element 606 a data set was read based on the position of an 8 byte data set within the 192 bytes. In one embodiment, the 192 bytes comprise the ECC chunk 616.

Figure 10B:
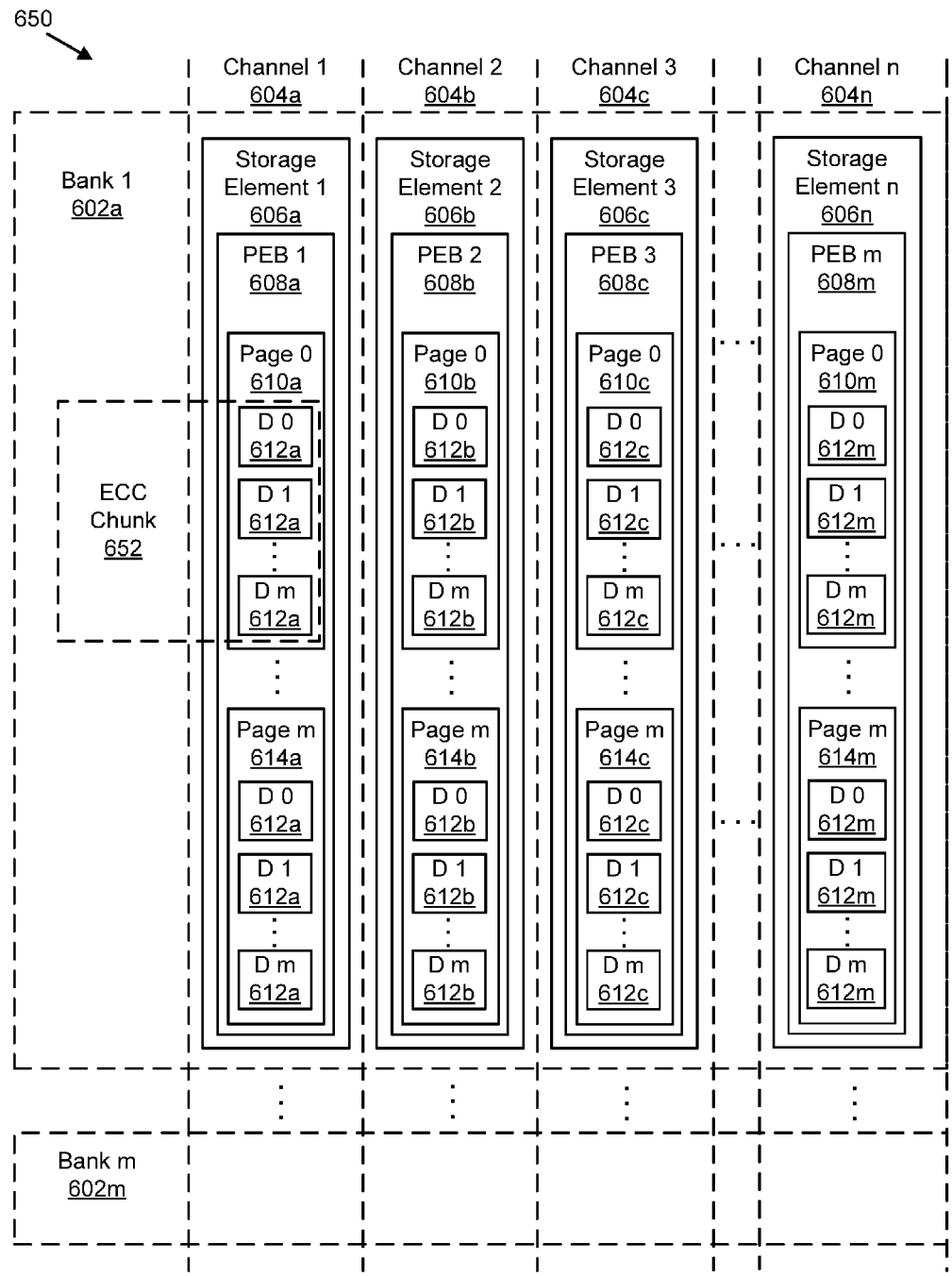
FIG. 10B is a schematic block diagram illustrating another embodiment of an array of storage elements of non-volatile memory media.

FIG. 10B is a schematic block diagram illustrating one embodiment of an array 650 of N storage elements 606. The array 650, in the depicted embodiment, is substantially similar to the array 600 of FIG. 10A, but with the ECC chunk 652 including data 612a in a single storage element 606a, instead of across several storage elements 606a-n. In one embodiment, ECC checkbits for the ECC chunk 652 are stored in the single storage element 606a. Because each storage element 606a-n or channel 604a-n has separate ECC checkbits, in one embodiment, an ECC module or decoder uses the separate ECC checkbits to determine in which storage elements 606a-n or channels 604a-n an error has occurred, and may cooperate with the endurance module 206 to use audit data as an extra layer of error protection should the ECC checkbits fail due to more errors than are correctable using the ECC checkbits alone.

Figures 11A, 11B:
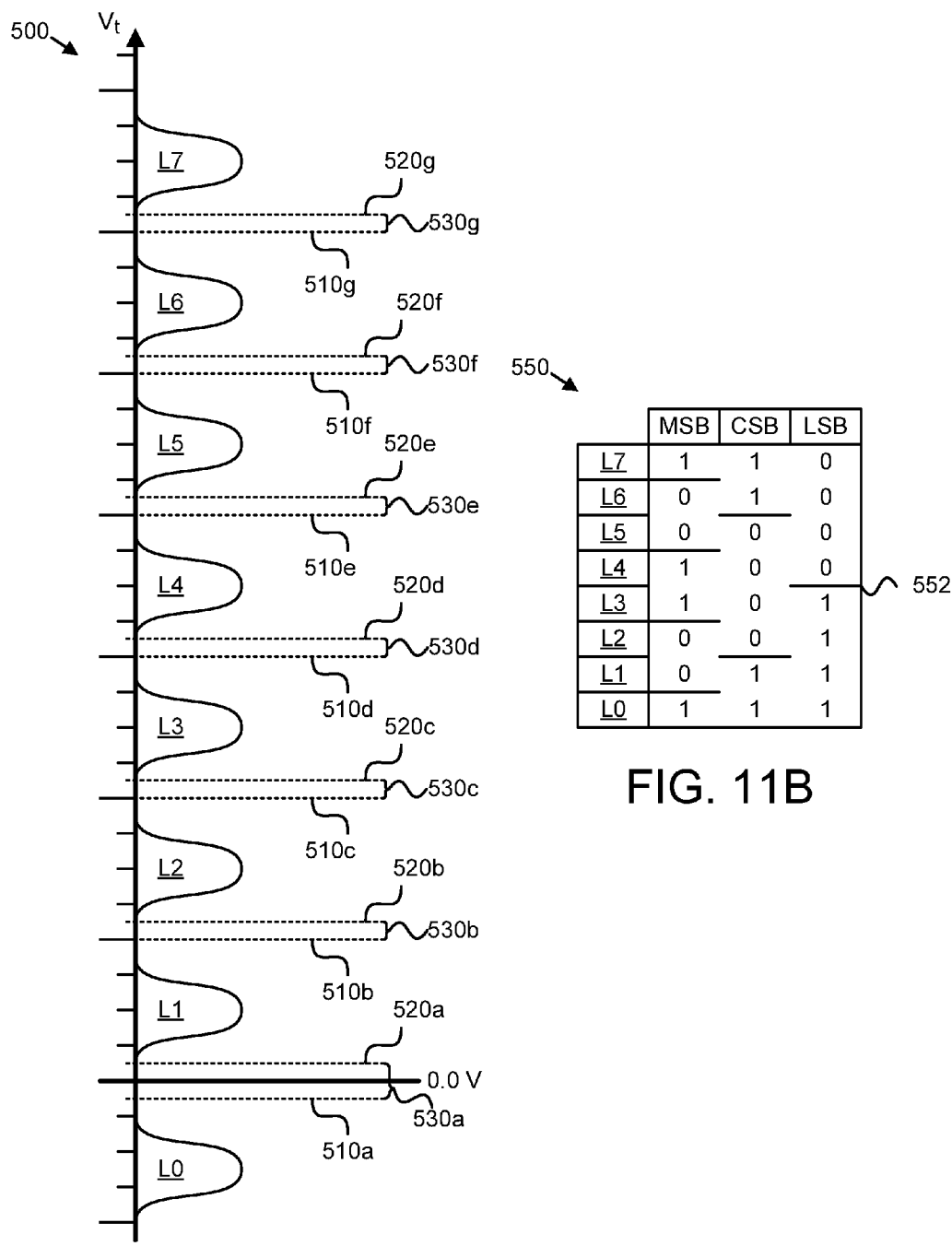
FIG. 11A is a graph illustrating one embodiment of states in cells of a non-volatile memory device.
FIG. 11B is a table illustrating one embodiment of an encoding of multiple bits by a cell of a non-volatile memory device.

FIG. 11A depicts a graph 500 of programming states or abodes for TLC memory cells of a non-volatile memory device 120. In the depicted embodiment, the non-volatile memory device 120 may be, for example, a TLC NAND flash memory device, and each cell has eight states, but various types of memory and numbers of states per cell may be used in other embodiments. In the depicted embodiment the data-encoding physical value of each cell is the read voltage level. The read voltage level, as used herein, refers to a voltage which causes the channel of a floating gate transistor conductive when a read voltage threshold ("Vt") is applied to the control gate. Data is stored in each cell by changing the amount of stored charge in the floating gate, which determines the read voltage level.

In the depicted embodiment, read voltage thresholds 510a-g divide the range of possible read voltage levels for a cell into states L0, L1, L2, L3, L4, L5, L6, and L7, where L0 is the erased state. In some embodiments, the erased state L0 may correspond to a negative read voltage level. If the read voltage level for a cell is below read voltage threshold 510a, the cell is in the L0 state. If the threshold voltage Vt for a cell is above read voltage threshold 510a, but below read voltage threshold 510b, the cell is in the L1 state, and so on. In response to a cell being programmed (or erased), the state of the cell may be determined by applying a verify threshold voltage 520a-g to the control gate, and sensing if the cell conducts, to determine if the read voltage level is above or below the applied verify threshold voltage 520a-g. By using different voltage thresholds for the read voltage thresholds 510a-g and the verify threshold voltages 520a-g, the threshold module 216 forms guard bands 530a-g or separation distances between the cell states.

Although the graph 500 depicts a uniform distribution of cells among the states L0-L7, a bell-shaped distribution of read voltage levels is depicted in each state, because each cell in a particular state may have a different read voltage level within the range of read voltage levels for the state, read voltage levels may drift over time, or the like. Variations in the cells and in the programming process may cause variations in the read voltage levels when the cells are programmed. Also, the read voltage level of a cell may drift from its originally programmed voltage over time due to read disturbs, program disturbs, stress-induced leakage current, or the like. Although a symmetric bell-shaped distribution is shown, skewed distributions and other distributions are possible. Over time, the distributions may widen or skew as cells drift from their originally programmed read voltage levels, and such effects may increase over time with age.

If the distribution widens beyond the nearest read voltage threshold 510a-g, then some cells have drifted into an adjacent state, causing errors. In order to reduce this effect, the states L0-L7 are separated by guard bands 530a-g of a predefined separation distance. As described above, a guard band or separation distance comprises a range of a data-encoding physical property of a cell, such as a read voltage level or the like, which separates states of the cell. In the depicted embodiment, the guard bands are created when the cells are programmed, by verifying that each cell is programmed with a read voltage level above at least a verify voltage 520a-g, which is above or greater than the read voltage threshold Vt 510a-g, which defines the lower edge of the state. Thus, in the depicted embodiment, the first guard band 530a includes the voltage range 530a between read voltage threshold 510a and verify voltage threshold 520a, the second guard band is the voltage range 530b between read voltage threshold 510b and verify voltage threshold 520b, and so on.

In various embodiments, the states may be different distances from adjacent states, and the guard bands 530a-g may have different widths or sizes. For example, in the depicted embodiment, the separation 530a between the L0 and L1 states is greater than the separation 530b-g between other adjacent states, and the guard band 530a between L0 and L1 is correspondingly wider. Also, in the depicted embodiment, the read voltage thresholds 510b-g are at the midpoint between the most likely voltages for adjacent states, but in another embodiment, the read voltage thresholds 510 may be lower, and closer to the edge of the distribution of cells for the lower states, thus widening the guard bands and increasing the separation distances. Other arrangements of states, guard bands 530a-g, read voltage thresholds 510a-g, and verify voltage thresholds 520a-g are possible, and may be managed and adjusted by the threshold module 216 to increase separation distances for a reduced level cell mode.

FIG. 11B depicts a table 550 illustrating one example encoding for the states L0-L7 of FIG. 11A. Because each cell in the depicted embodiment may be in one of eight different states, each cell encodes three different bits. The first bit is referred to as the most significant bit ("MSB"), the second bit is referred to as the central significant bit ("CSB"), and the third bit is referred to as the least significant bit ("LSB"). In the depicted embodiment, the encoding is a Gray code encoding, in which only one bit changes between adjacent states. In other embodiments, other encodings may be used.

In one embodiment, the level of reliability for a bit of a cell may be based on a number of transitions for the bit between adjacent states in an encoding of the cell. A transition 552 for a bit occurs between adjacent states if the value of the bit changes between those states. In the depicted encoding, it may be seen that the LSB has one transition 552, between the L3 and L4 states. The CSB has two transitions 552, between the L1 and L2 states and between the L5 and L6 states, and the MSB has four transitions 552. Because most errors occur between adjacent states, in certain embodiments, a bit experiences a higher risk of error in states near a transition 552 for that bit. Thus, because the LSB has one transition 552, in the depicted embodiment, the LSB provides a reliability level that is higher than provided by the CSB and the MSB. The CSB, with two transitions 552 in the depicted embodiment, provides a reliability level between the reliability levels provided by the LSB and the MSB. The MSB, with four transitions 552 in the depicted embodiment, provides a lower reliability level than those provided by the LSB and the CSB. For this reason, in certain embodiments, for the depicted encoding 550 or similar encodings, as the memory device 120 ages and memory cells experience more errors or the like, the trigger module 202 may first initiate a MLC reduced level cell mode that uses the CSB and LSB to store user/workload data (e.g., taking the least reliable MSB out of service), and may later initiate a SLC reduced level cell mode that uses just the LSB to store user/workload data (e.g., using just the most reliable LSB).

In another embodiment, the level of reliability for a bit of a cell may be based on and/or correlated to a size of a guard band 530a-g or separation distance between adjacent states, such as states with a transition 552 for the bit in an encoding of the cell. For example, in the depicted embodiment, the reliability level for the LSB may be increased by widening the guard band 530d at the transition 552 between the L3 and L4 states. Widening the guard band at one transition 552 may involve shifting the states and narrowing other guard bands, merging states, masking states, invalidating states, or the like, thus also affecting the reliability levels of other bits, such as the MSB and CSB.

For example, as described above, the endurance module 206, in certain embodiments, may use the pattern module 214 to program a predefined endurance data pattern of binary ones to the MSBs of a set of memory cells which, per the depicted encoding 550, limits the available states or abodes to L0, L3, L4, and L7. The endurance module 206, in one embodiment, may use the threshold module 216, as described above, to provide a greater separation distance between the L3 and L4 abodes, increasing the guard band 530d and decreasing other guard bands 530 or states, such as the unused, unavailable L2 and L5 states, or the like.

FIG. 12 shows one embodiment of boundary thresholds 662a-g for a set of triple level memory cells, such as MLC NAND flash storage cells, TLC NAND flash storage cells, or the like, with an example encoding or programming model. Any limitations inherent in the represented encoding model do not necessarily apply to all other encoding models, and the present disclosure should not be construed as inherently containing any such limitations. The abodes or program states, in the depicted embodiment, are encoded using a Gray code encoding model, with binary values for adjacent states differing by a single bit in the encoding. The depicted encoding of FIG. 12, may be one embodiment of programming stages used to program lower/LSB, middle/CSB, and upper/MSB pages using the encoding 550 and states 500 described above with regard to FIGS. 11A and 11B.

In the depicted embodiment, stage 1 comprises a program operation for the lower/LSB page, with a binary one for the lower/LSB page placing the memory cell into the L0 state or abode and a binary zero for the lower/LSB page placing the memory cell into the L1 state or abode. Stage 2 comprises a program operation for the middle/CSB page where, depending on the value of the lower/LSB bit programmed in stage 1 and the value of the middle/CSB bit being programmed, the memory cell may have one of four possible states or abodes. Stage 3 comprises a program operation for the upper/MSB page including eight possible states or abodes, depending on the values of the lower/LSB page programmed in stage 1, of the middle/CSB page programmed in stage 2, and of the upper/MSB page being programmed in stage 3.

The stages, numbers of states or abodes per stage, and associated encoding may be specific to certain architectures, types, makes, or models of non-volatile memory media 122. In certain embodiments, one or more different architectures of non-volatile memory media 122 may use the same, common, predefined encoding as depicted in FIG. 12 (e.g., Gray code; L0=111, L1=011, L2=001, L3=101, L4=100, L5=000, L6=010, L7=110; or the like). For example, instead of progressing from two abodes (SLC mode), to four abodes (MLC mode), to eight abodes (TLC mode) in sequential stages as depicted, other architectures may use a first stage with two abodes and progress to second and third stages each with eight abodes, simply narrowing or refining a size or width of the abodes in the third stage. Other architectures may include eight abodes in each of the three stages, or the like.

Regardless of the arrangement and number of abodes or program states through the various programming stages, the different architectures may use a common, predefined encoding to map abodes or program states to data values. As described above, based on the common, predefined encoding, in certain embodiments, the endurance module 206 may use a similar predefined endurance pattern, similar abode or program state adjustments, or the like for non-volatile memory media 122 with different architectures. By providing a reduced level cell mode at an encoding level, the non-volatile memory device 120, the non-volatile memory media controller 126, and/or the non-volatile memory media 122 may continue normal operation with little or no modification, with eight abodes or program states or the like, substantially unaware that the endurance module 206 is using a predefined endurance data pattern to mask certain abodes or program states such that they become unavailable or unused for storing/encoding valid user/workload data.

As described above, the endurance module 206 may take advantage of a common, predefined encoding (either the depicted gray code encoding or a different predefined encoding) to provide a vendor/manufacturer agnostic reduced level cell mode, with an increased separation distance between abodes or program states. For example, in an embodiments where the endurance module 206 and/or the pattern module 214 use an XNOR logical equality operation to determine a predefined endurance data pattern, with the depicted encoding, programming the data pattern to the upper/MSB page during stage 3 defines, determines, or selects abodes L0, L2, L4, and L6 as the states available or used to encode/store the user/workload data of the lower/LSB and middle/CSB pages. Based on the depicted encoding, abodes L1, L3, L5, and L7 would be unavailable or unused to encode/store the user/workload data of the lower/LSB and middle/CSB pages. This is true for the depicted encoding, because an XNOR for the lower/LSB and middle/CSB data bits results in the upper/MSB bits encoded by abodes L0, L2, L4, and L6 and does not result in the upper/MSB bits encoded by abodes L1, L3, L5, and L7. For other encodings, a different operation other than XNOR may yield similar results, and the endurance module 206 and/or pattern module 214 may use different operation, a different predefined endurance data pattern, or the like to take advantage of the other encoding to optimally separate abodes or program states for the other encodings.

In another embodiment, for the depicted encoding, the endurance module 206 and/or the pattern module 214 may program a predefined endurance data pattern consisting exclusively of all binary ones to the upper/MSB page, to separate the abodes or program states that are available for use encoding/storing the user/workload data stored in the lower/LSB and middle/CSB pages. For the depicted encoding, programming the upper/MSB page with binary ones defines, determines, or selects abodes L0, L3, L4, and L7 as the abodes or program states available or used to encode/store the user/workload data of the lower/LSB and middle/CSB pages, because the MSB is a binary one for those abodes. For the same reason, programming the upper/MSB page determines, defines, or masks abodes L1, L2, L5, and L6 as unavailable or unused for encoding/storing the user/workload data of the lower/LSB and middle/CSB pages, because the MSB is a binary zero for those abodes. By programming a predefined endurance data pattern to the upper/MSB page of a set of memory cells, the endurance module 206 and/or the pattern module 214, in certain embodiments, may define, determine, and/or select which abodes or program states are used or available for storing/encoding data of the lower/LSB and middle/CSB pages, based on the predefined encoding used for the memory cells, in a manner that does not change or modify the predefined encoding.

In other embodiments, for certain architectures, the endurance module 206 may simply stop programming after stage 2, with its four abodes or programming states, to provide a reduced level cell mode. However, certain architectures may require that all three stages be completed.

In a further embodiment, the endurance module 206 and/or the threshold module 216 may adjust, move, or set one or more boundary thresholds 662 between the abodes or program states to provide a reduced level cell mode as described above. For example, instead of or in addition to using a predefined endurance data pattern, the endurance module 206 and/or the threshold module 216 may adjust or move boundary thresholds 662 to shrink or remove certain abodes, to merge or combine different abodes, or the like, thereby defining, determining, or selecting which abodes or program states are available or used for storing/encoding the user/workload data of the lower/LSB and middle/CSB pages. For example, in the depicted embodiment, the endurance module 206 and/or the threshold module 216 may merge abodes L0 and L1, merge abodes L2 and L3, merge abodes L4 and L5, and merge abodes L6 and L7 to provide a reduced level cell mode in stage 3 that is substantially similar to stage 2, but with each of the three stages being performed (e.g., a virtual reduced level cell mode). In a further example embodiment, the endurance module 206 and/or the threshold module 216 may widen a guard band 530*d* between abodes L3 and L4, widen abodes L3 and L4 by moving the boundary thresholds 662*c*, 662*e*, or the like to increase a separation distance between abodes L3 and L4 in embodiments where the endurance module 206 and/or the pattern module 214 use a predefined endurance data pattern of binary ones, leaving abodes L3 and L4 both available and adjacent. In certain embodiments, the endurance module 206 may adjust boundary thresholds 662, such as program verify thresholds, read voltage thresholds, and the like and/or may program a predefined endurance data pattern to the upper/MSB page, to provide a reduced level cell mode that is specific to and takes advantage of an encoding for the underlying set of memory cells.

Figure 13:
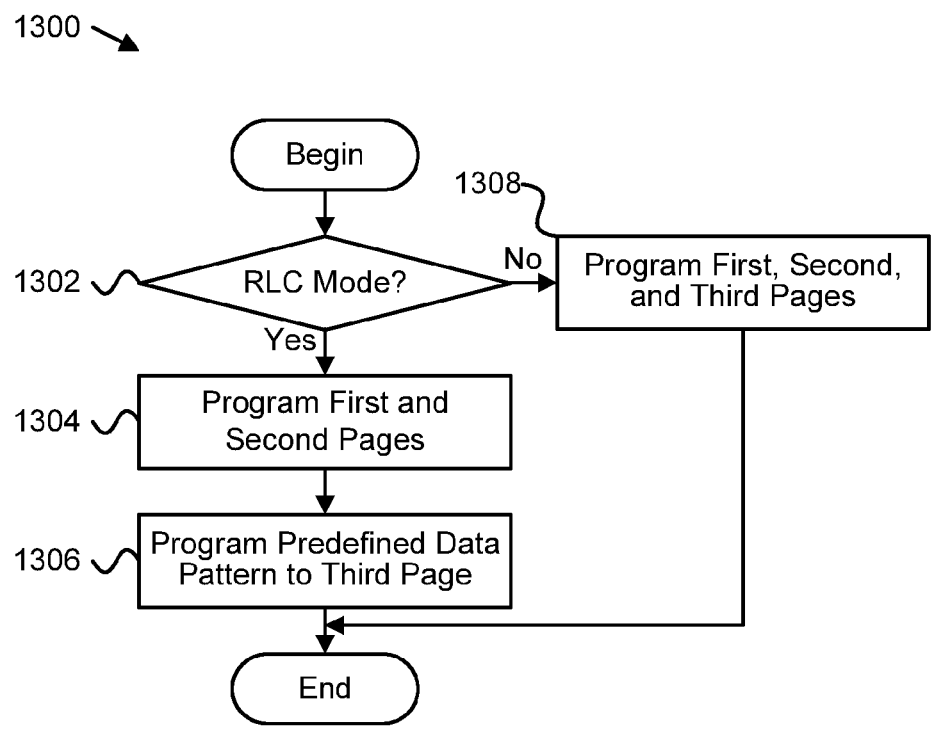
FIG. 13 is a schematic flow chart diagram illustrating one embodiment of a method for a reduced level cell mode.
Figure 14:
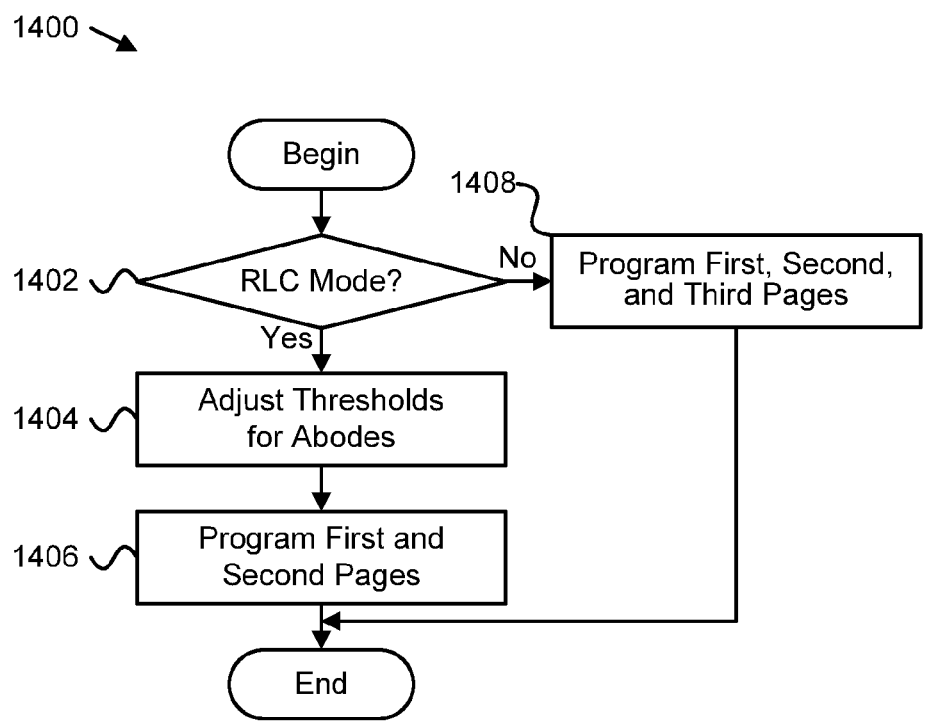
FIG. 14 is a schematic flow chart diagram illustrating another embodiment of a method for a reduced level cell mode.

FIG. 13 depicts one embodiment of a method 1300 for a reduced level cell mode. The method 1300 begins and the trigger module 202 determines 1302 whether to initiate a reduced level cell (RLC) mode for a region or set of non-volatile memory cells, based on whether an endurance characteristic such as an error rate satisfies an endurance threshold such as an error threshold. If the trigger module 202 determines 1302 that the non-volatile memory cells are not to operate in the reduced level cell mode, the program module 204 programs 1308 each of the three pages (e.g., first/lower page, second/middle page, third/upper page) with user/workload data and the method 1300 ends.

If the trigger module 202 determines 1302 that the non-volatile memory cells are to operate in the reduced level cell mode, the program module 204 programs 1304 a first/lower page and a second/middle page of the cells with user/workload data and programs 1306, in cooperation with the endurance module 206 and/or the pattern module 214, a third/upper page with a predefined endurance data pattern, the programming 1304 thereof selected to define a subset of the abodes or program states of the set of memory cells for encoding the programmed 1304 user/workload data, and the method 1300 ends.

Figure 15:
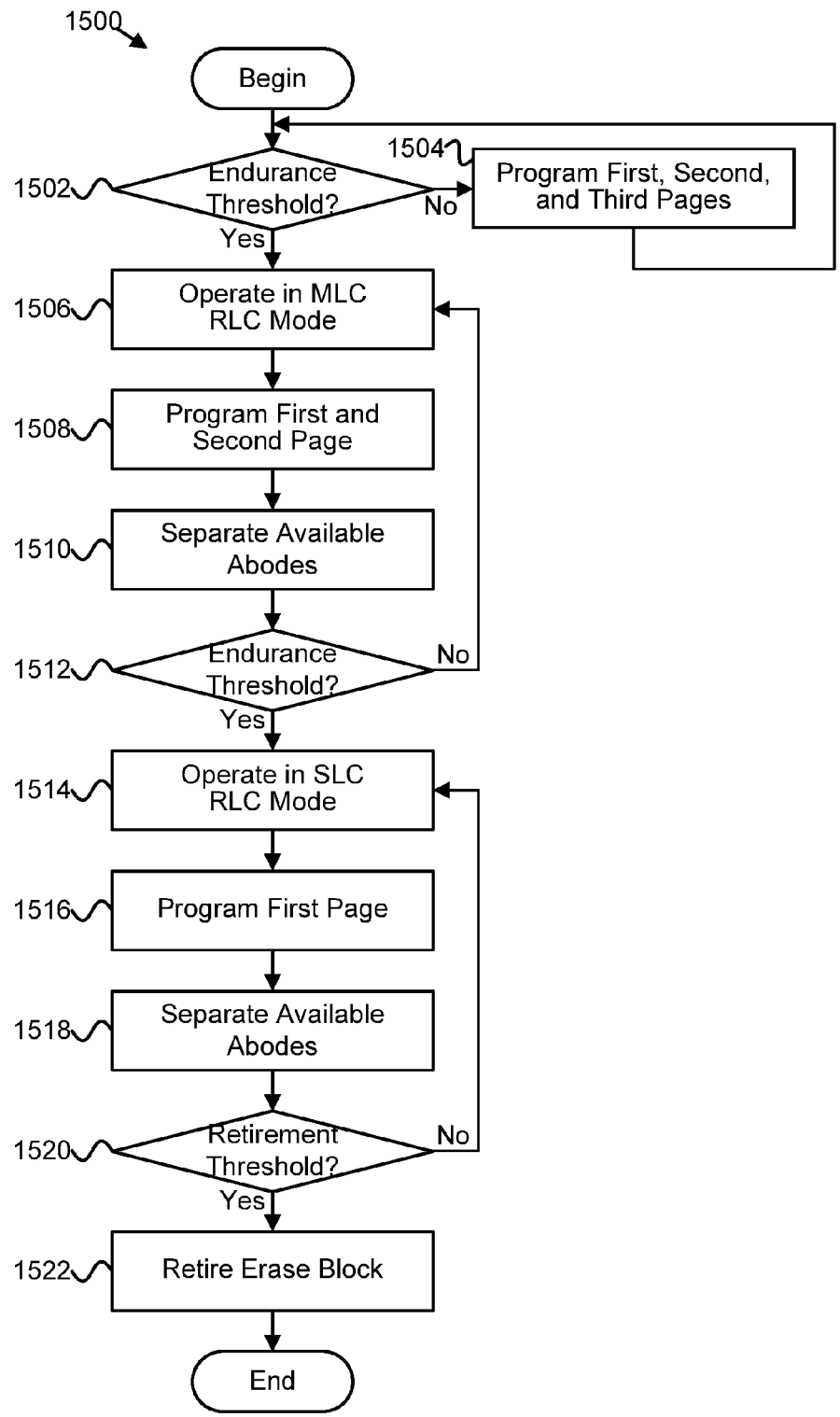
FIG. 15 is a schematic flow chart diagram illustrating a further embodiment of a method for a reduced level cell mode.

FIG. 15 is a schematic flow chart diagram illustrating a further embodiment of a method 1500 for a reduced level cell mode. The method 1500 begins, in response to an erase block being erased as part of a storage capacity recovery operation, or the like, and the trigger module 202 determines 1502, for the erase block, whether an endurance characteristic such as an error rate satisfies an endurance threshold such as an error threshold. If the trigger module 202 determines 1502 that the endurance threshold is not satisfied, the program module 204 programs 1408 each of three pages (e.g., first/lower page, second/middle page, third/upper page associated with the same set of storage cells) of the erase block with user/workload data and the trigger module 202 continues to monitor 1502 the endurance characteristic for the erase block.

If the trigger module 202 determines 1502 that the endurance threshold has been satisfied, the trigger module 202 designates the erase block to operate 1506 in a MLC reduced level cell mode, with two bits per memory cell. The program module 204 programs 1508 a first/lower page and a second/middle page of the erase block with user/workload data. The endurance module 206, using the pattern module 214 and/or the threshold module 216 separates 1510 available abodes of the storage cells of the erase block that are available for use encoding the programmed 1508 data, which may include four abodes in the MLC reduced level cell mode. For example, the pattern module 214 may cause a predefined endurance data pattern to be written to a third/upper page to separate 1510 the available abodes, the threshold module 216 may adjust one or more boundaries or thresholds of the available abodes to separate 1510 the available abodes, or the like.

The trigger module 202 determines 1512, for the erase block, whether an endurance characteristic satisfies an endurance threshold while the erase block is operating 1506 in the MLC reduced level cell mode, in response to the erase block being erased or the like. If the trigger module 202 determines 1512 that the endurance threshold is not satisfied, the erase block continues to operate 1506 in the MLC reduced level cell mode. If the trigger module 202 determines 1512, during operation in the MLC reduced level cell mode, that the endurance threshold has been satisfied, the trigger module 202 designates the erase block to operate 1514 in a SLC reduced level cell mode, with one bit per memory cell.

The program module 204 programs 1516 a first/lower page of the erase block with user/workload data. The endurance module 206, using the pattern module 214 and/or the threshold module 216, separates 1518 available abodes of the storage cells of the erase block that are available for use encoding the programmed 1516 data, which may include two abodes in the SLC reduced level cell mode. For example, the pattern module 214 may cause a predefined endurance data pattern to be written to a third/upper page to separate 1518 the available abodes, the threshold module 216 may adjust one or more boundaries or thresholds of the available abodes to separate 1518 the available abodes, or the like.

The trigger module 202, in response to the erase block being erased or the like, determines 1520 whether an endurance characteristic for the erase block satisfies a retirement endurance threshold, during operation in the SLC reduced level cell mode. If the trigger module 202 determines 1520 that the retirement endurance threshold has not been met, the erase block continues to operate 1514 in the SLC reduced level cell mode, with one bit per cell. If the trigger module 202 determines 1520 that the retirement endurance threshold has been met, the retirement module 210 retires 1522 the erase block from storing data and the method 1500 ends.

A means for initiating a reduced level cell (RLC) mode for a region of triple level cell (TLC) non-volatile storage cells, in various embodiments, may include a reduced level cell module 150, a trigger module 202, a non-volatile memory controller 124, an SML 130, a non-volatile memory media controller 126, a device driver, other logic hardware, and/or other executable code stored on a computer readable storage medium. Other embodiments may include similar or equivalent means for initiating a reduced level cell (RLC) mode for a region of triple level cell (TLC) non-volatile storage cells.

A means for programming a most significant bit (MSB) page of a region of storage cells with a predefined data pattern configured to determine which TLC abodes of the region of storage cells are available for valid data in the RLC mode, in various embodiments, may include a reduced level cell module 150, a program module 204, an endurance module 206, a pattern module 214, a non-volatile memory controller 124, an SML 130, a non-volatile memory media controller 126, a device driver, other logic hardware, and/or other executable code stored on a computer readable storage medium. Other embodiments may include similar or equivalent means for programming a most significant bit (MSB) page of a region of storage cells with a predefined data pattern configured to determine which TLC abodes of the region of storage cells are available for valid data in the RLC mode.

A means for providing at least a predefined separation distance between the TLC abodes available for valid data in the RLC mode, in various embodiments, may include a reduced level cell module 150, a program module 204, an endurance module 206, a pattern module 214, a threshold module 216, a non-volatile memory controller 124, an SML 130, a non-volatile memory media controller 126, a device driver, other logic hardware, and/or other executable code stored on a computer readable storage medium. Other embodiments may include similar or equivalent means for providing at least a predefined separation distance between the TLC abodes available for valid data in the RLC mode.

A means for determining a predefined data pattern based on valid data for TLC abodes to place at least one unavailable abode between TLC abodes available for valid data, in various embodiments, may include a reduced level cell module 150, an endurance module 206, a pattern module 214, a non-volatile memory controller 124, an SML 130, a non-volatile memory media controller 126, a device driver, other logic hardware, and/or other executable code stored on a computer readable storage medium. Other embodiments may include similar or equivalent means for determining a predefined data pattern based on valid data for TLC abodes to place at least one unavailable abode between TLC abodes available for valid data.

A means for adjusting one or more boundaries of TLC abodes to provide at least a predefined separation distance, in various embodiments, may include a reduced level cell module 150, a program module 204, an endurance module 206, a threshold module 216, a non-volatile memory controller 124, an SML 130, a non-volatile memory media controller 126, a device driver, other logic hardware, and/or other executable code stored on a computer readable storage medium. Other embodiments may include similar or equivalent means for adjusting one or more boundaries of TLC abodes to provide at least a predefined separation distance.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. A method comprising:
   determining that a set of storage cells of a non-volatile storage device is to operate in a reduced level cell (RLC) mode, wherein storage cells of the set of storage cells are configured to store at least two bits of data per storage cell;
   instructing the non-volatile storage device to program a first page of the set of storage cells with data; and
   instructing the non-volatile storage device to program a second page of the set of storage cells with a predefined data pattern, the programming of the predefined data pattern configured to adjust which abodes of the set of storage cells are available to represent stored user data values.

2. The method of claim 1, further comprising performing an operation on the data of the first page, wherein results of the operation comprise the predefined data pattern for the second page.

3. The method of claim 2, wherein the operation comprises an XNOR logical equality operation.

4. The method of claim 2, further comprising buffering the data of the first page prior to programming the first page of the set of storage cells, the operation performed on the buffered data.

5. The method of claim 4, wherein the data of the first page is buffered in one or more different sets of storage cells of the non-volatile storage device such that the data of the first page may be programmed to the one or more different sets of storage cells after a restart event for the non-volatile storage device.

6. The method of claim 1, further comprising adjusting, for the RLC mode, one or more thresholds for the abodes of the set of storage cells to provide one or more separation distances between the available abodes.

7. The method of claim 6, wherein the one or more thresholds are set to merge at least one of the available abodes with at least one abode unavailable to represent stored user data to provide the one or more separation distances.

8. The method of claim 6, wherein the one or more thresholds are set to move adjacent available abodes away from each other to provide the one or more separation distances.

9. The method of claim 1, further comprising maintaining a page of data in a different set of storage cells of the non-volatile storage device, the page of data comprising the predefined data pattern for programming the second page.

10. The method of claim 1, wherein the predefined data pattern comprises error correction information for the data of the first page.

11. The method of claim 1, wherein up to half of the abodes of the set of storage cells are available to represent stored user data in the RLC mode.

12. An apparatus comprising:
    a trigger module that determines whether an error rate for a set of non-volatile memory cells satisfies an error threshold;
    a program module that writes workload data to one or more lower pages of the set of non-volatile memory cells with each memory cell representing at least two bits of data by way of one of a set of program states; and
    an endurance module that writes an endurance data pattern to an upper page of the set of non-volatile memory cells instead of workload data to the upper page in response to the error rate satisfying the error threshold, thereby defining a subset of the program states of the set of non-volatile memory cells for encoding workload data;
    wherein at least a portion of the trigger module, the program module, and the endurance module comprises one or more of hardware and executable code, the executable code being stored on one or more computer readable storage media.

13. The apparatus of claim 12, further comprising a threshold module that adjusts one or more thresholds for the program states of the set of non-volatile memory cells in response to the error rate satisfying the error threshold to provide one or more separation distances between the subset of the program states selected for encoding workload data.

14. The apparatus of claim 12, further comprising a pattern module that determines the endurance pattern based on the workload data for the one or more lower pages.

15. The apparatus of claim 12, further comprising a retirement module that retires the set of non-volatile memory cells from storing workload data in response to the error rate satisfying a retirement error threshold.

16. The apparatus of claim 12, wherein the program module writes workload data to the upper page of the set of non-volatile memory cells in response to the error rate failing to satisfy the error threshold.

17. The apparatus of claim 12, wherein the endurance data pattern is selected for use in defining subsets of program states for different architectures of non-volatile memory cells, the different architectures comprising different arrangements of program states for a predefined data encoding for the program states of the non-volatile memory cells.

18. An apparatus comprising:
    means for monitoring an error rate for a region of non-volatile recording cells, each recording cell of the non-volatile recording cells encoding at least two bits of data using a set of abodes;
    means for directing user data to be programmed to recording cells of the region of non-volatile recording cells for at least one bit of the at least two bits of data; and
    means for adjusting one or more thresholds for the abodes of the recording cells in response to the error rate satisfying an error threshold to provide one or more separation distances between a subset of the abodes available for encoding the at least one bit of the at least two bits of data;

wherein at least a portion of the means for monitoring the error rate, the means for directing the user data, and the means for adjusting the one or more thresholds comprises one or more of hardware and executable code, the executable code being stored on one or more computer readable storage media.

19. The apparatus of claim 18, further comprising means for directing a data pattern to be programmed to the second bit of the at least two bits of data, the programming of the data pattern determining which subset of the abodes is available for encoding the at least one bit of the at least two bits of data.

20. The apparatus of claim 18, wherein the second bit of the at least two bits of data is unprogrammed in response to the error rate satisfying the error threshold.

* * * * *